(12) United States Patent
Seo et al.

(10) Patent No.: US 12,484,214 B2
(45) Date of Patent: Nov. 25, 2025

(54) SEMICONDUCTOR DEVICE

(71) Applicant: SAMSUNG ELECTRONICS CO., LTD., Suwon-si (KR)

(72) Inventors: Yejeong Seo, Goyang-si (KR); Hyuk Kim, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 489 days.

(21) Appl. No.: 18/160,692

(22) Filed: Jan. 27, 2023

(65) Prior Publication Data

US 2023/0262960 A1  Aug. 17, 2023

(30) Foreign Application Priority Data

Feb. 11, 2022  (KR) .................. 10-2022-0018287

(51) Int. Cl.
*H10B 12/00* (2023.01)
*H01L 23/48* (2006.01)

(52) U.S. Cl.
CPC ......... *H10B 12/315* (2023.02); *H01L 23/481* (2013.01); *H10B 12/482* (2023.02)

(58) Field of Classification Search
CPC . H01L 23/481; H01L 23/5386; H10B 12/315; H10B 12/481; H10B 12/482; H10B 12/488; H10B 80/00; H10D 88/00–101
See application file for complete search history.

(56) References Cited

U.S. PATENT DOCUMENTS

| | | | |
|---|---|---|---|
| 6,117,786 A | 9/2000 | Khajehnouri et al. | |
| 7,682,986 B2 | 3/2010 | Chi et al. | |
| 8,614,151 B2 | 12/2013 | Benson et al. | |
| 8,673,787 B2 | 3/2014 | Sandhu et al. | |
| 9,165,785 B2 | 10/2015 | Avasarala | |
| 2007/0197033 A1 | 8/2007 | Wilson | |
| 2013/0320486 A1* | 12/2013 | Yoo | H10B 41/27 257/508 |
| 2019/0115362 A1* | 4/2019 | Choi | H10B 43/27 |
| 2019/0326129 A1 | 10/2019 | Anderson et al. | |
| 2021/0384427 A1* | 12/2021 | Park | H10B 63/84 |

FOREIGN PATENT DOCUMENTS

CN  215220720 U  * 12/2021  ......... H01L 21/7682

* cited by examiner

*Primary Examiner* — Steven M Page
(74) *Attorney, Agent, or Firm* — Morgan, Lewis & Bockius LLP

(57) ABSTRACT

A semiconductor device includes a substrate, a data storage structure on the substrate, an insulating structure spaced apart from the data storage structure on the substrate, conductive lines spaced apart from each other and stacked in a vertical direction between the data storage structure and the insulating structure, active layers spaced apart from each other and stacked in the vertical direction between the data storage structure and the insulating structure, and intersecting the conductive lines, and a conductive pattern between the insulating structure and the active layers, and electrically connected to the active layers. The insulating structure includes first insulating patterns spaced apart from each other in a first horizontal direction, and a second insulating pattern between the first insulating patterns. The conductive pattern is between the second insulating pattern and the active layers. The second insulating pattern includes a material different from that of the first insulating patterns.

20 Claims, 65 Drawing Sheets

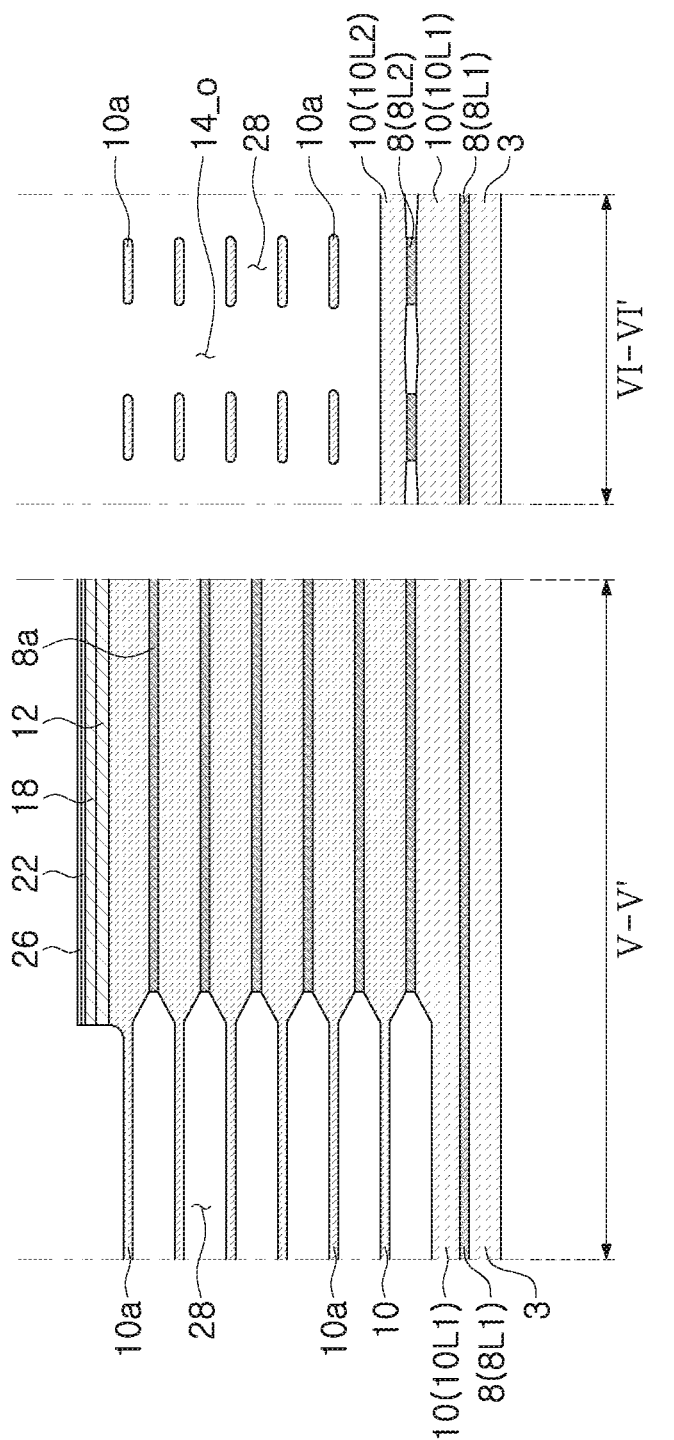

SEMICONDUCTOR DEVICE

CROSS-REFERENCE TO RELATED APPLICATION(S)

This application claims priority under 35 U.S.C. § 119 to Korean Patent Application No. 10-2022-0018287, filed on Feb. 11, 2022, in the Korean Intellectual Property Office, the disclosure of which is incorporated by reference herein in its entirety.

TECHNICAL FIELD

Example embodiments of the present inventive concept relate to a semiconductor device and a method of manufacturing the same.

DISCUSSION OF RELATED ART

Research has been conducted to reduce sizes of elements included in a semiconductor device and to enhance the performance of the elements. For example, with respect to a dynamic random access memory (DRAM) device, research has been conducted to reliably and stably form elements with reduced sizes. However, in a three-dimensional (3D) DRAM device, when an insulating pattern with high aspect ratio is formed adjacent to a bit line, an opening used to accommodate the insulating pattern and to etch a conductive layer to form the bit line may have a bowing shape due to high aspect ratio of the opening, resulting in a significant difference in sizes between upper and lower portions of the bit line and causing a reliability concern for the 3D DRAM device. Therefore, it is desirable to have a process with which the bit lines may be formed to have a more uniform size over upper and lower portions thereof.

SUMMARY

Example embodiments of the present inventive concept provide a semiconductor device capable of enhancing electrical characteristics.

According to an example embodiment of the present inventive concept, a semiconductor device is provided. The semiconductor device includes a substrate including a first area and a second area adjacent to the first area, a first conductive line group disposed on the first area of the substrate and including first conductive lines spaced apart from each other and stacked in a vertical direction, perpendicular to an upper surface of the substrate, a second conductive line group disposed on the first area of the substrate and including second conductive lines spaced apart from each other and stacked in the vertical direction, first active groups disposed on the first area of the substrate, and arranged and spaced apart from each other in a first horizontal direction parallel to the upper surface of the substrate, second active groups disposed on the first area of the substrate, arranged and spaced apart from each other in the first horizontal direction, and spaced apart from the first active groups in a second horizontal direction, perpendicular to the first horizontal direction, an insulating structure disposed between the first conductive line group and the second conductive line group, and first conductive patterns disposed between the insulating structure and the first active groups, and second conductive patterns disposed between the insulating structure and the second active groups. Each of the first active groups may include first active layers spaced apart from each other and stacked in the vertical direction, and intersecting each of the first conductive lines. Each of the second active groups may include second active layers spaced apart from each other and stacked in the vertical direction, and intersecting each of the second conductive lines. The insulating structure may include first insulating patterns and second insulating patterns that are alternately and repeatedly arranged on the first area of the substrate in the first horizontal direction. A first material of the first insulating patterns is different from a second material of the second insulating patterns.

According to an example embodiment of the present inventive concept, a semiconductor device is provided. The semiconductor device includes a substrate, a data storage structure disposed on the substrate, an insulating structure disposed on the substrate, and spaced apart from the data storage structure, conductive lines disposed between the data storage structure and the insulating structure, and spaced apart from each other and stacked in a vertical direction, perpendicular to an upper surface of the substrate, active layers spaced apart from each other and stacked in the vertical direction between the data storage structure and the insulating structure, and intersecting the conductive lines, and a conductive pattern disposed between the insulating structure and the active layers, and electrically connected to the active layers. The insulating structure may include first insulating patterns spaced apart from each other in a first horizontal direction parallel to the upper surface of the substrate, and a second insulating pattern disposed between the first insulating patterns. The conductive pattern may be disposed between the second insulating pattern and the active layers. A material of the second insulating pattern is different from a material of the first insulating patterns.

According to an example embodiment of the present inventive concept, a semiconductor device is provided. The semiconductor device includes a substrate, first insulating patterns disposed on the substrate, and spaced apart from each other in a first horizontal direction parallel to an upper surface of the substrate, conductive patterns spaced apart from each other in a second horizontal direction, perpendicular to the first horizontal direction on the substrate, and a second insulating pattern disposed between the first insulating patterns in the first horizontal direction, and disposed between the conductive patterns in the second horizontal direction. A material of the second insulating pattern is different from a material of the first insulating patterns.

According to an example embodiment of the present inventive concept, a semiconductor device is provided. The semiconductor device includes a substrate, a first memory block disposed on the substrate, and including first data storage structures, a second memory block disposed on the substrate, and including second data storage structures, and an insulating structure disposed between the first memory block and the second memory block. The insulating structure includes first insulating patterns spaced apart from each other in a first horizontal direction parallel to an upper surface of the substrate, and a second insulating pattern disposed between the first insulating patterns. A material of the second insulating pattern is different from a material of the first insulating patterns.

BRIEF DESCRIPTION OF DRAWINGS

The above and other aspects, and features of the present inventive concept will be more clearly understood from the following detailed description, taken in conjunction with the accompanying drawings, in which:

FIGS. 11, 12A to 12D, 13, 14A to 14D, 15, 16A to 16D, 17A to 17D, 18, 19A to 19D, 20, 21A to 21D, 22, 23A to 23D, 24, 25A to 25D, 26 to 31, 32A, 32B, 33A, 33B, 34A, 34B, and 35 are diagrams schematically illustrating an example of a method of forming a semiconductor device according to an example embodiment of the present inventive concept.

Figure 1A:
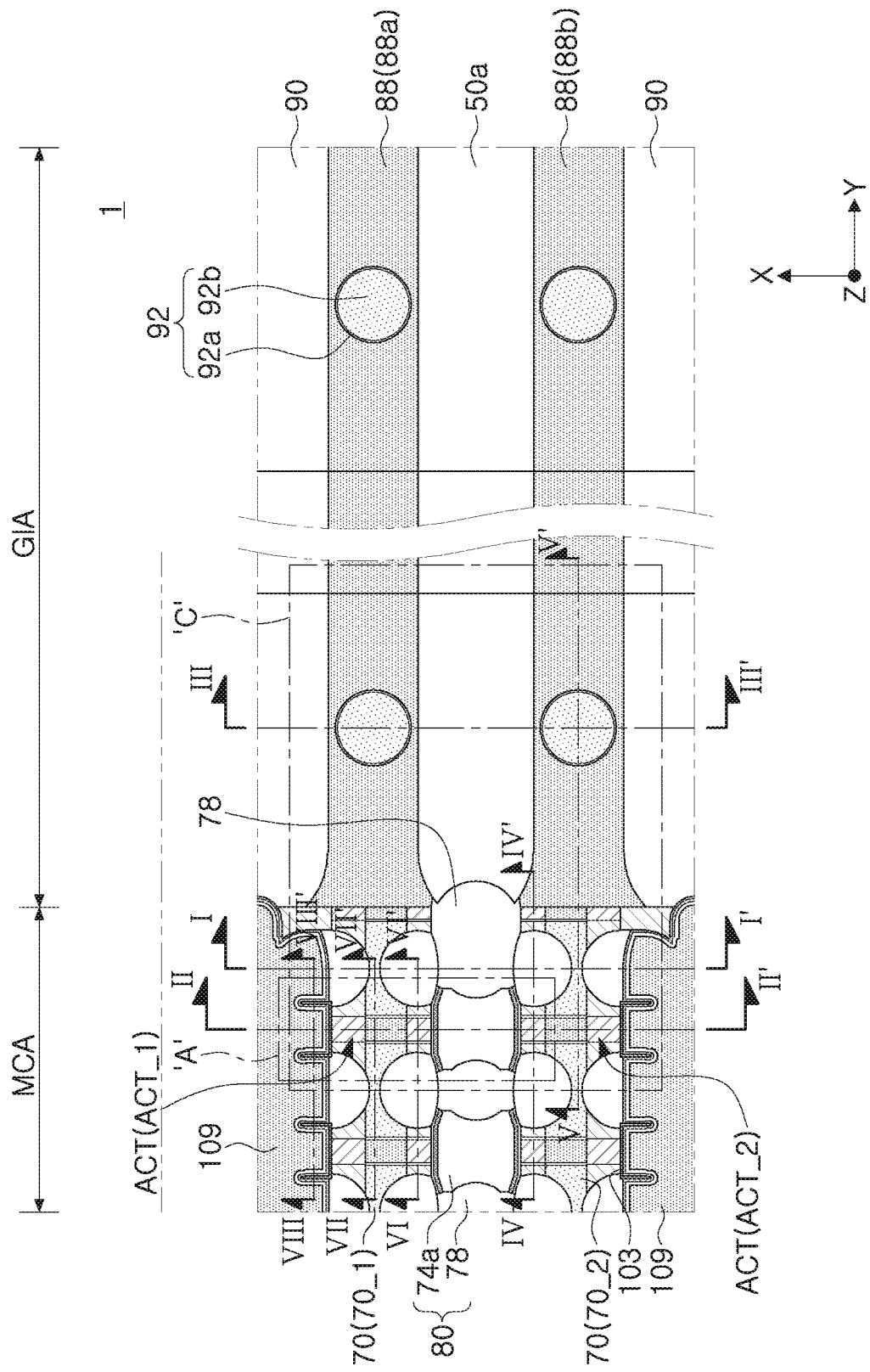
FIGS. 1A, 1B, 2A, 2B, and 3 to 5 are diagrams schematically illustrating an example of a semiconductor device according to an example embodiment of the present inventive concept.

Since the drawings in FIGS. 1-36 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

Hereinafter, example embodiments of the present inventive concept will be described with reference to the accompanying drawings.

Hereinafter, terms such as "upper", "intermediate", and "lower" are replaced with other terms, for example, "first", "second", and "third" to describe elements of the specification. Terms such as "first", "second", and "third" may be used to describe various elements, but the elements are not limited by the terms, and a "first element" may be referred to as a "second element".

At least some of the different "elements" using the same term may be distinguished from each other by reference numerals rather than by terms such as "first" and "second" in the detailed description. Like a first element, a second element, and the like described in the claims, terms such as "first", "second", and the like may be used to distinguish one element from another element. For example, in the detailed description, "insulating layer 00" may refer to an insulating layer denoted by reference numeral 00, and "insulating layer 01" may refer to an insulating layer denoted by reference numeral 01. In addition, as described in the detailed description, "insulating layer 00 and insulating layer 01" may be referred to as "first insulating layer and second insulating layer" in the claims.

Figure 1B:
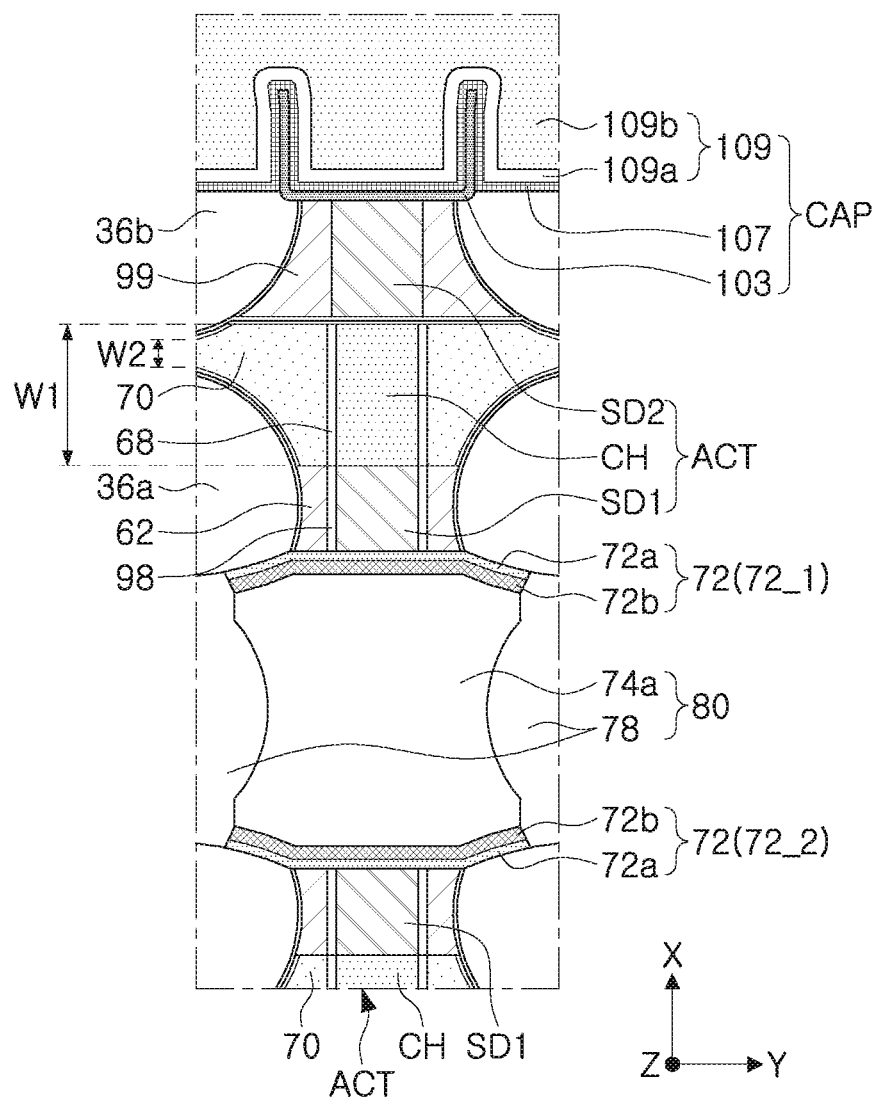
Figure 2A:
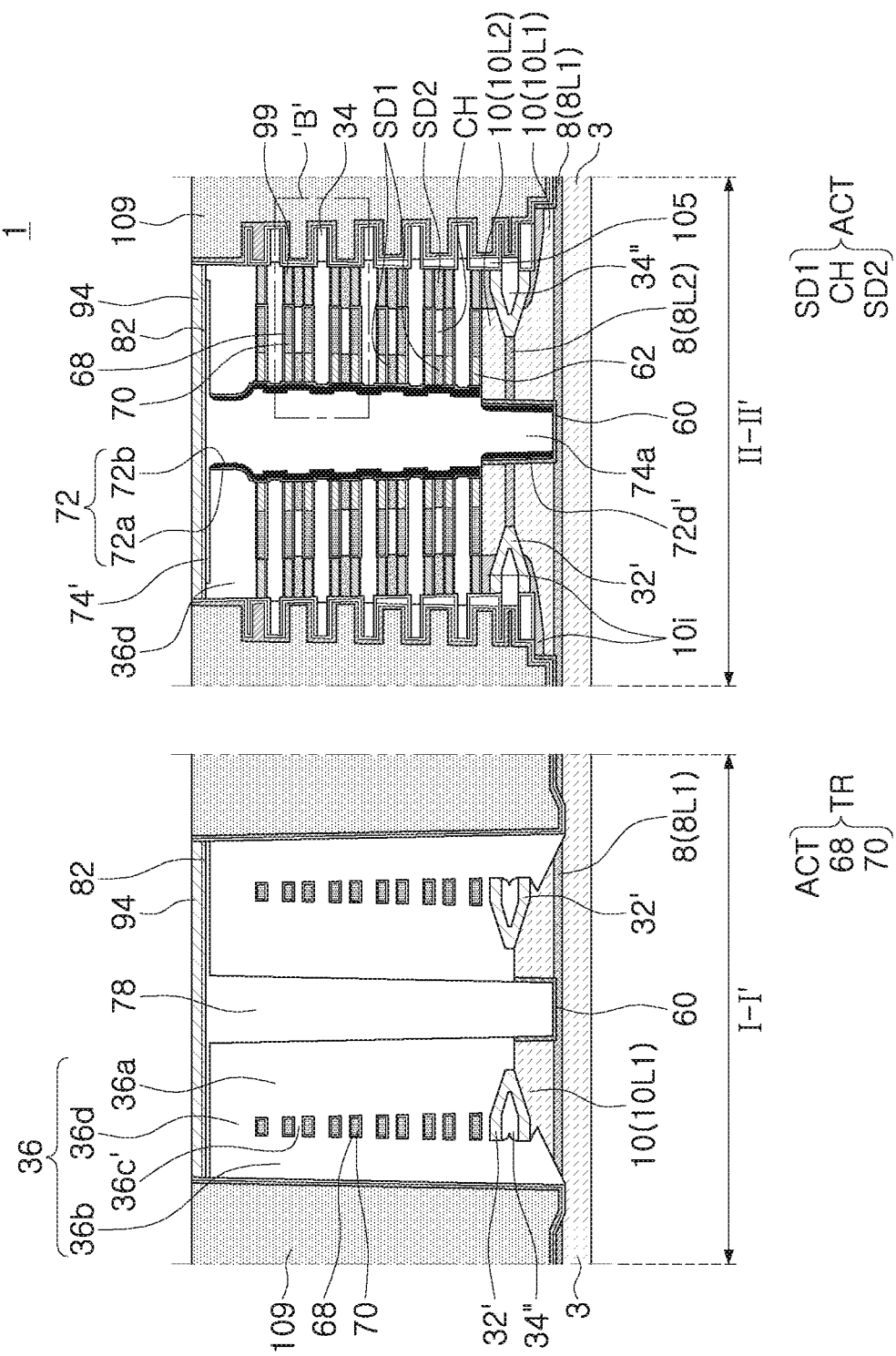
Figure 2B:
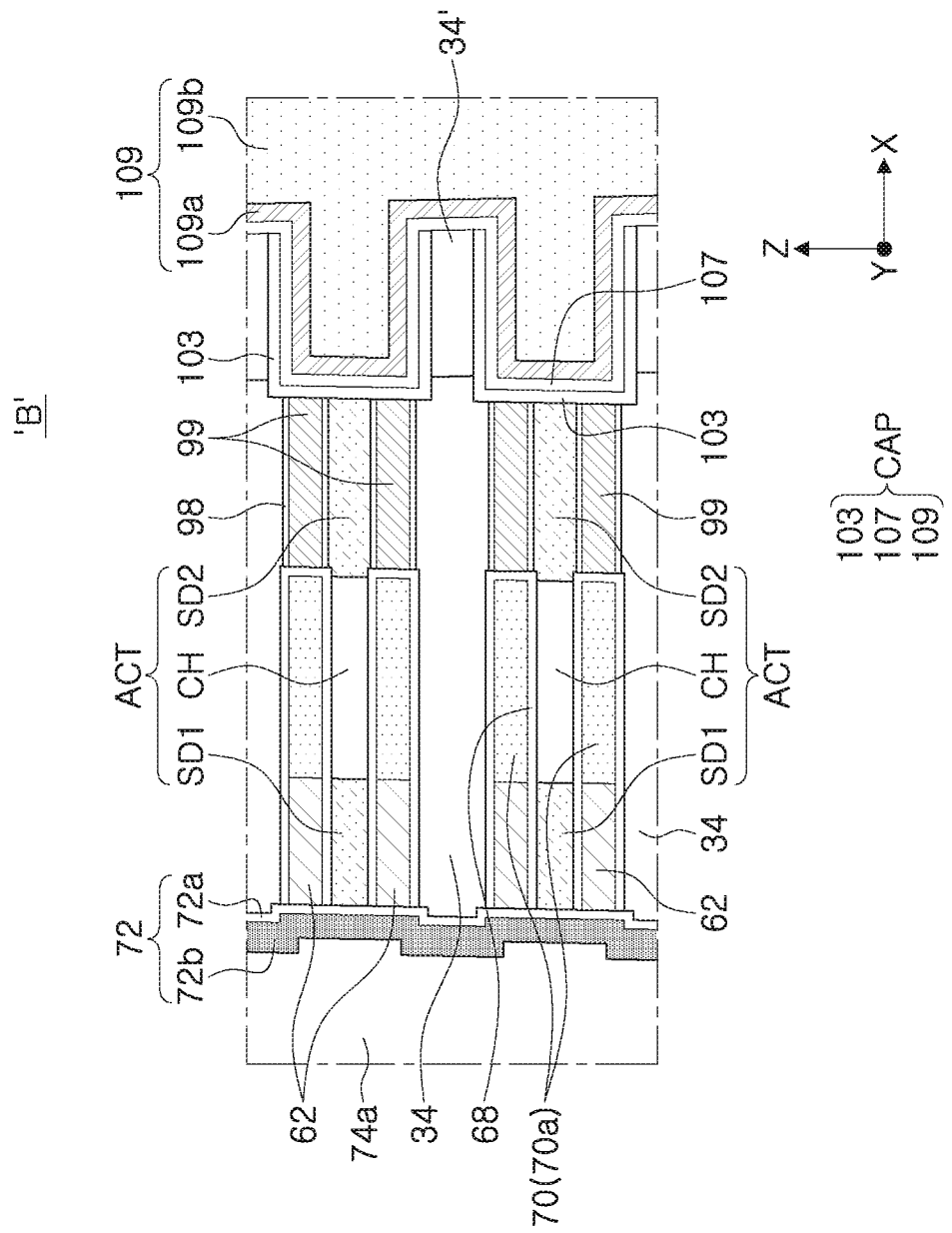
Figure 3:
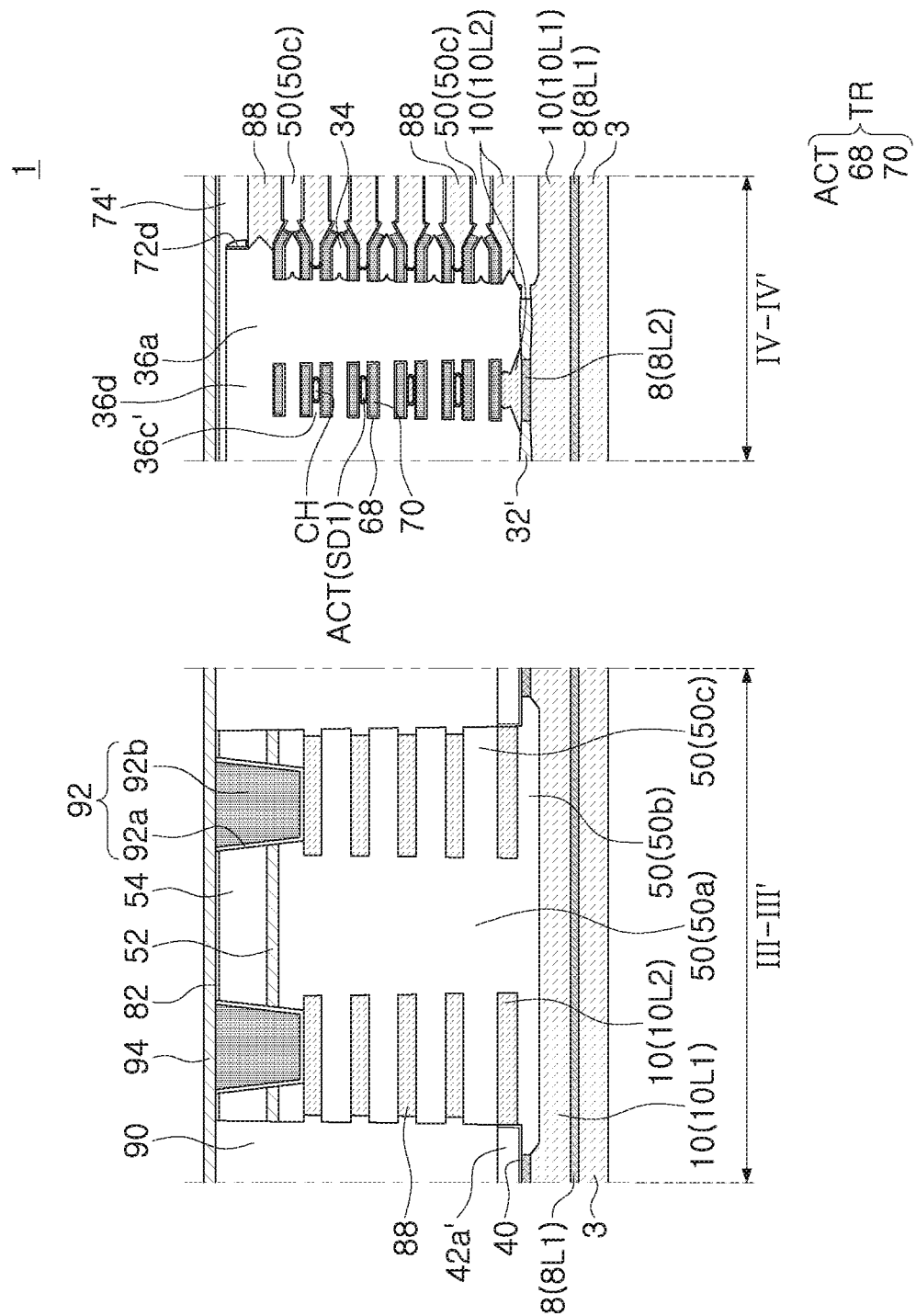
Figure 4:
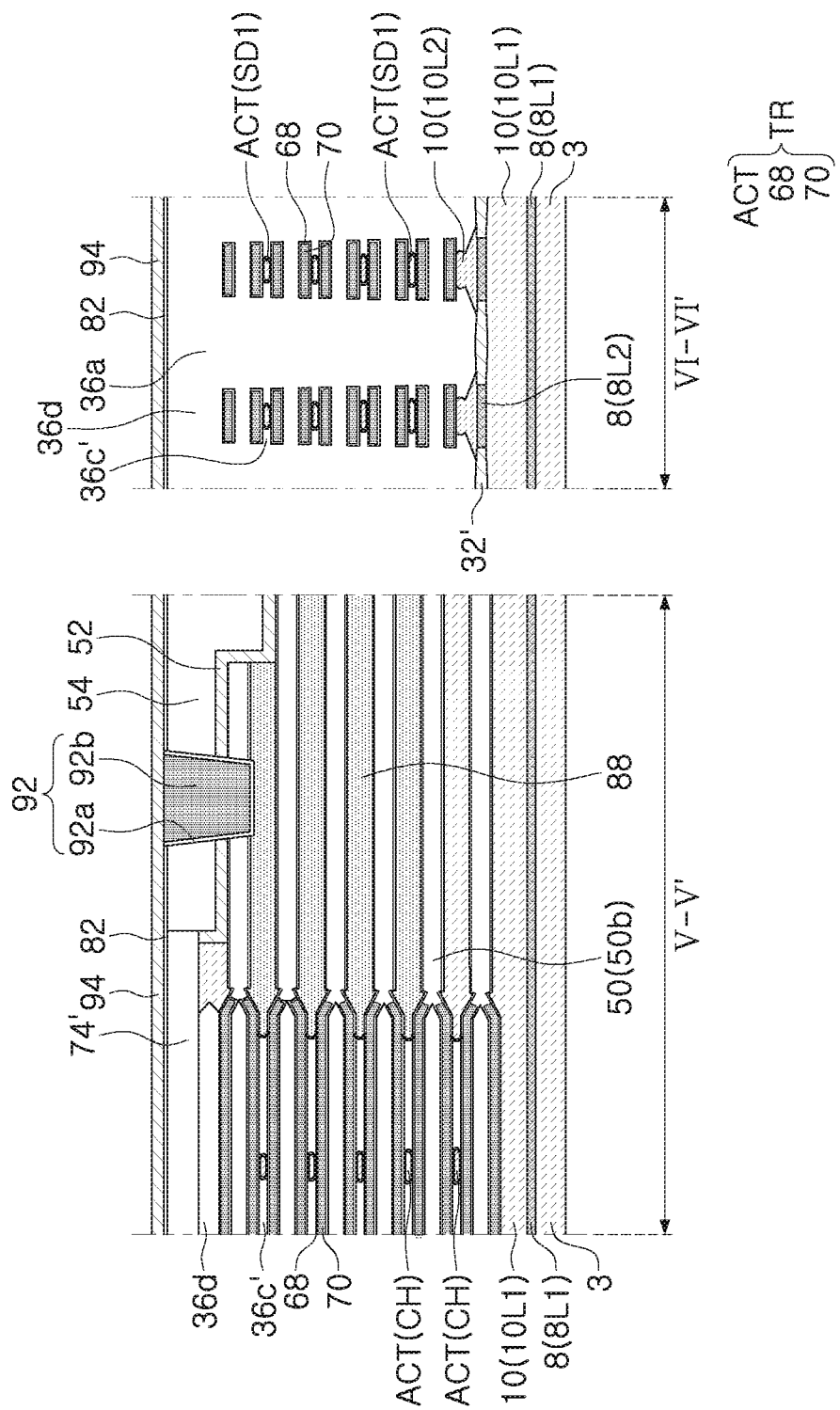
Figure 5:
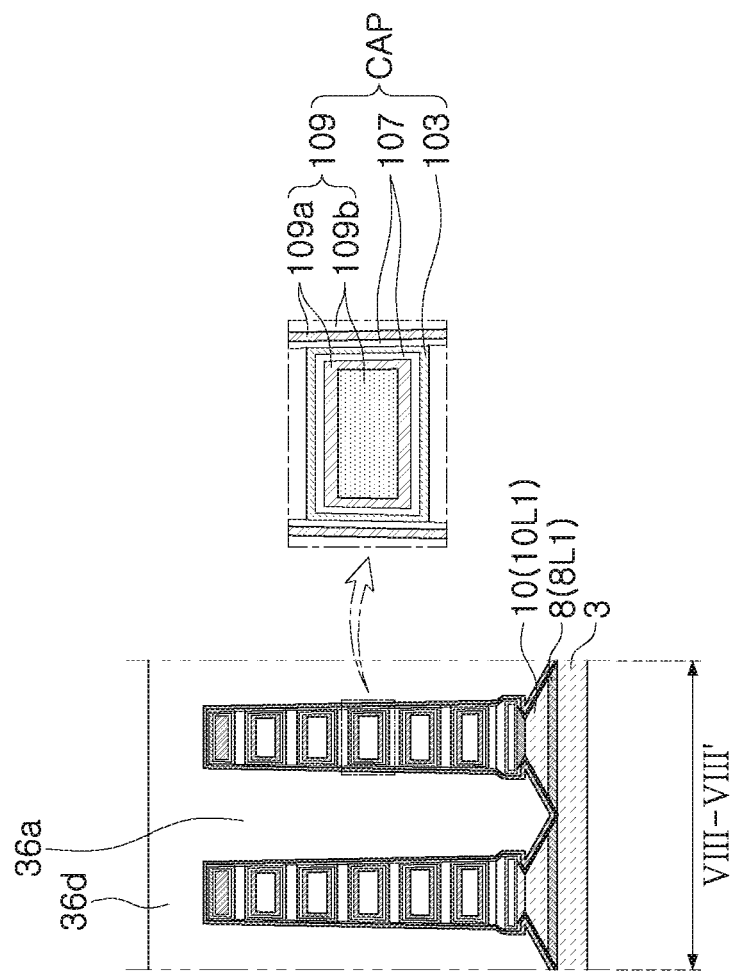

First, an example of a semiconductor device according to an example embodiment of the present inventive concept is described with reference to FIGS. 1A to 5. FIG. 1A is a top view schematically illustrating an example of a semiconductor device according to an example embodiment of the present inventive concept, FIG. 1B is a partially enlarged top view of an area indicated by 'A' of FIG. 1A, FIG. 2A is a cross-sectional view schematically illustrating areas taken along lines I-I' and II-II' of FIG. 1A, FIG. 2B is a partially enlarged cross-sectional view illustrating an area indicated by 'B' of FIG. 2A, FIG. 3 is a cross-sectional view schematically illustrating areas taken along lines and IV-IV' of FIG. 1A, and FIG. 4 is a cross-sectional view schematically illustrating areas taken along lines V-V and VI-VI' of FIG. 1A, and FIG. 5 is a cross-sectional view schematically illustrating areas taken along lines VII-VII' and VIII-VIII' of FIG. 1A.

Referring to FIGS. 1A to 5, a semiconductor device 1 according to an example embodiment of the present inventive concept may include a substrate 3, first insulating patterns 78 disposed on the substrate 3, and spaced apart from each other in a first horizontal direction Y parallel to an upper surface of the substrate 3, conductive patterns 72 spaced apart from each other on the substrate 3 in a second horizontal direction X perpendicular to the first horizontal direction Y, and a second insulating pattern 74a disposed between the first insulating patterns 78 in the first horizontal direction Y, and disposed between the conductive patterns 72 in the second horizontal direction X.

The semiconductor device 1 may further include dummy conductive patterns 72d' covering a side surface of the second insulating pattern 74a at a level lower than those of the conductive patterns 72. The conductive patterns 72 may cover the side surface of the second insulating pattern 74a along a vertical direction Z perpendicular to the first horizontal direction Y and the second horizontal direction X. The conductive patterns 72 and the dummy conductive patterns 72d' may be spaced apart from each other.

The second insulating pattern 74a may include a material different from that of the first insulating patterns 78. For example, a first material of the first insulating patterns 78 is a material that is not doped with an "element A", and a second material of the second insulating pattern 74a is a material that is doped with an "element A". For example, the first insulating patterns 78 may include silicon oxide ($SiO_2$), and the second insulating pattern 74a may include a material including silicon oxide ($SiO_2$) doped with an "element A".

In an example, the first insulating patterns 78 may not include the "element A". In another example, the first insulating patterns 78 may include an "element A" doped with a concentration lower than a doping concentration of the "element A" in the second insulating pattern 74a.

The "element A" may include at least one of a group 13 element or a group 15 element of the periodic table of the elements. For example, the "element A" may include at least one of nitrogen (N), phosphorus (P), or boron (B). For example, the second insulating pattern 74a may be silicon oxide ($SiO_2$) doped with N, silicon oxide ($SiO_2$) doped with P, or silicon oxide ($SiO_2$) doped with B.

In an example embodiment of the present inventive concept, in the second insulating pattern 74a, a content of the "element A" may be about 30% or less. The term "about" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

In an example, the first insulating patterns 78 may be silicon oxide ($SiO_2$) that does not include the "element A". In another example, the first insulating patterns 78 may be silicon oxide (SiO$_2$) having an "element A" content less than the "element A" content of the second insulating pattern 74a.

A width of the second insulating pattern 74a in the first horizontal direction Y may be less than a width of each of the second electrodes 103 in the first horizontal direction Y. However, the present inventive concept is not limited thereto.

In an example embodiment of the present inventive concept, a plurality of the second insulating patterns 74a may be disposed, and the plurality of second insulating patterns 74a may be alternately and repeatedly arranged with the first insulating patterns 78 in the first horizontal direction Y.

The second insulating patterns 74a and the first insulating patterns 78 may be included in an insulating structure 80.

When viewed in a top view, the insulating structure 80 may have a line shape extending in the first horizontal direction Y.

Each of the second insulating patterns 74a may have a height greater than a maximum width.

In an example embodiment of the present inventive concept, a height of an element may be defined as a distance between a lower surface and an upper surface of the element.

In one example, a height of each of the second insulating patterns 74a may be approximately 10 times or more of a width of each of the second insulating patterns 74a. In another example, the height of each of the second insulating patterns 74a may be approximately 50 times or more of the width of each of the second insulating patterns 74a. In another example, the height of each of the second insulating patterns 74a may be approximately 100 times or more of the width of each of the second insulating patterns 74a. In other words, each of the second insulating patterns 74a may have high aspect ratio.

In the first horizontal direction Y, each of the first insulating patterns 78 may have concave side surfaces facing each other, and each of the second insulating patterns 74a may have convex side surfaces in contact with the concave side surfaces of the first insulating patterns 78. Similar to the second insulating patterns 74a, each of the first insulating patterns 78 may also have high aspect ratio. For example, the aspect ratio of each of the first insulating patterns 78 may be 10:1 or higher. For example, the aspect ratio of each of the first insulating patterns 78 may be 50:1 or higher. For example, the aspect ratio of each of the first insulating patterns 78 may be 100:1 or higher.

The conductive patterns 72 may be in contact with the side surfaces of the first insulating pattern 78 positioned in the second horizontal direction X.

Each of the conductive patterns 72 may include at least two different conductive layers, for example, a first conductive layer 72a and a second conductive layer 72b.

The substrate 3 may be a semiconductor substrate. For example, the substrate 3 may include a semiconductor material, for example, a group IV semiconductor, a group III-V compound semiconductor, or a group II-VI compound semiconductor. For example, the group IV semiconductor may include silicon (Si), germanium (Ge), or silicon-germanium (SiGe). The group III-V compound semiconductor may include, for example, gallium phosphide (GaP), gallium arsenide (GaAs), indium arsenide (InAs), indium phosphide (InP), gallium antimonide (GaSb), indium antimonide (InSb), or indium gallium arsenide (InGaAs). The group II-VI compound semiconductor may include, for example, cadmium selenide (CdSe), cadmium sulfide (CdS), cadmium telluride (CdTe), zinc oxide (ZnO), zinc selenide (ZnSe), zinc sulfide (ZnS), or zinc telluride (ZnTe). The substrate 3 may be provided as a bulk semiconductor wafer, a semiconductor substrate including an epitaxial layer, a silicon on insulator (SOI) substrate, a semiconductor on insulator (SeOI) substrate, or the like.

The substrate 3 may include a first area MCA and a second area GIA adjacent to the first area MCA.

The first area MCA may be referred to as a memory cell array area, and the second area GIA may be referred to as a gate connection area or a staircase area.

The semiconductor device 1 may further include a first conductive line group 70_1 including first conductive lines 70 spaced apart from each other and stacked in a vertical direction Z perpendicular to the upper surface of the substrate 3 on the first area MCA of the substrate 3, and a second conductive line group 70_2 including second conductive lines 70 spaced apart from each other and stacked in the vertical direction Z on the first area MCA of the substrate 3. The first conductive line group 70_1 and the second conductive line group 70_2 may be spaced apart from each other in the second horizontal direction X.

The semiconductor device 1 may further include first active groups ACT_1 and second active groups ACT_2.

The first active groups ACT_1 may be disposed on the first area MCA of the substrate 3, and may be arranged and spaced apart from each other in the first horizontal direction Y.

The second active groups ACT_2 may be disposed on the first area MCA of the substrate 3, may be arranged and spaced apart from each other in the first horizontal direction Y, and may be spaced apart from the first active groups ACT_1 in the second horizontal direction X perpendicular to the first horizontal direction Y.

The insulating structure 80 may be disposed between the first conductive line group 70_1 and the second conductive line group 70_2, and between the first active group ACT_1 and the second active group ACT_2 in the second horizontal direction X.

The semiconductor device 1 may further include conductive patterns 72. The conductive patterns 72 may include first conductive patterns 72_1 disposed between the insulating structure 80 and the first active groups ACT_1, and second conductive patterns 72_2 disposed between the insulating structure 80 and the second active groups ACT_2.

Each of the first active groups ACT_1 may include the first active layers ACT spaced apart from each other and stacked in the vertical direction Z, having a line or bar shape extending in the second horizontal direction X, and intersecting the first conductive lines 70 of the first conductive line group 70_1.

Each of the second active groups ACT_2 may include second active layers ACT spaced apart from each other and stacked in the vertical direction Z, having a line or bar shape extending in the second horizontal direction X, and intersecting the second conductive lines 70 of the second conductive line group 70_2.

Each of the active layers ACT of the first and second active groups ACT_1 and ACT_2 may include a first source/drain region SD1 and a second source/drain region SD2 spaced apart from each other, and a channel region CH interposed between the first source/drain region SD1 and the second source/drain region SD2.

The first source/drain regions SD1 of the active layers ACT of the first active group ACT_1 may be electrically connected to the first conductive patterns 72_1, and the first source/drain regions SD1 of the active layers ACT of the second active group ACT_2 may be electrically connected to the second conductive patterns 72_2.

The conductive lines 70 of the first and second conductive line groups 70_1 and 70_2 may vertically overlap the channel regions CH of the active layers ACT, and extend in the first horizontal direction Y. The conductive lines 70 may cover upper and lower surfaces of the channel regions CH of the active layers ACT. For example, the channel regions CH of the active layers ACT may be located at the intersections of the conductive lines 70 and the active layers ACT.

The conductive lines 70 may include a pair of conductive lines 70a covering an upper surface and a lower surface of one of the active layers ACT. For example, the pair of conductive lines 70a may cover an upper surface and a lower surface of a channel region CH of the one of the active layers ACT.

The semiconductor device 1 may further include gate dielectric layers 68 interposed between at least the active layers ACT and the conductive lines 70.

The conductive lines 70 may be gate electrodes. The active layers ACT including the first and second source/drain regions SD1 and SD2 and the channel regions CH, the conductive lines 70 as the gate electrodes, and the gate dielectric layers 68 may be included in transistors TR. Accordingly, the transistors TR may be three-dimensionally arranged on the first area MCA of the substrate 3.

At least some of the conductive lines 70 may be word lines, and at least some of the conductive patterns 72 may be bit lines. For example, an uppermost conductive line and a lowest conductive line of the conductive lines 70 may be dummy conductive lines, and intermediate conductive lines of the conductive lines 70 may be word lines. The word lines may be gate electrodes of the transistors TR.

The semiconductor device 1 may further include data storage structures CAP disposed on the substrate 3. The insulating structure 80 may be spaced apart from the data storage structures CAP.

The insulating structure 80, the first and second active groups ACT_1 and ACT_2, and the first and second conductive line groups 70_1 and 70_2 may be disposed between a pair of data storage structures CAP that are adjacent to each other while being spaced apart from each other in the second horizontal direction X.

The first active groups ACT_1 and the first conductive line group 70_1 may be disposed between the insulating structure 80 and one data storage structures CAP of the pair of the data storage structures CAP. The second active groups ACT_2 and the second conductive line group 70_2 may be disposed between the other data storage structure CAP and the insulating structure 80. For example, the insulating structure 80 may be interposed between the first conductive line group 70_1 and the second conductive line group 70_2 and between the first active groups ACT_1 and the second active groups ACT_2.

Each of the data storage structures CAP may include a first electrode 109, second electrodes 103 disposed between the first electrode 109 and the active layers ACT, and a dielectric layer 107 disposed between at least the second electrodes 103 and the first electrode 109.

The first electrode 109 may include a first material layer 109a in contact with the dielectric layer 107 and a second material layer 109b on the first material layer 109a. Each of the second electrodes 103 may have a "U" shape in a top view (referring to FIG. 1B), and a sideway "U" shape in a cross-sectional view (referring to FIG. 2B). The first material layer 109a and the second material layer 109b may be different conductive materials. The dielectric layer 107 may conformally cover a side surface of the first material layer 109a.

The data storage structures CAP may be capacitors capable of storing information in a dynamic random access memory (DRAM) device. For example, the first electrode 109 may be a plate electrode, the second electrodes 103 may be storage node electrodes, and the dielectric layer 107 may be a capacitor dielectric layer.

The second source/drain regions SD2 of the active layers ACT of the first and second active groups ACT_1 and ACT_2 may be electrically connected to the second electrodes 103 of the data storage structures CAP.

The conductive patterns 72 may have a width greater than those of the second electrodes 103 in the first horizontal direction Y. To be described later, when openings having high aspect ratio are formed to accommodate the first insulating patterns 78 and to etch conductive layers to form the conductive patterns 72 may have a bowing shape due to high aspect ratio of the openings, resulting in a significant difference in sizes between upper and lower portions of the conductive patterns 72 and causing a reliability concern for the 3D DRAM device fabricated. However, when the second insulating pattern 74a, which is the remaining portion of an insulating layer being etched to form the opening described above, is formed of a material including silicon oxide ($SiO_2$) doped with an "element A" according to an example embodiment of the present inventive concept, the bowing phenomenon may be minimized, and thus, the conductive patterns 72 may have a more uniform width over upper and lower portions thereof in the first horizontal direction Y.

In the second horizontal direction X, at least one of the conductive lines 70 may include a first portion vertically overlapping with the active layers ACT, and having a first width W1, and a second portion positioned between the first electrode 109 of the data storage structures CAP and the first insulating patterns 78, and having a second width W2 less than the first width W1. For example, each of the channel regions CH of the active layers ACT may have the first width W1 in the second horizontal direction X.

The semiconductor device 1 may further include gate contact lines 88 and gate contact plugs 92. The gate contact lines 88 may include first gate contact lines 88a disposed on the second area GIA of the substrate 3, and electrically connected to the first conductive line group 70_1, and second gate contact lines 88b disposed on the second area GIA of the substrate 3, and electrically connected to the second conductive line group 70_2.

The conductive lines 70 may include a pair of conductive lines 70a covering an upper surface and a lower surface of one of the active layers ACT, and one of the gate contact lines 88 disposed on the second area GIA of the substrate 3 may be in contact with the pair of conductive lines 70a extending from the first area MCA of the substrate 3, and may be electrically connected to the pair of conductive lines 70a.

One transistor TR of the transistors TR may include one active layer ACT including the first and second source/drain regions SD1 and SD2 and the channel region CH, a pair of conductive lines 70a covering an upper surface and a lower surface of the one active layer ACT, and the gate dielectric layer 68 between the pair of conductive lines 70a and the active layer ACT. In the transistor TR, the pair of conductive lines 70a may be one gate electrode. Accordingly, the transistors TR may be three-dimensionally arranged on the first area MCA of the substrate 3.

Each of the gate contact lines 88 may extend in the first horizontal direction Y.

End portions of the gate contact lines 88 may be arranged in a staircase shape. For example, the gate contact lines 88 may be staked in a staircase shape in which extension lengths in the first horizontal direction Y may gradually decrease in a stepwise manner from a lowermost level toward an uppermost level.

In the second horizontal direction X, a width of each of the gate contact lines 88 may be greater than a width of each of the conductive lines 70.

The gate contact plugs 92 may be electrically connected to the gate contact lines 88 on the gate contact lines 88.

Each of the gate contact plugs 92 may include a plug pattern 92b and a barrier layer 92a surrounding a side surface and a lower surface of the plug pattern 92b. In an example embodiment of the present inventive concept, the plug pattern 92b may include a low electrical resistance metal, e.g., tungsten (W), titanium (Ti), tantalum (Ta), etc., and the barrier layer 92a may include a metal nitride, e.g., titanium nitride (TiN), tantalum nitride (TaN), etc.

The semiconductor device 1 may further include an insulating layer 50a disposed between the first gate contact lines 88a and the second gate contact lines 88b on the second area GIA of the substrate 30. The insulating layer 50a may include a material the same as that of the second insulating patterns 74a. For example, the insulating layer 50a may be silicon oxide ($SiO_2$) doped with N, silicon oxide ($SiO_2$) doped with P, or silicon oxide ($SiO_2$) doped with B.

The semiconductor device 1 may further include insulating layers 90 adjacent to the data storage structures CAP in the first horizontal direction Y. The gate contact lines 88 and the insulating layer 50a may be disposed between the insulating layers 90.

A material of the insulating layer 90 may be substantially the same as that of the first insulating patterns 78. For example, the insulating layer 90 may include silicon oxide ($SiO_2$) that is not doped with the "element A", or doped with a small amount of the "element A".

The semiconductor device 1 may further include first semiconductor layers 8 and second semiconductor layers 10 disposed on the substrate 3.

The first semiconductor layers 8 may include a first semiconductor layer 8L1 in contact with the substrate 3, and a first semiconductor layer 8L2 on the first semiconductor layer 8L1.

The second semiconductor layers 10 may include a second semiconductor layer 10L1 on the first semiconductor layer 8L1 and a second semiconductor layer 10L2 on the first semiconductor layer 8L2. The second semiconductor layer 10L1 may be interposed between the first semiconductor layer 8L1 and the first semiconductor layer 8L2, and the first semiconductor layer 8L2 may be interposed between the second semiconductor layer 10L1 and the second semiconductor layer 10L2.

A semiconductor material of the first semiconductor layers 8 may be different from a semiconductor material of the second semiconductor layers 10. For example, the first semiconductor layers 8 may be formed of silicon germanium (SiGe), and the second semiconductor layers 10 may be formed of silicon (Si). The substrate 3 may be formed of silicon (Si).

The substrate 3 and the first and second semiconductor layers 8 and 10 may have a single-crystal structure.

The insulating structure 80 may pass through at least the first and second semiconductor layers 8L2, 10L2, and 10L1. For example, the insulating structure 80 may pass through the first and second semiconductor layers 8L2, 10L2, and 10L1, and may not pass through the first semiconductor layer 8L1.

The data storage structure CAP may pass through at least the first and second semiconductor layers 8L2, 10L2, and 10L1. The data storage structure CAP may pass through the first and second semiconductor layers 8L1, 8L2, 10L2, and 10L1 and may be in contact with the substrate 3. For example, in the data storage structure CAP, the first electrode 109 may be spaced apart from the substrate 3, and the dielectric layer 107 may include a portion extending between the first electrode 109 and the substrate 3 to be interposed between the first electrode 109 and the substrate 3. For example, the first electrode 109 may be electrically insulated from the substrate 3 by the dielectric layer 107.

The semiconductor device 1 may further include insulating layers 62 between the conductive lines 70 and the conductive patterns 72, and insulating layers 99 between the conductive lines 70 and the data storage structures CAP. The insulating layers 62 and 99 may be formed of substantially the same material. The insulating layers 62 and 99 may include, for example, silicon nitride ($Si_3N_4$). The insulating layers 62 and 99 may include an insulating layer 62 covering an upper surface and a lower surface of the first source/drain region SD1 of each of the active layers ACT, and an insulating layer 99 covering an upper surface and a lower surface of the second source/drain region SD2 of each of the active layers ACT. The gate dielectric layers 68 may include a portion surrounding structures including the conductive lines 70 and the insulating layers 62, and extending between the conductive lines 70 and the insulating layers 99. For example, each of the gate dielectric layers 68 may include a portion interposed between one of the conductive lines 70, which may serve as a gate electrode, and a channel region CH of one of the active layers ACT. The semiconductor device 1 may further include insulating layers 98 covering a lower surface and an upper surface of each of the insulating layers 99, and extending to a side surface of each of the insulating layers 99 in the first horizontal direction Y.

The semiconductor device 1 may further include insulating layers 34. One active layer ACT, the conductive lines 70 covering a lower surface and an upper surface of the one active layer ACT, the gate dielectric layer 68 between the conductive lines 70 and the active layer ACT, and the insulating layers 62 and 99 covering a lower surface and an upper surface of a portion of the one active layer ACT may be disposed between a pair of the insulating layers 34 adjacent to each other in the vertical direction Z. For example, two adjacent transistors TR arranged in the vertical direction Z may be spaced apart from each other by one of the insulating layers 34.

Each of the insulating layers 34 may further include an extension 34' extending into the data storage structure CAP. One extension 34' may be disposed between a pair of the second electrodes 103 arranged in the vertical direction Z. A vertical thickness of the extension 34' may be less than a vertical thickness of each of the insulating layers 34.

The semiconductor device 1 may further include insulating layers 50c filling between the gate contact lines 88 arranged in the vertical direction Z on the second area GIA of the substrate 3, and an insulating layer 50b disposed between the two second semiconductor layers 10L1 and 10L2 below the insulating layers 50c. The insulating layers 50a, 50b, and 50c may be included in the insulating layer 50 that is integrally formed.

The semiconductor device 1 may further include an insulating layer 42a' disposed between the insulating layer 90 and the substrate 3, and an insulating layer 40 covering a side surface and a bottom surface of the insulating layer 42a'. A top surface of the insulating layer 42a' may be higher than a top surface of the second semiconductor layer 10L2. For example, the insulating layer 90 may be formed at a level higher than that of the second semiconductor layer 10L2.

The semiconductor device 1 may further include an insulating structure 36 disposed between the data storage structures CAP and the insulating structure 80.

The insulating structure 36 may include an insulating layer 36a adjacent to the insulating structure 78, an insulating layer 36b adjacent to the data storage structure CAP, an insulating layer 36c' disposed between the conductive lines 70 in the vertical direction Z and between the insulating layers 36a and 36b in the second horizontal direction X, and an insulating layer 36d disposed on the conductive lines 70. The second insulating pattern 74a may further include an extension 74' extending onto the insulating layer 36d.

When viewed in a top view, the insulating layer 36c' may be disposed between portions of the conductive lines 70 disposed between the first active groups ACT_1, and may be disposed between portions of the conductive lines 70 disposed between the second active groups ACT_2.

The semiconductor device 1 may further include, below the conductive lines 70 and the active layers ACT, an insulating layer 34" disposed on a portion of the second semiconductor layer 10L1 at a position spaced apart from the insulating structure 80 and overlapping at least a portion of the second source/drain region SD2, and an insulating layer 32' covering an upper surface and a lower surface of the insulating layer 34", and covering one side of the insulating layer 34" positioned opposite to the insulating structure 80. Referring to FIG. 2A, in a cross-sectional view, the insulating layer 32' may have a sideway "V" shape, such as a "<" shape or a ">" shape.

The semiconductor device 1 may further include, between the second insulating pattern 74a and the first electrode 109, impurity areas 10i disposed in the second semiconductor layers 10L1 and 10L2 adjacent to the first electrode 109. The impurity areas 10i may have a type of conductivity the same as those of the first and second source/drain regions SD1 and SD2, for example, an N-type conductivity.

The semiconductor device 1 may further include insulating layers 82 and 94 sequentially stacked on the insulating structure 36, the conductive patterns 72, the insulating structure 80, and the insulating layers 90 and 50. The insulating layer 94 may cover an upper surface of the gate contact plug 92.

The semiconductor device 1 may further include, on the second area GIA, an insulating layer 52 covering the insulating layer 50, and an insulating layer 54 on the insulating layer 52. The insulating layer 52 may be a liner. The insulating layer 52 and the insulating layer 54 may be formed of different insulating materials. For example, the insulating layer 52 may be formed of silicon nitride ($Si_3N_4$) or a high-k dielectric material such as, for example, aluminum oxide ($Al_2O_3$) or hafnium oxide ($HfO_2$), and the insulating layer 54 may be formed of silicon oxide ($SiO_2$).

The gate contact plugs 92 may pass through the insulating layers 54, 52, and 50 to be electrically connected to the gate contact lines 88. Each of the gate contact plugs 92 may include a plug pattern 92b and a barrier layer 92a surrounding a side surface and a lower surface of the plug pattern 92b. The barrier layers 92a may be in direct contact with the gate contact lines 88.

In an example embodiment of the present inventive concept, the transistors TR and the data storage structures CAP disposed on one side of the insulating structure 80 may be included in a first memory block, and the transistors TR and the data storage structures CAP disposed on the other side of the insulating structure 80 may be included in a second memory block. Accordingly, each of the first and second memory blocks TR and CAP may include three-dimensionally arranged transistors TR and data storage structures CAP electrically connected to the transistors TR, and the insulating structure 80 may be disposed between the first memory blocks TR and CAP and the second memory blocks TR and CAP. The insulating structure 80 may include the first insulating patterns 78 and the second insulating pattern 74a, in which the second insulating pattern 74a may be formed of, for example, silicon oxide ($SiO_2$) doped with N, silicon oxide ($SiO_2$) doped with P, or silicon oxide ($SiO_2$) doped with B.

Hereinafter, various modifications of the elements of the above-described semiconductor device 1 are described with reference to FIGS. 6 to 10, respectively. The various modifications of the elements of the above-described semiconductor device 1 to be described below are mainly described with reference to the elements being deformed or the elements being replaced. In addition, although deformable or replaceable elements to be described below are described with reference to respective drawings, the deformable elements may be combined with each other to be included in the semiconductor device 1 according to an example embodiment of the present inventive concept. FIGS. 6 to 10 are schematic diagrams illustrating various modifications of elements of the above-described semiconductor device 1. In FIGS. 6 to 10, FIG. 6 may illustrate a modification of a semiconductor device according to an example embodiment of the present inventive concept, when viewed in a partially enlarged top view of FIG. 1B, FIG. 7 may illustrate a modification of a semiconductor device according to an example embodiment of the present inventive concept, when viewed in a partially enlarged top view of FIG. 1B, FIG. 8 may illustrate a modification of the conductive patterns 72 in the II-II' cross-sectional structure of FIG. 2A, FIG. 9 may illustrate, in FIG. 1A, a modification of a semiconductor device according to an example embodiment of the present inventive concept, and FIG. 10 may illustrate a cross-sectional structure of an area taken along line IIa-IIa' of FIG. 9.

Figure 6:
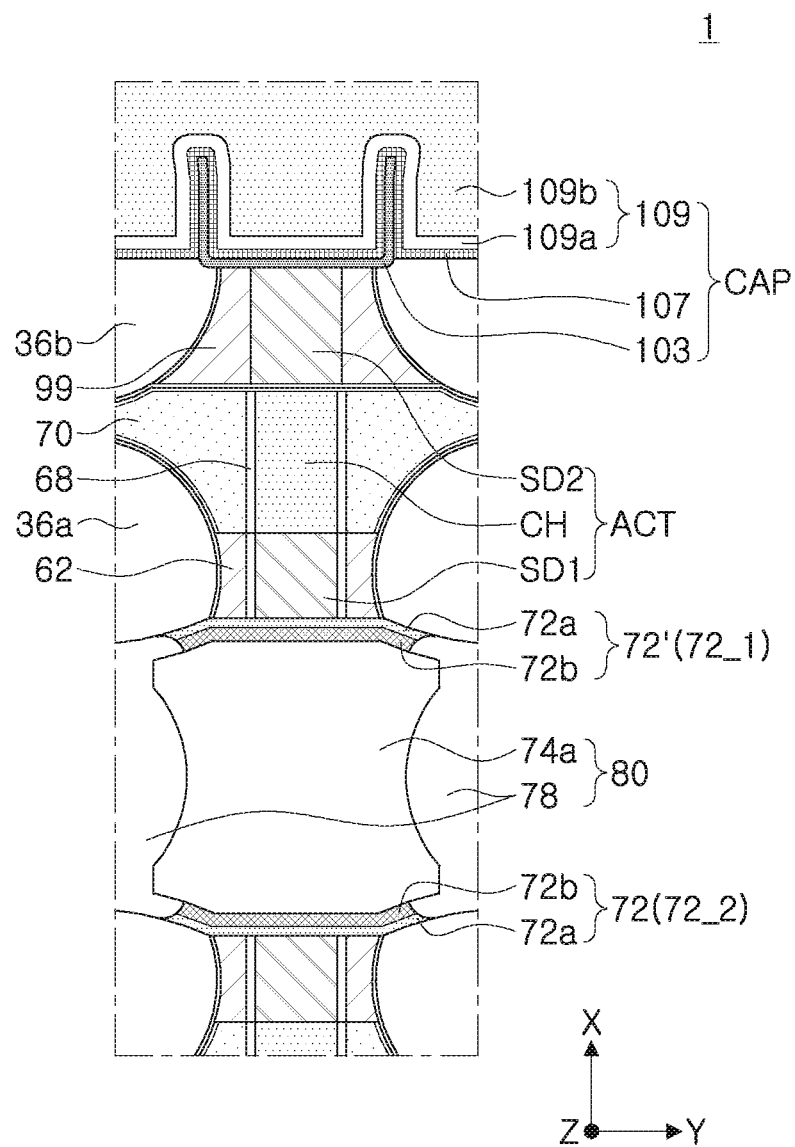
FIG. 6 is a partially enlarged plan view schematically illustrating a modification of a semiconductor device according to an example embodiment of the present inventive concept.

In a modification, referring to FIG. 6, the conductive patterns 72 in FIG. 1B may be deformed into conductive patterns 72'. Side surfaces of the conductive patterns 72' may be recessed between the insulating pattern 74a and the insulating layer 36a. Accordingly, the insulating pattern 78 may extend between the insulating pattern 74a and the insulating layer 36a. Since the second insulating pattern 74a may be formed of a material including silicon oxide ($SiO_2$) doped with an "element A" according to an example embodiment of the present inventive concept, the bowing phenomenon in openings may be minimized, and thus, the conductive patterns 72' may have a more uniform width over upper and lower portions thereof in the first horizontal direction Y.

Figure 7:
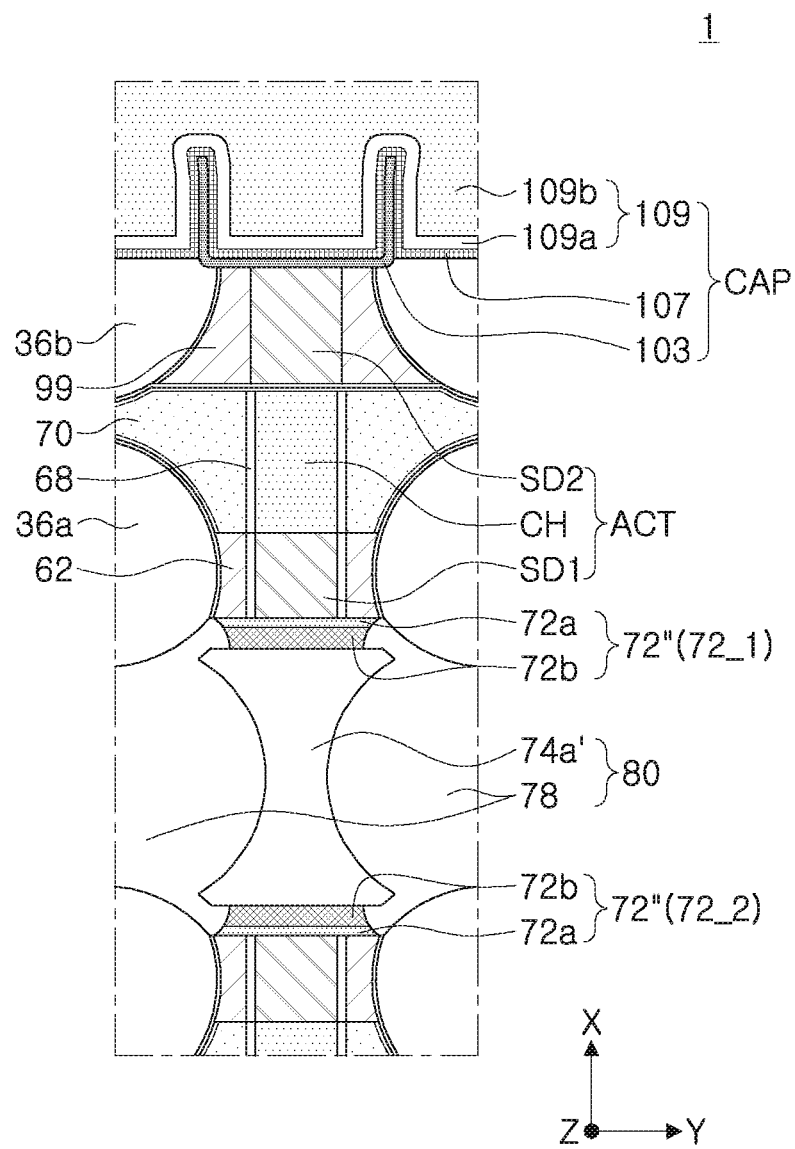
FIG. 7 is a partially enlarged plan view schematically illustrating a modification of a semiconductor device according to an example embodiment of the present inventive concept.

In a modification, referring to FIG. 7, the conductive patterns 72 in FIG. 1B may be deformed into conductive patterns 72" each having a width narrower than widths of the second electrodes 103. For example, widths of the conductive patterns 72" in the first horizontal direction Y may be less than widths of the second electrodes 103 in the first horizontal direction Y. The second insulating pattern 74a in FIG. 1B may be deformed into a second insulating pattern 74a' having a minimum width narrower than a width of each of the second electrodes 103 in the first horizontal direction Y. Since the second insulating pattern 74a' may be formed of a material including silicon oxide (SiO$_2$) doped with an "element A" according to an example embodiment of the present inventive concept, the bowing phenomenon in openings may be minimized, and thus, the conductive patterns 72" may have a more uniform width over upper and lower portions thereof in the first horizontal direction Y.

Figure 8:
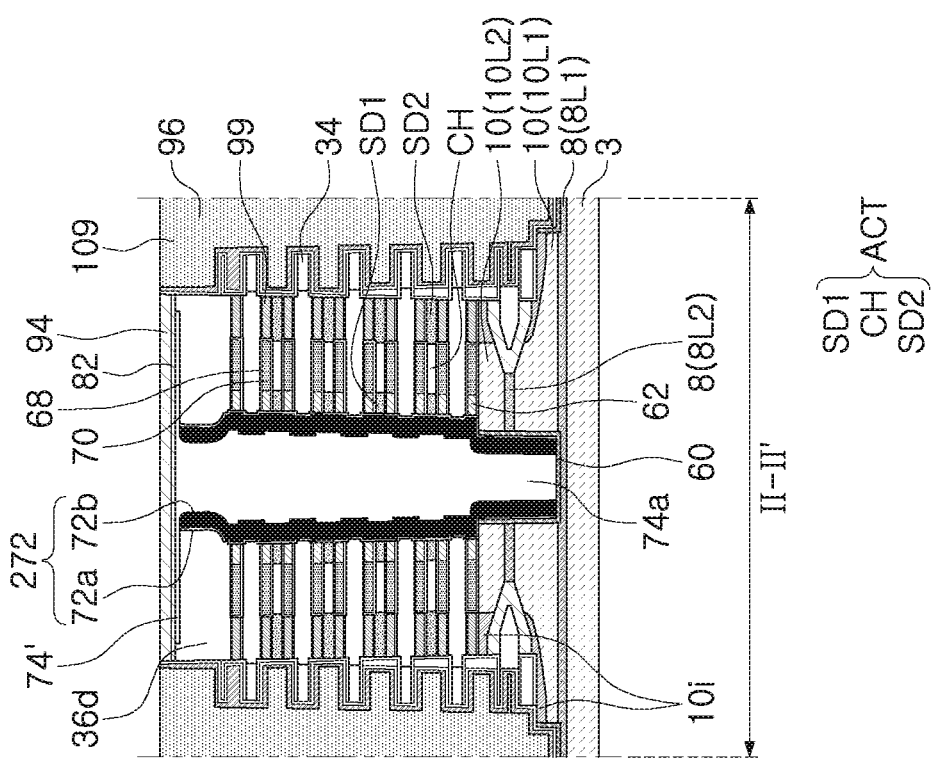
FIG. 8 is a cross-sectional view schematically illustrating a modification of a semiconductor device according to an example embodiment of the present inventive concept.

In a modification, referring to FIG. 8, the conductive patterns 72 and the dummy conductive patterns 72d' in FIG. 2A may be deformed into conductive patterns 272 connected to each other. Since the second insulating pattern 74a may be formed of a material including silicon oxide (SiO$_2$) doped with an "element A" according to an example embodiment of the present inventive concept, the bowing phenomenon in openings may be minimized, and thus, the conductive patterns 272 may have a more uniform width over upper and lower portions thereof in the first horizontal direction Y.

Figure 9:
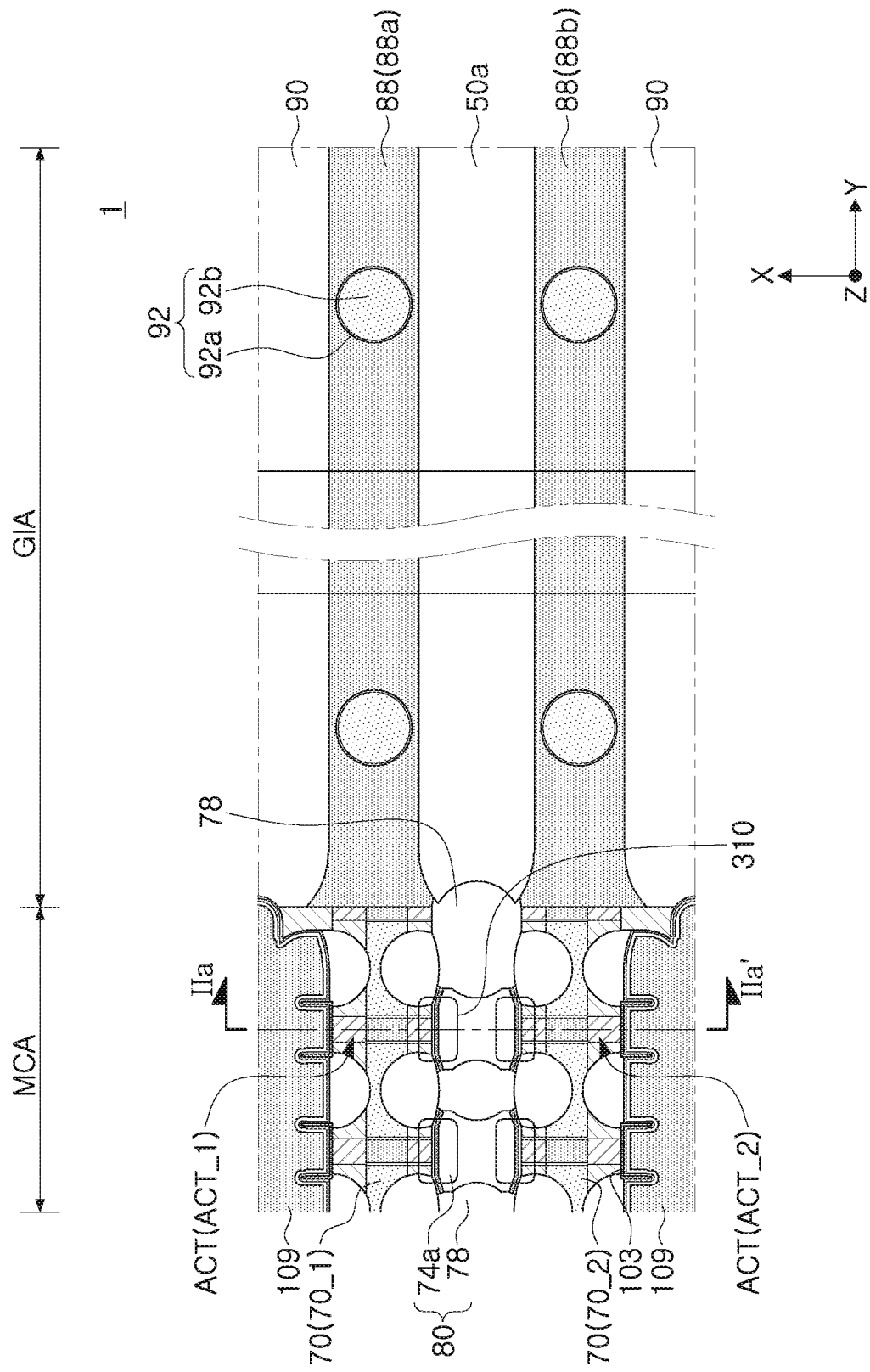
FIGS. 9 and 10 are diagrams schematically illustrating a modification of a semiconductor device according to an example embodiment of the present inventive concept.
Figure 10:
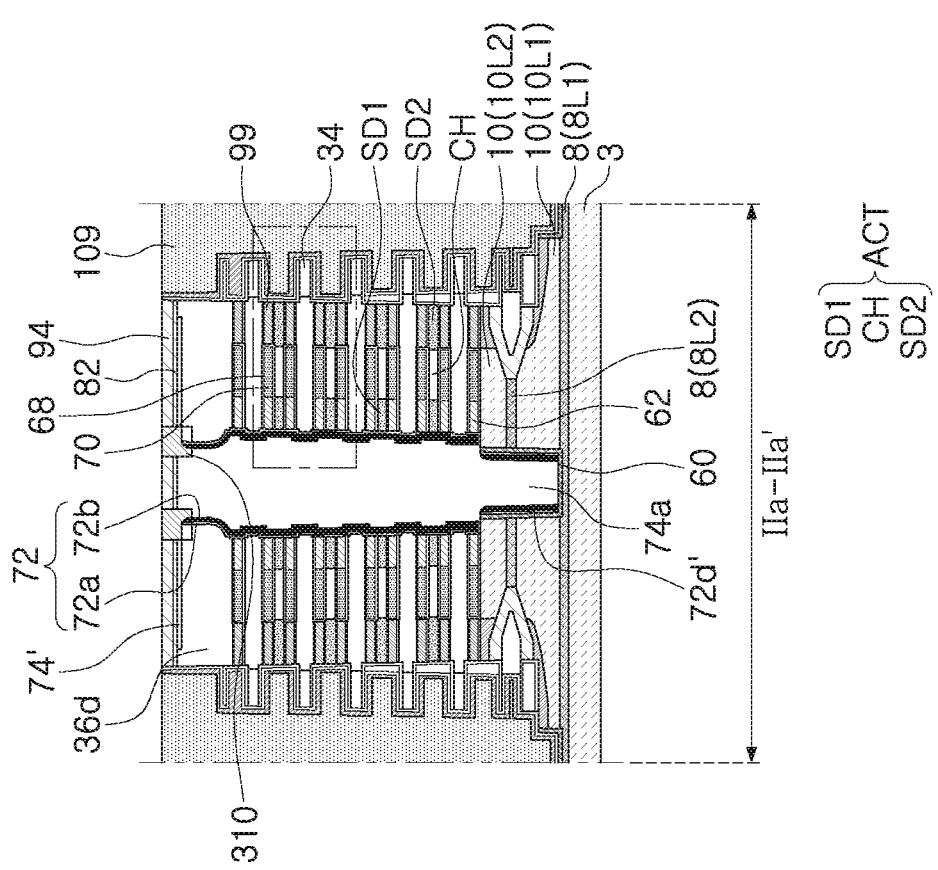
Figure 11:
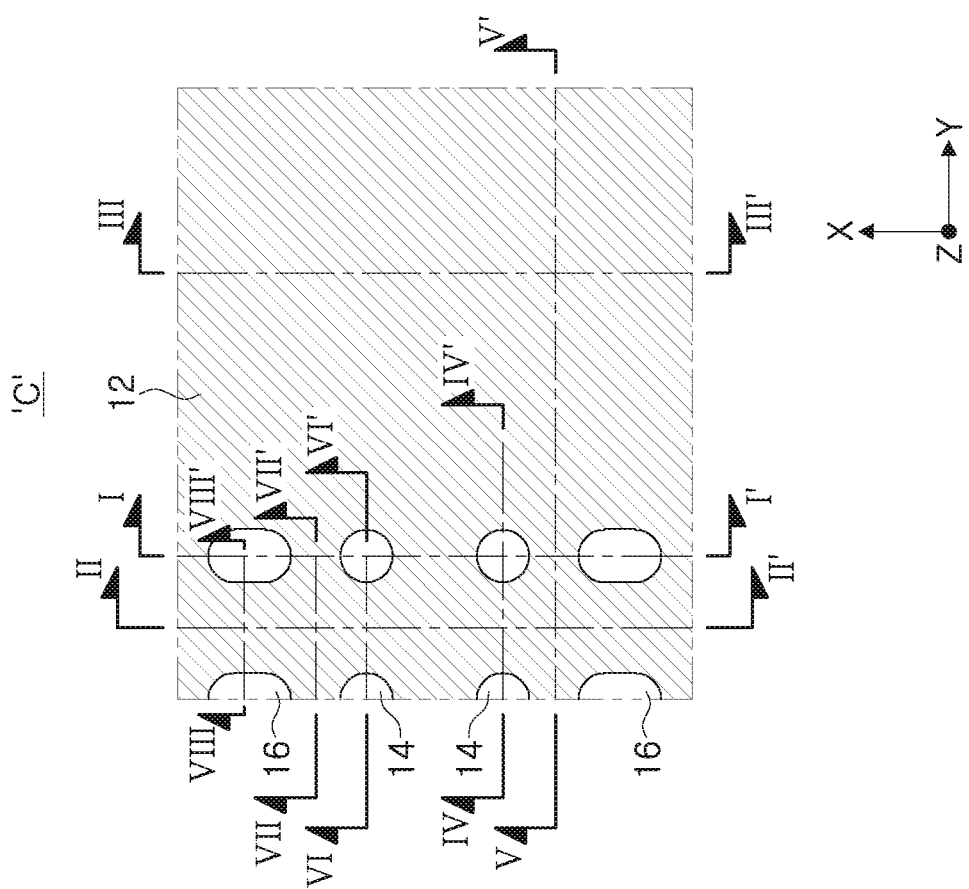
Figure 12A:
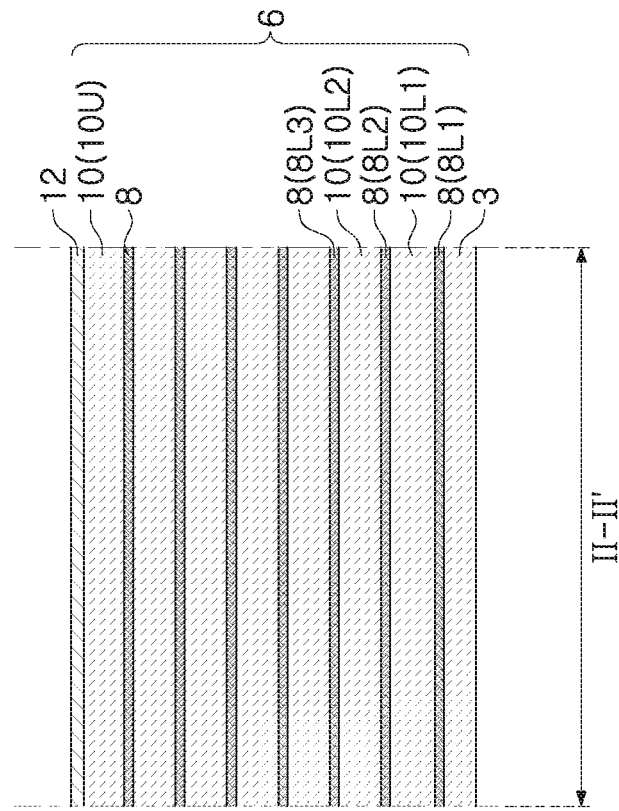
Figure 12A:
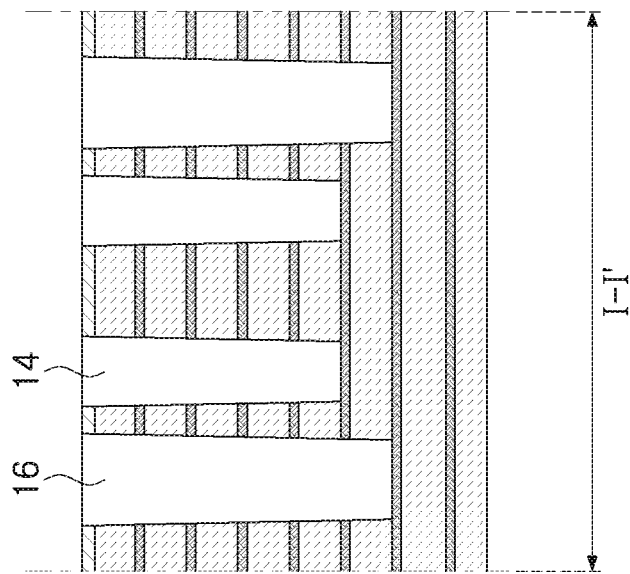
Figure 12B:
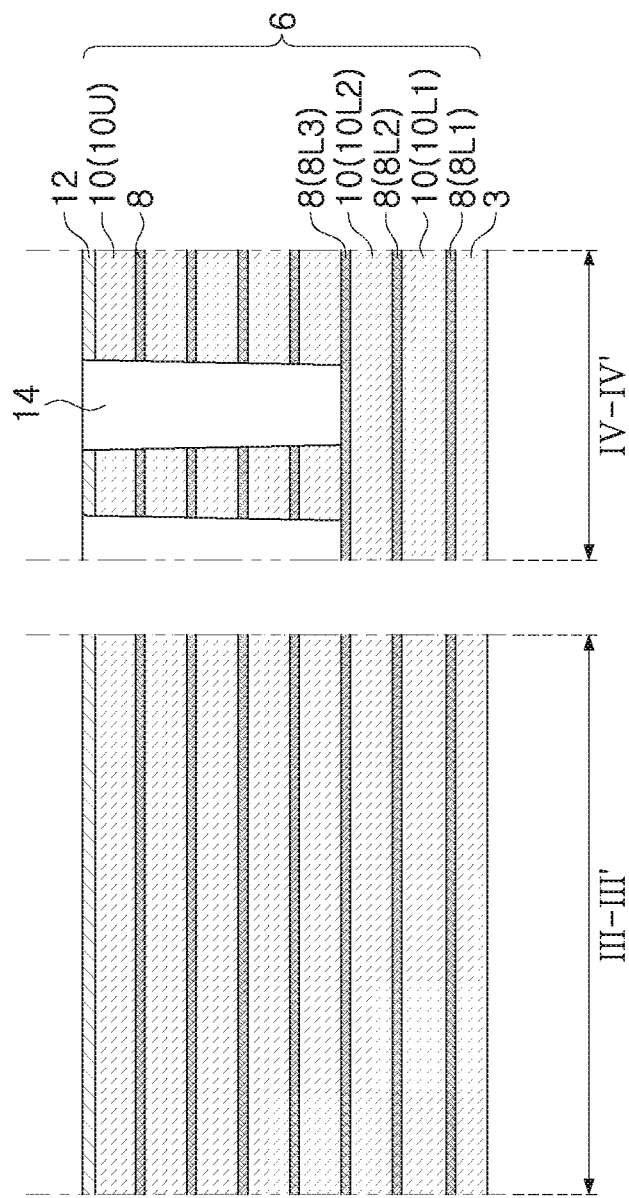
Figure 12C:
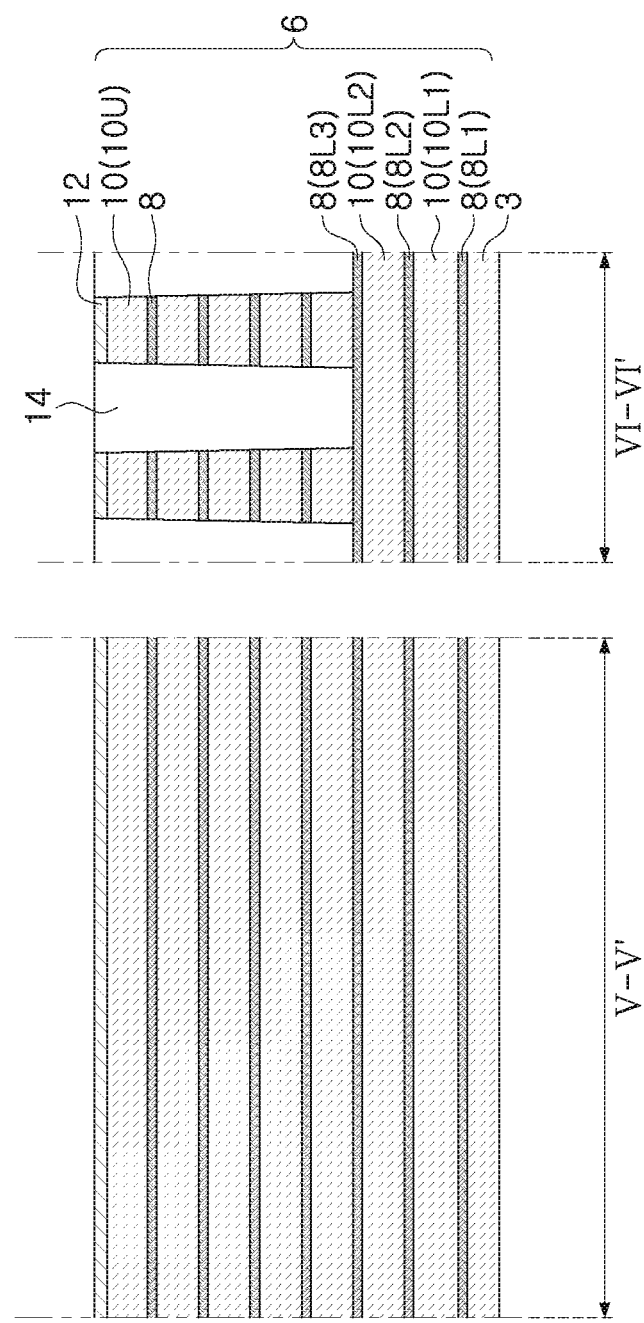
Figure 12D:
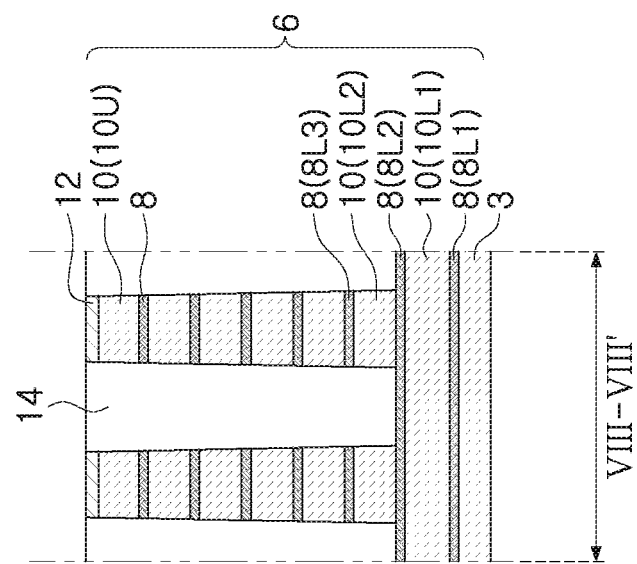
Figure 13:
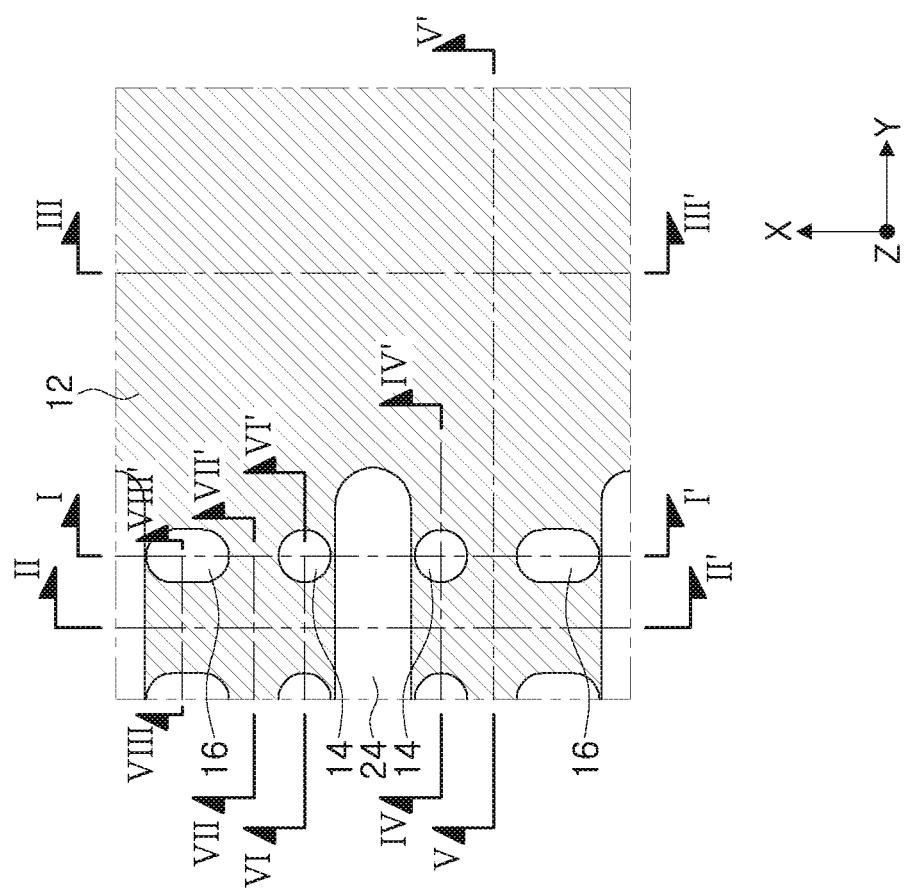
Figure 14A:
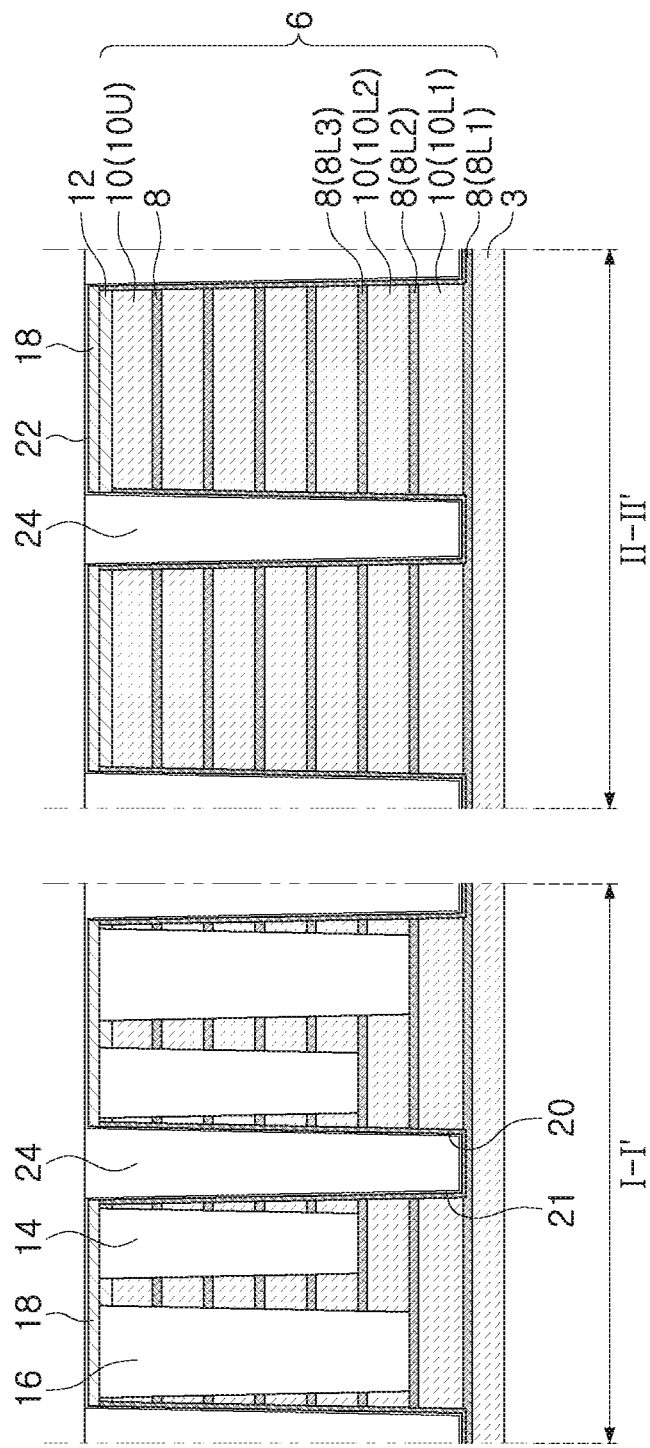
Figure 14B:
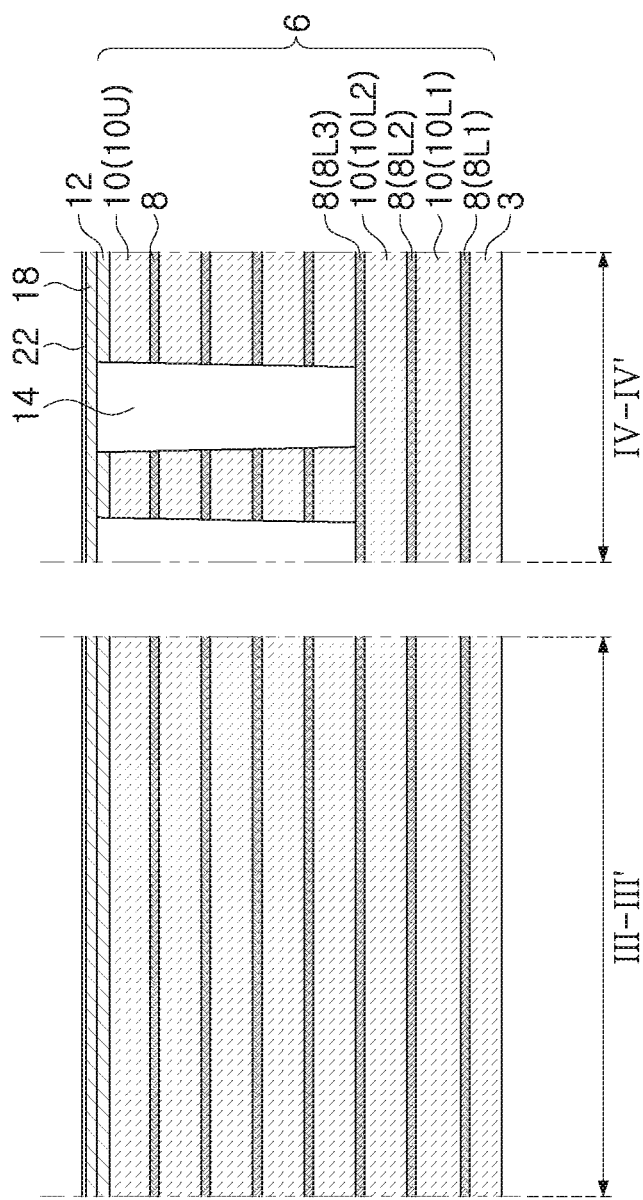
Figure 14C:
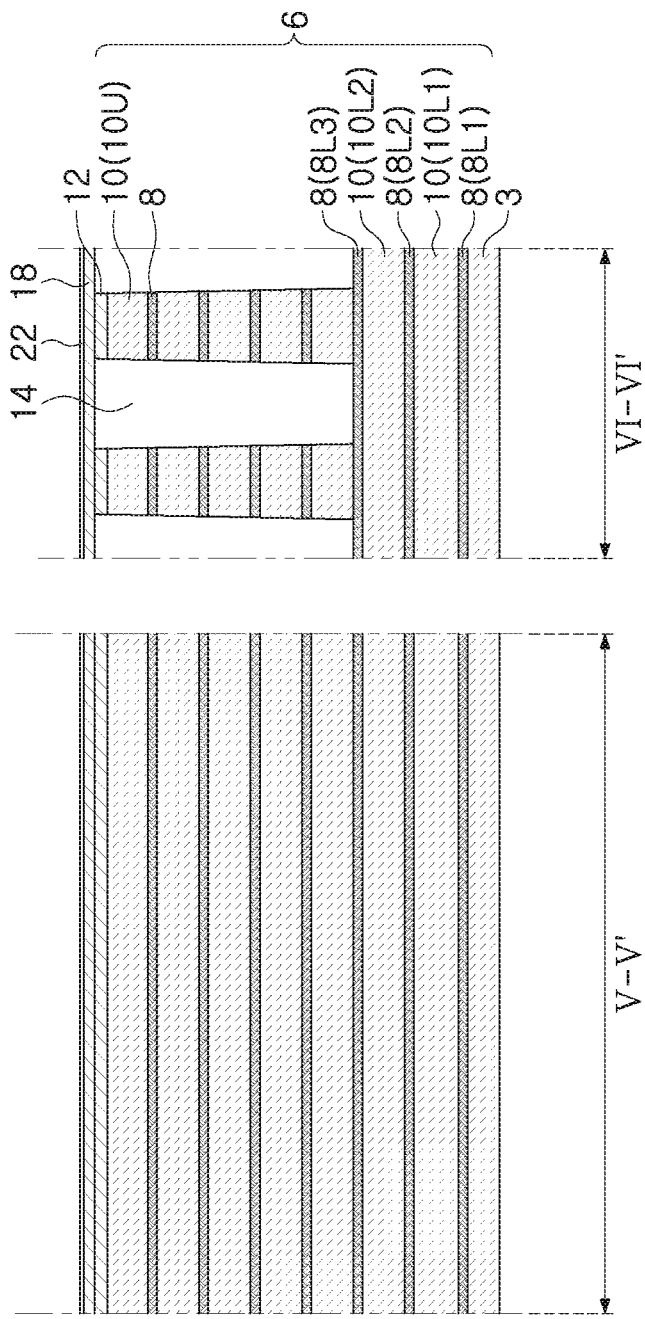
Figure 14D:
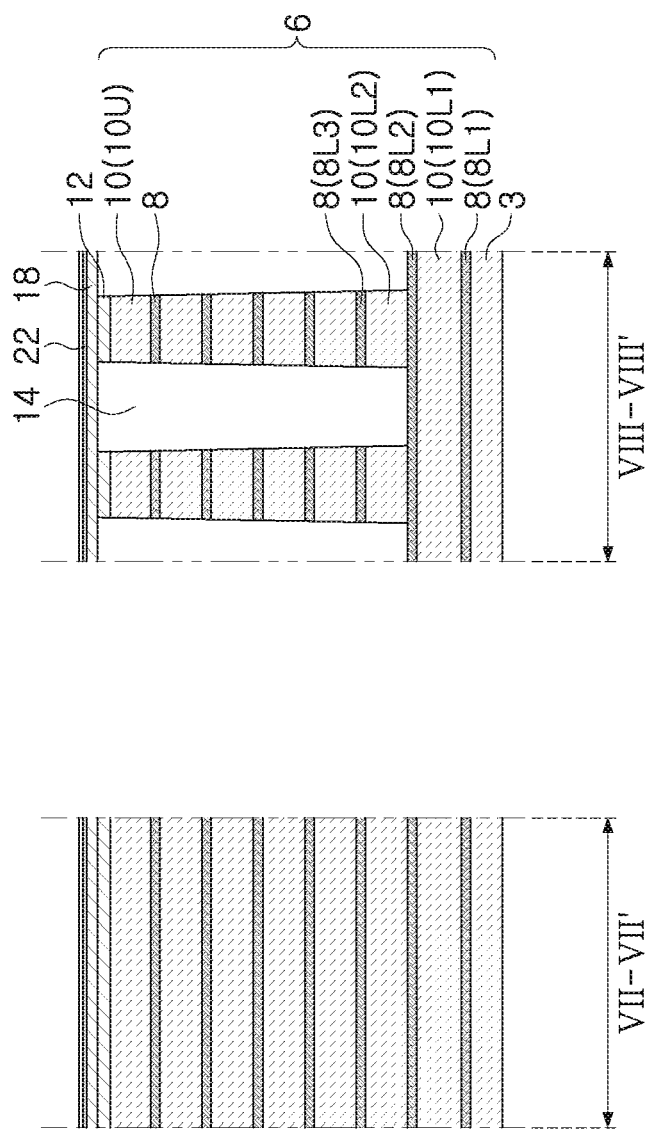
Figure 15:
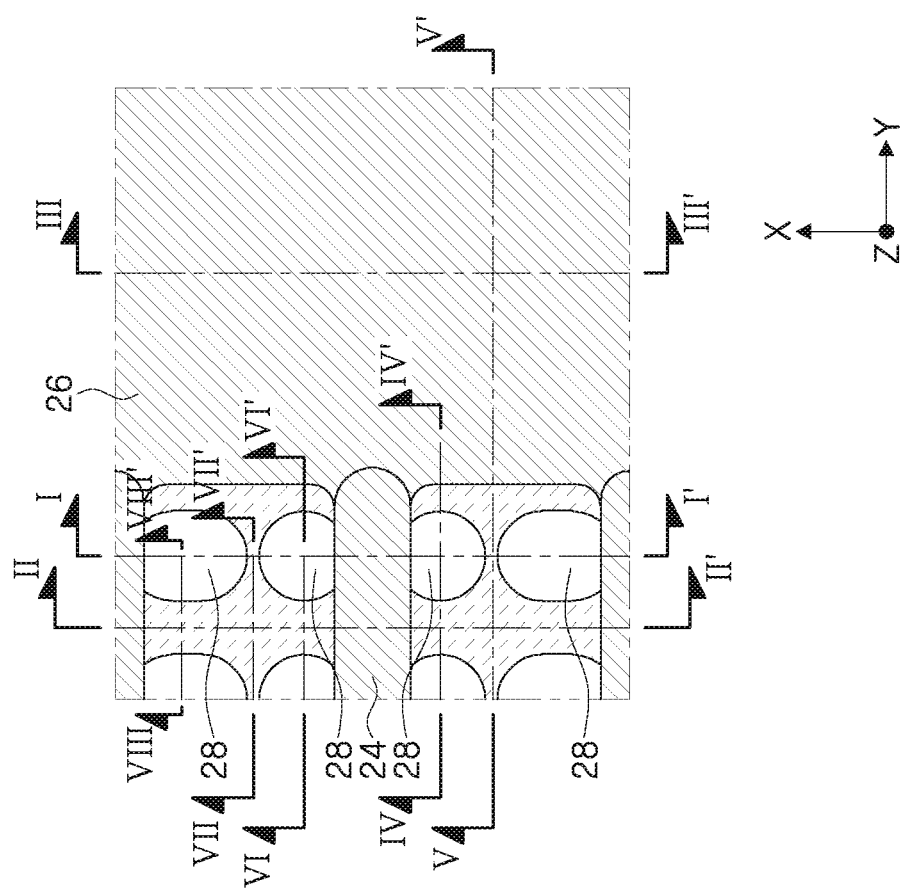
Figure 16A:
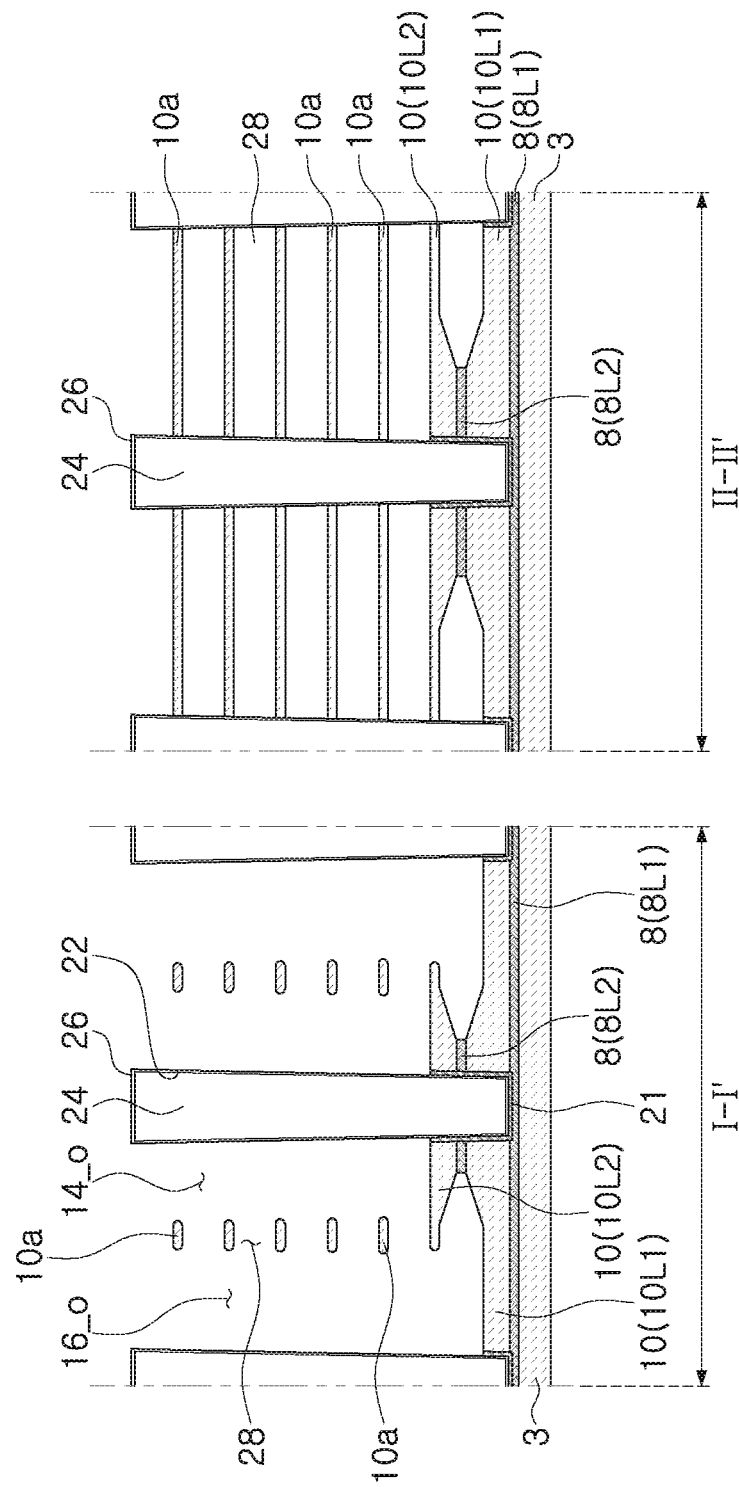
Figure 16B:
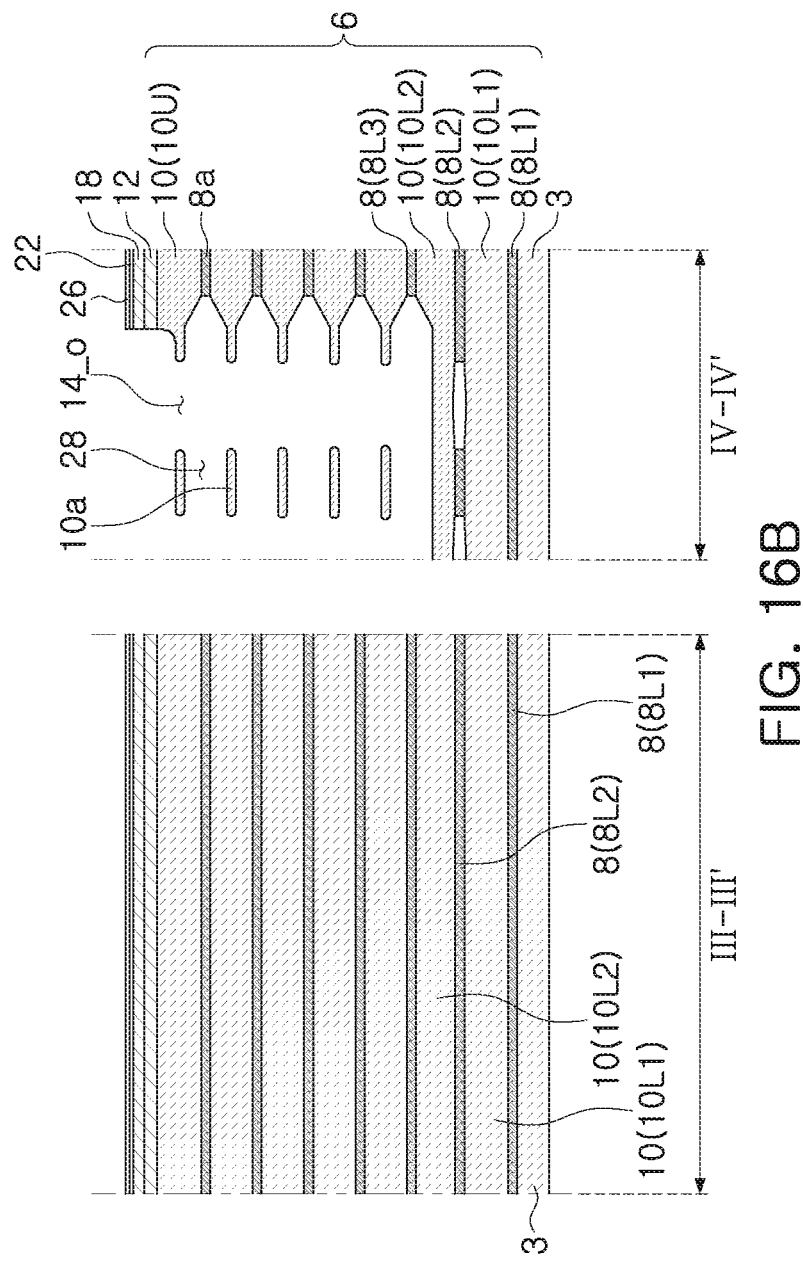
Figure 16D:
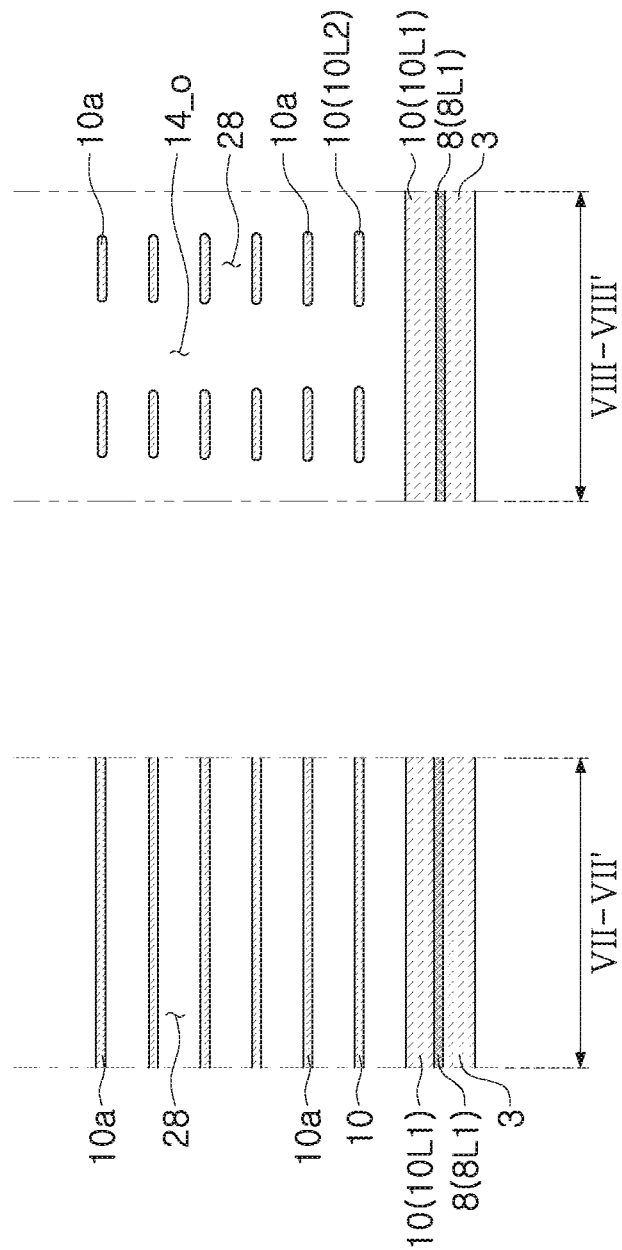
Figure 17A:
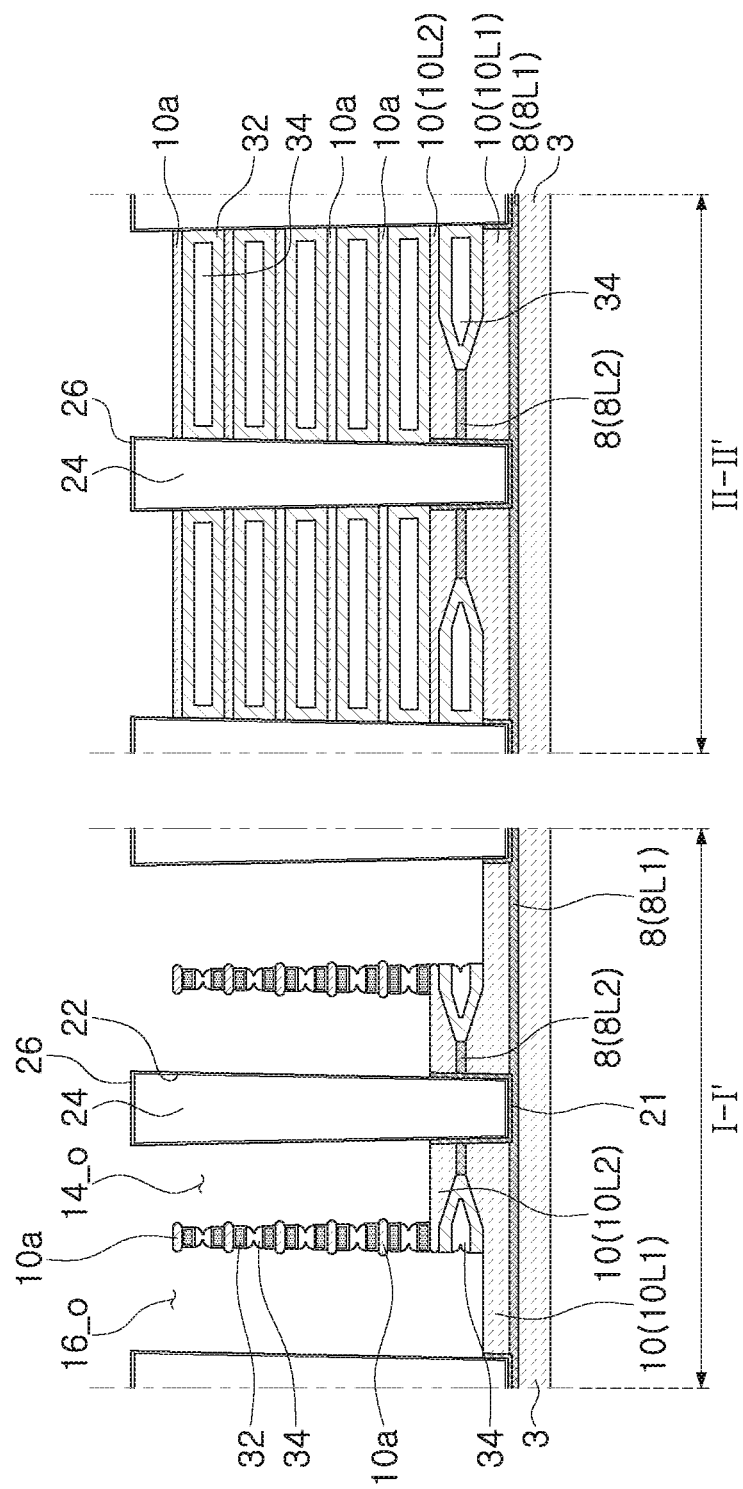
Figure 17B:
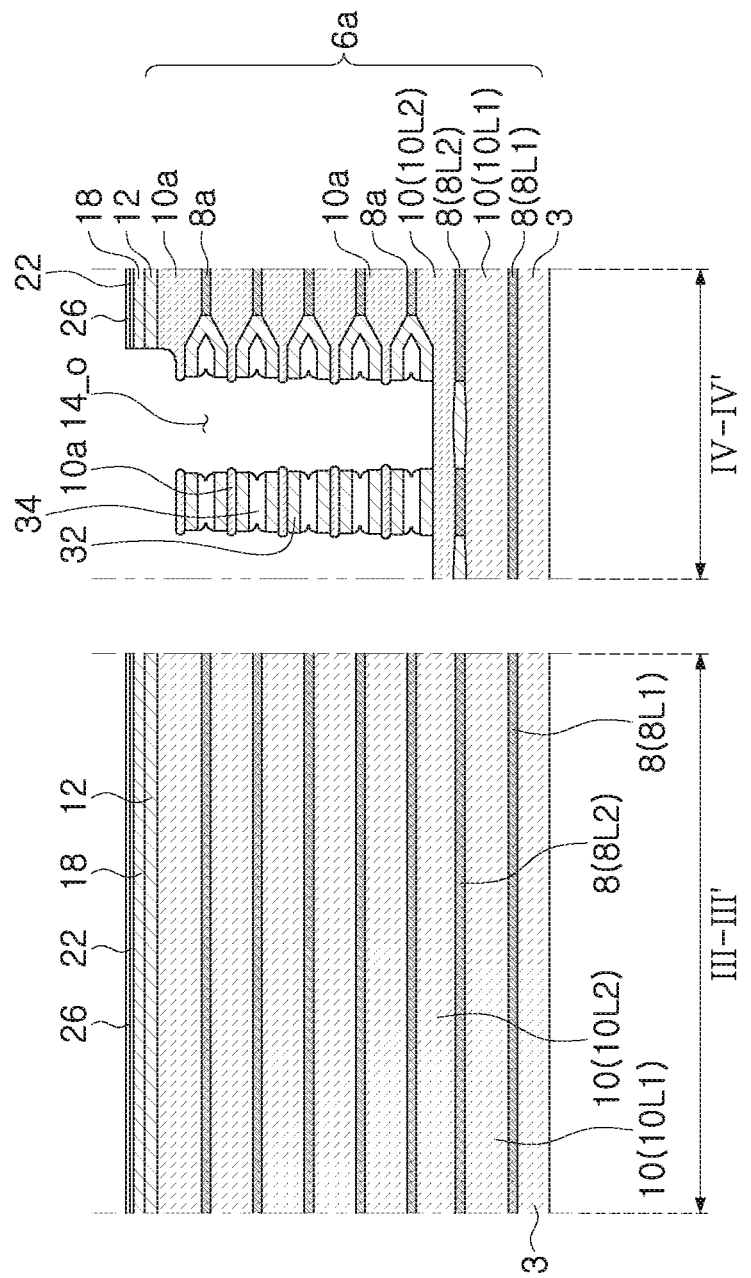
Figure 17C:
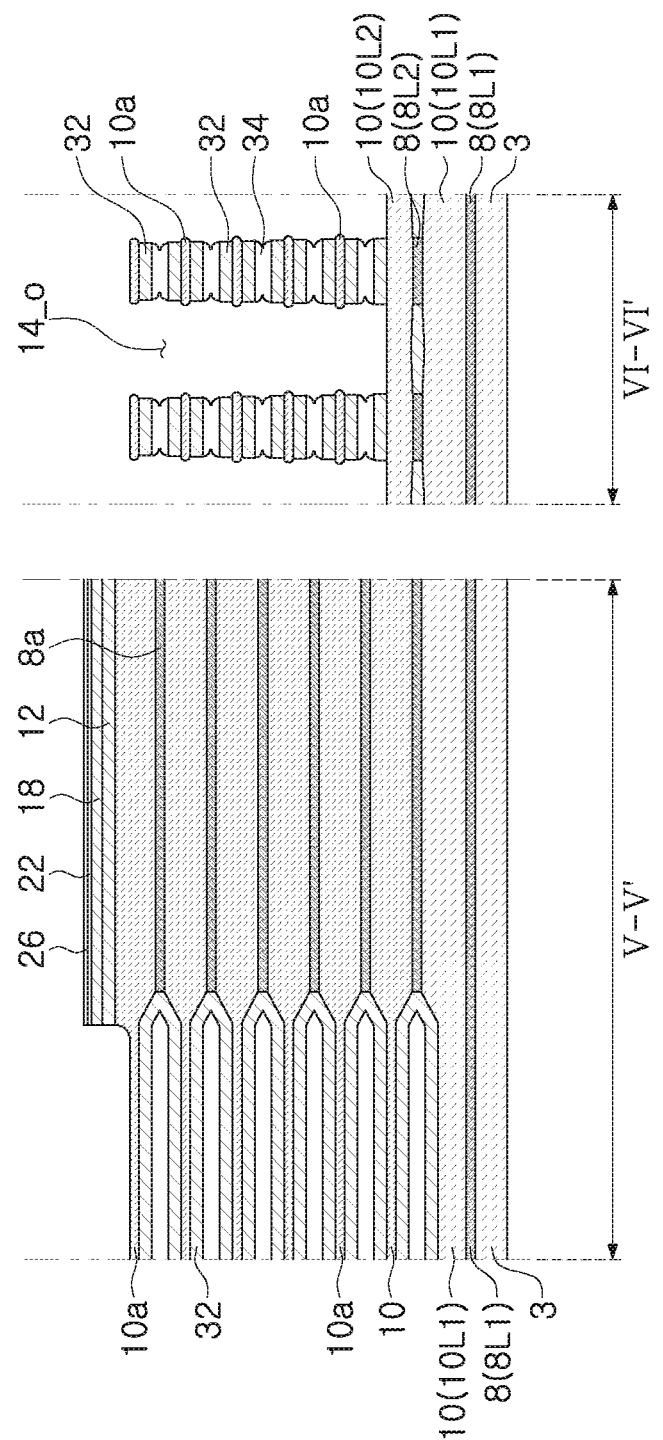
Figure 17D:
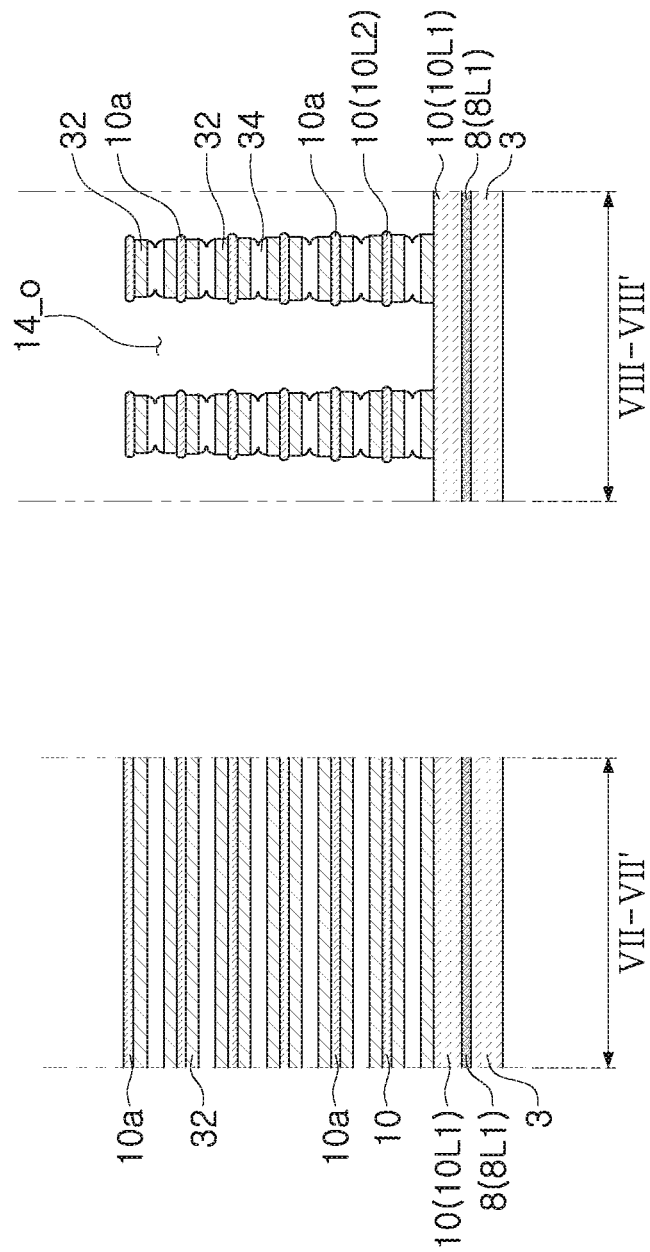
Figure 18:
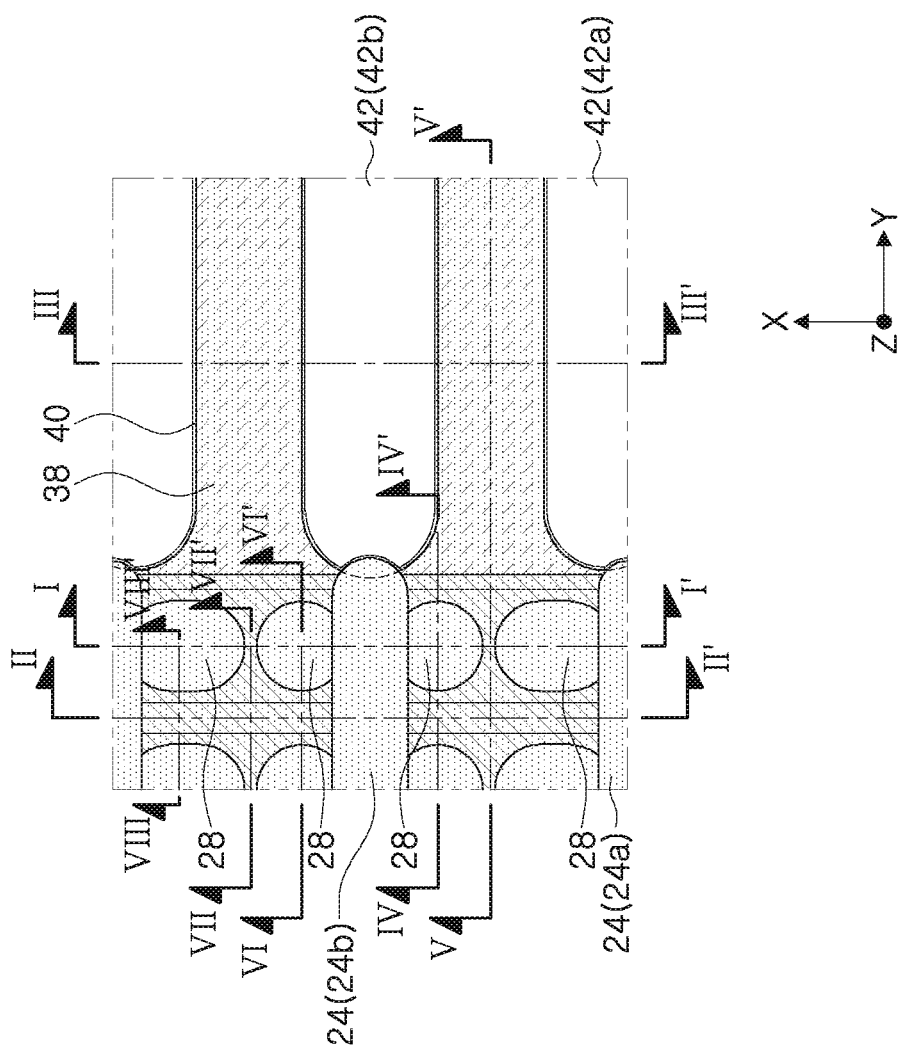
Figure 19A:
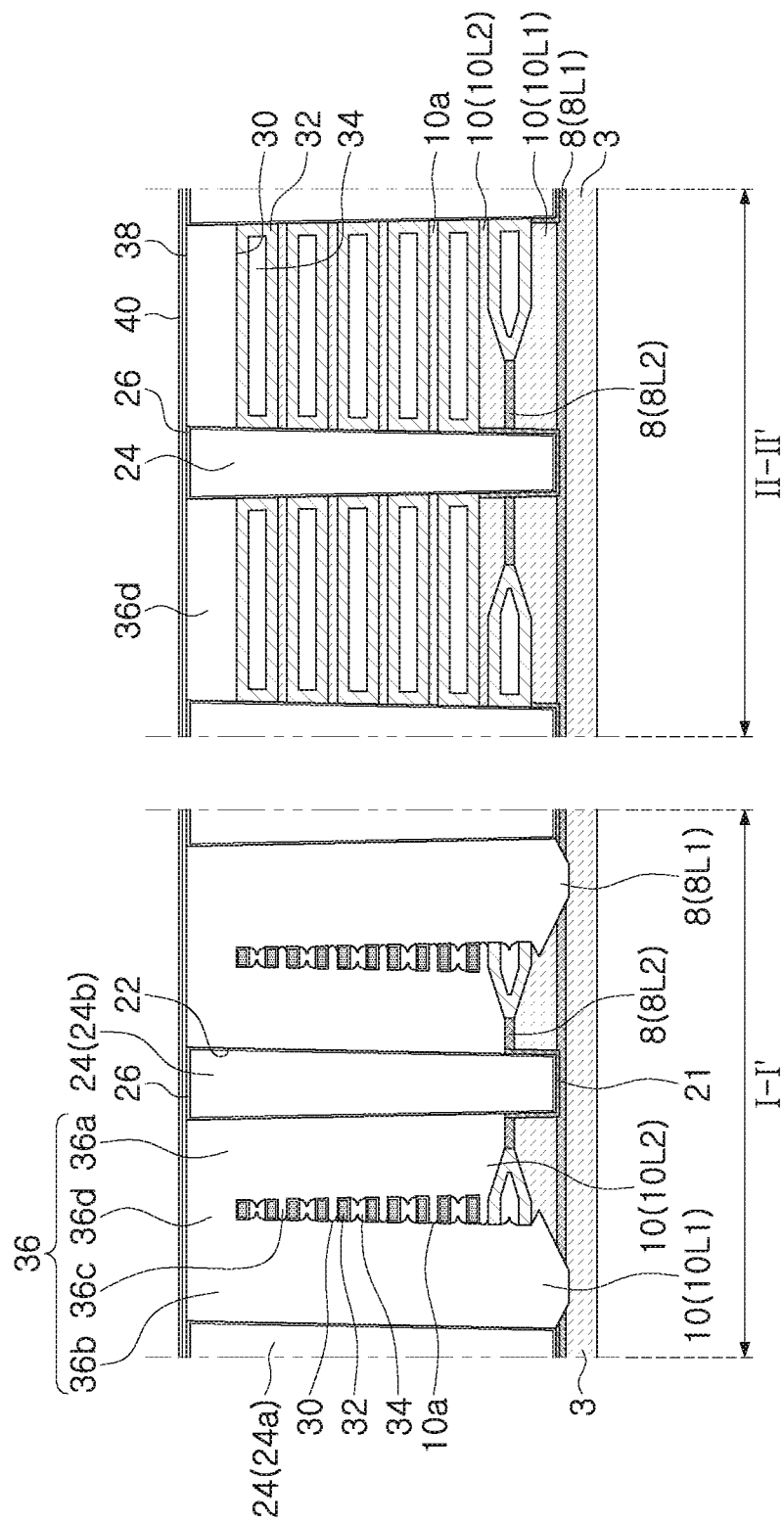
Figure 19B:
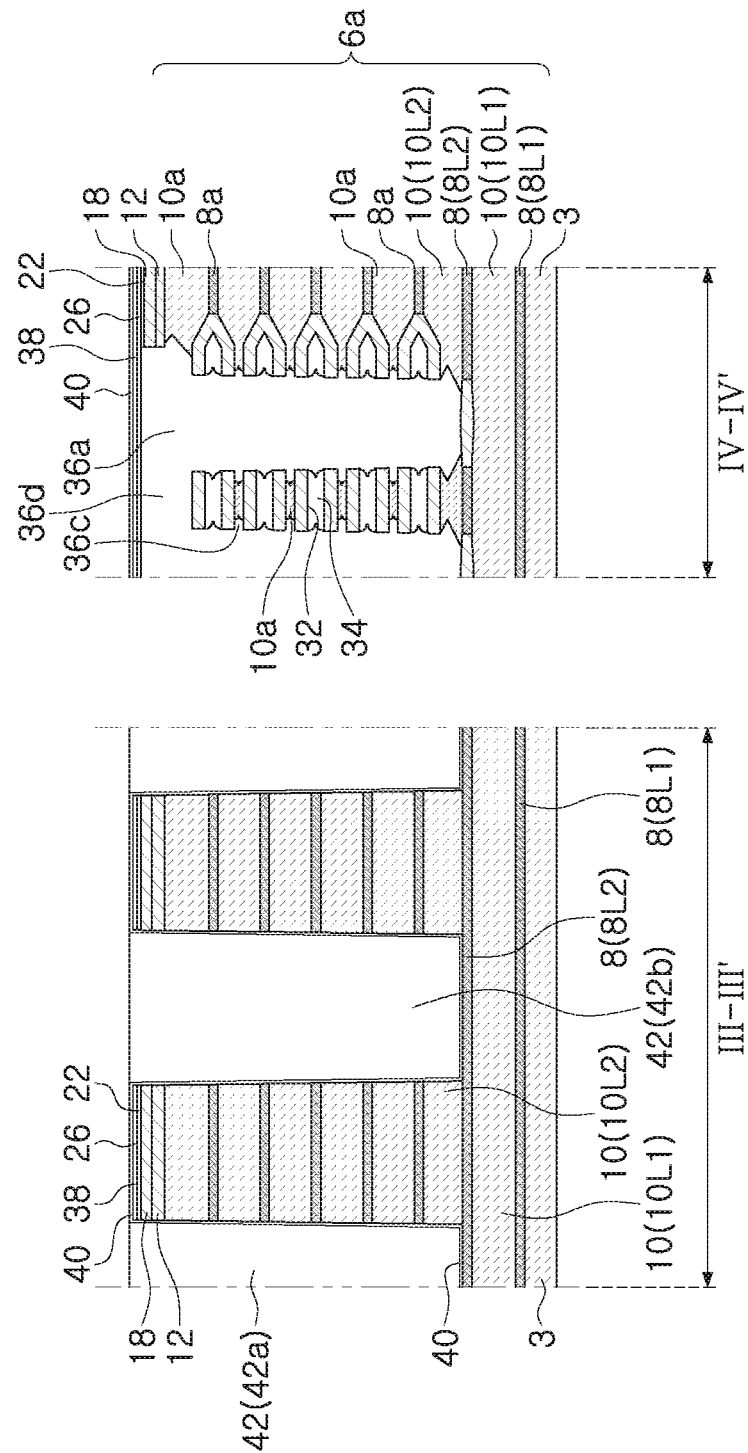
Figure 19C:
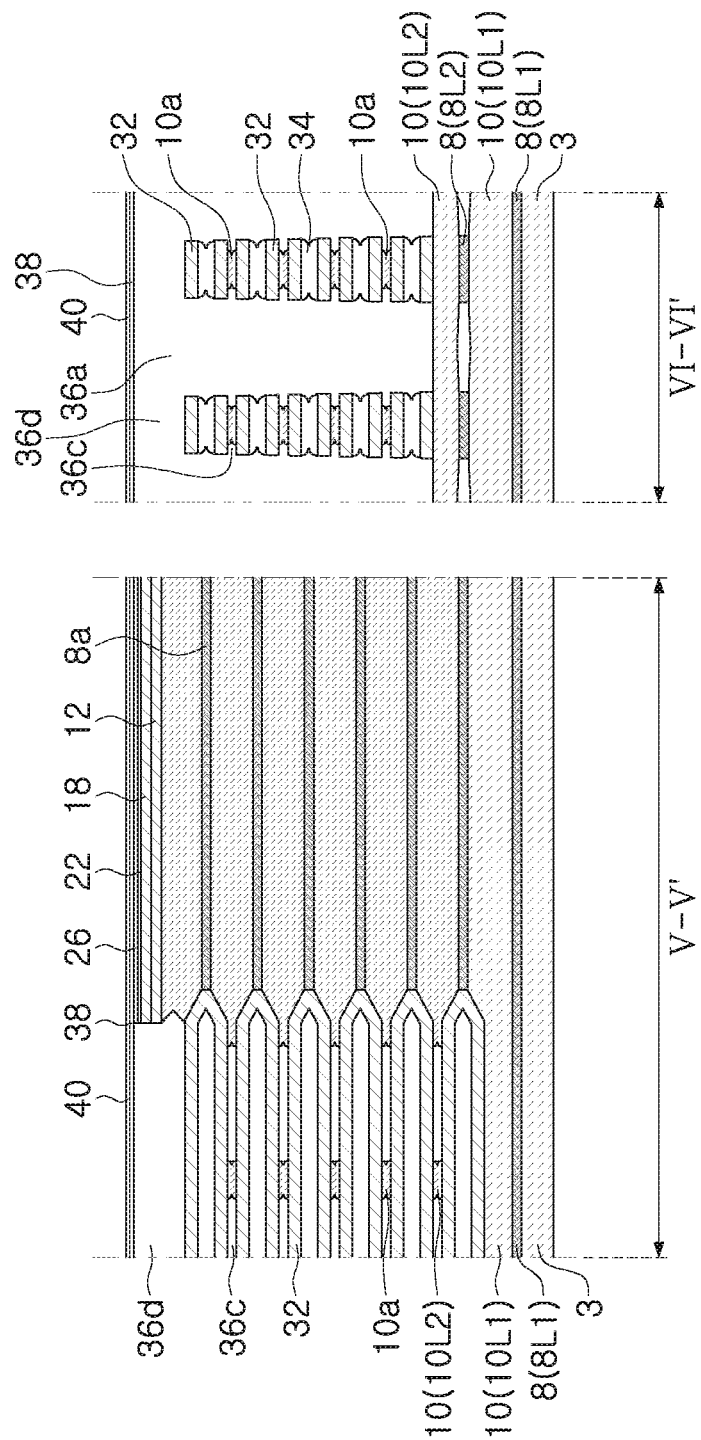
Figure 19D:
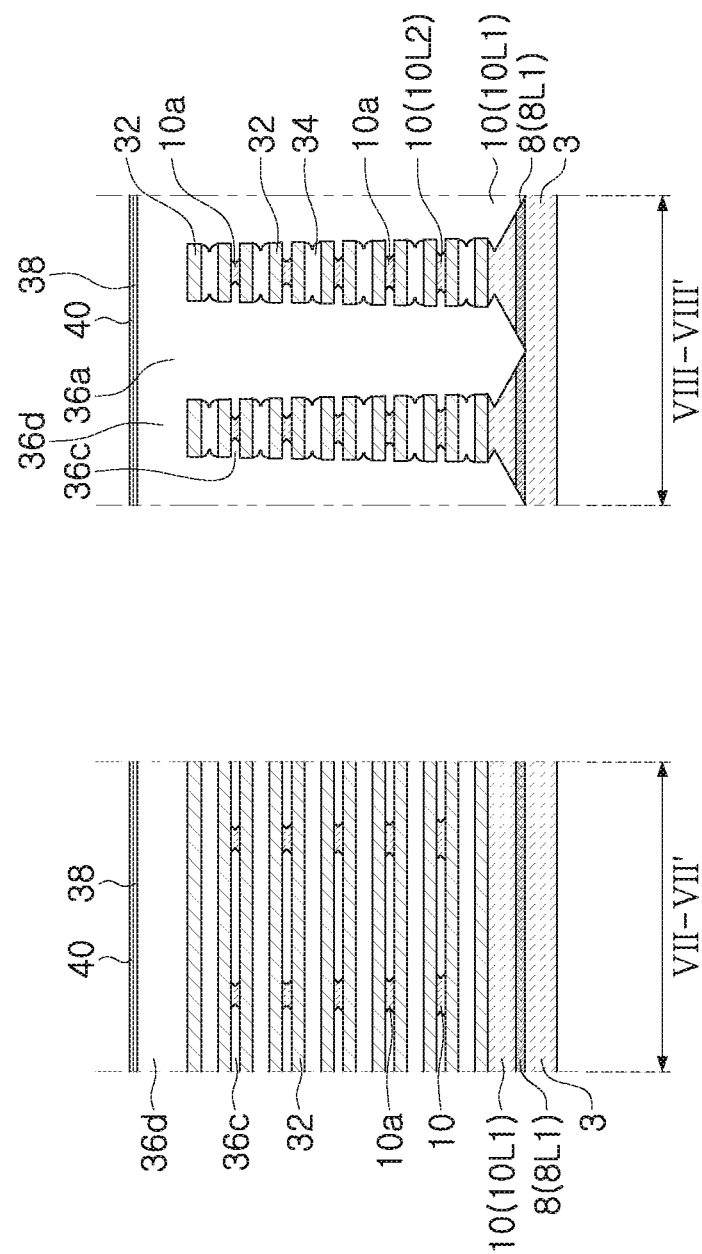
Figure 20:
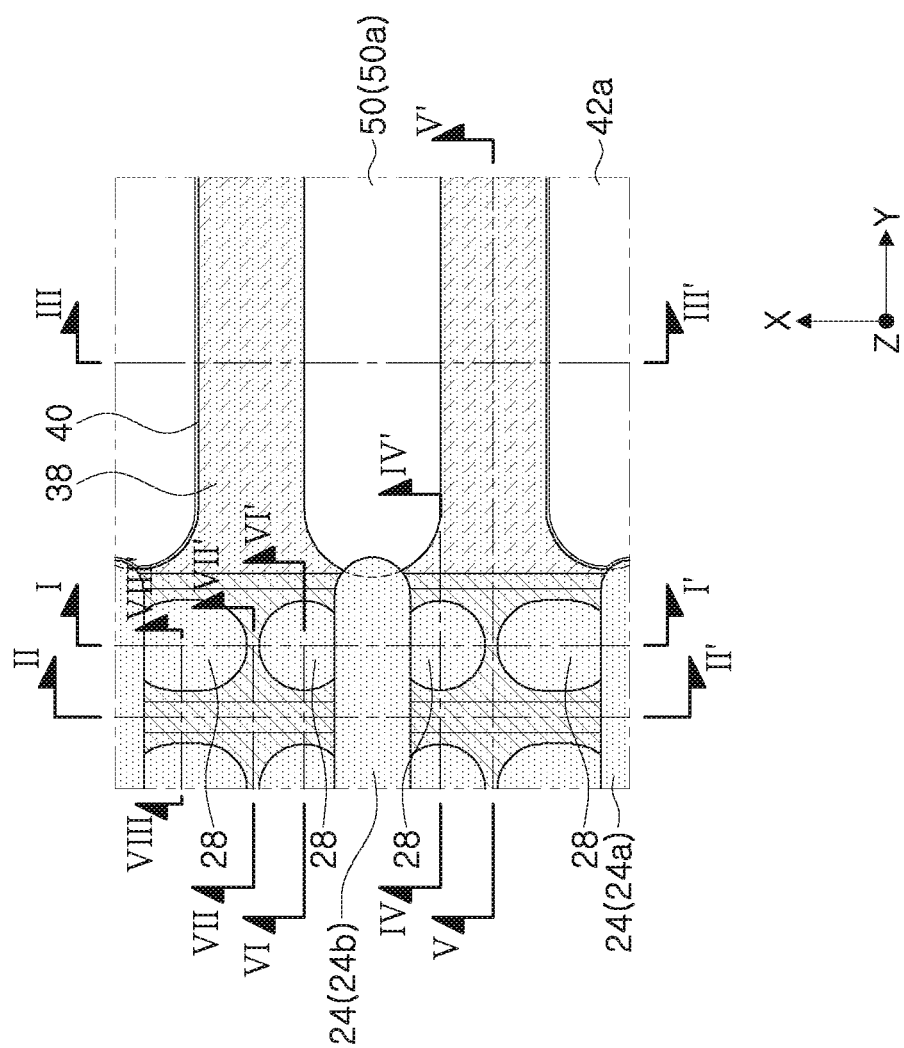
Figure 21A:
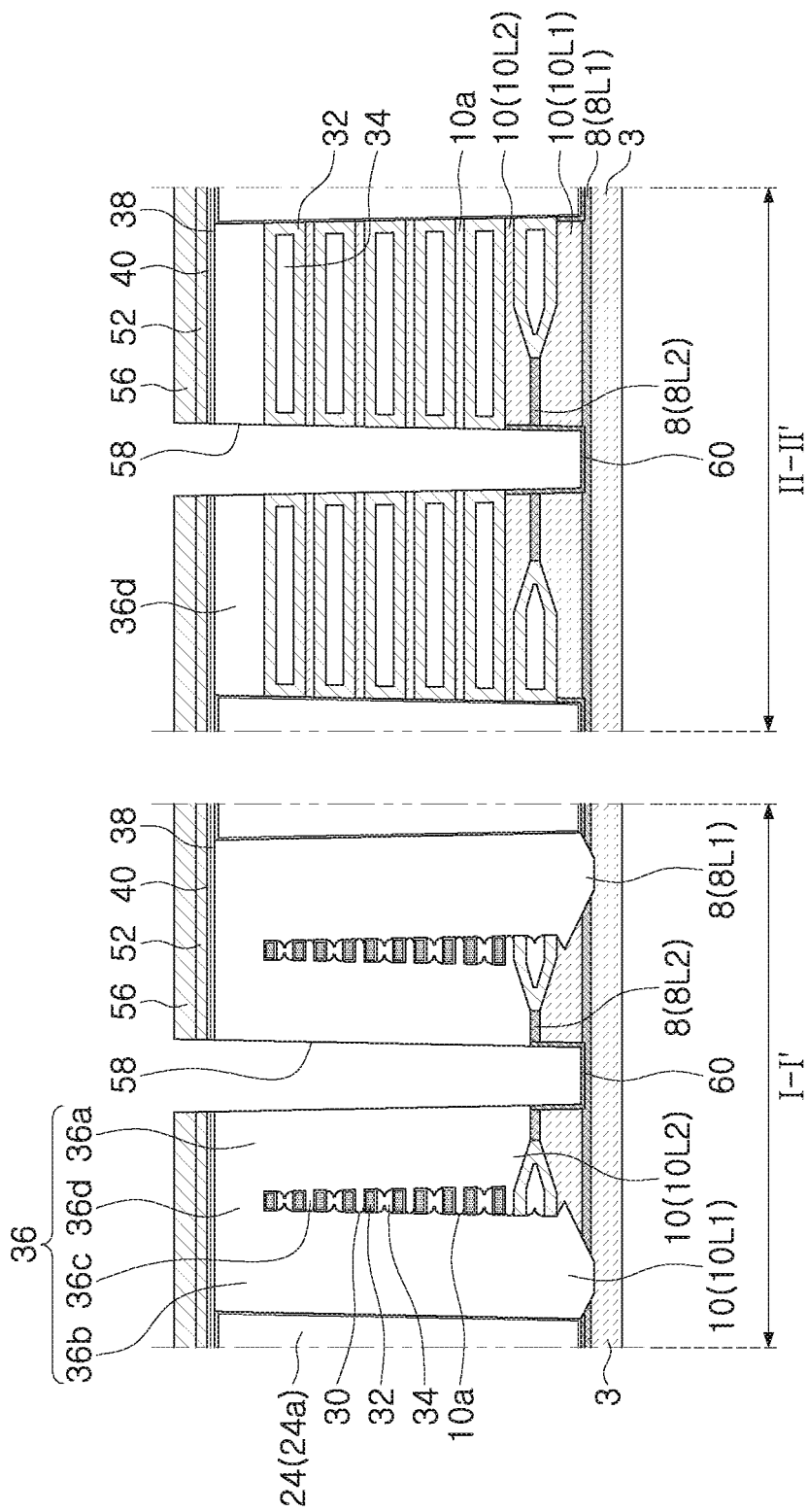
Figure 21B:
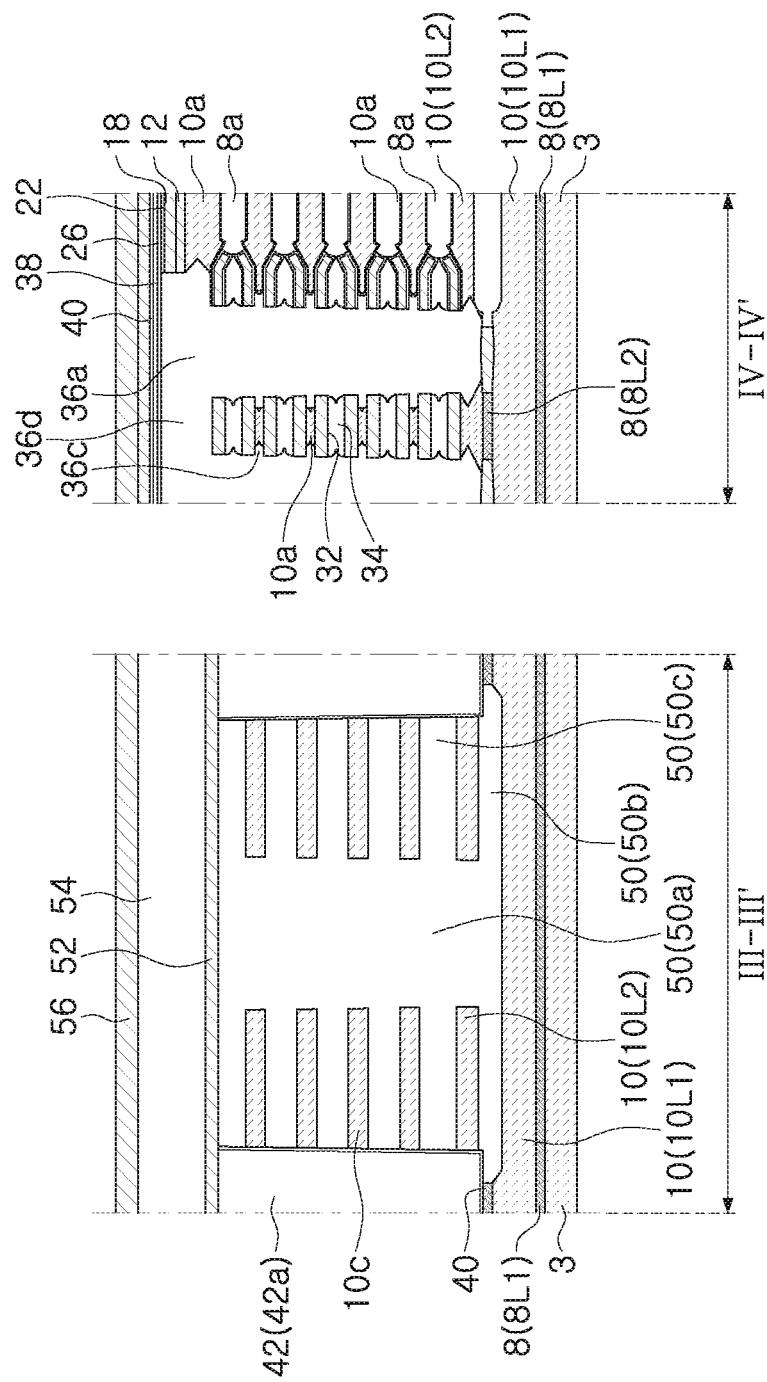
Figure 21C:
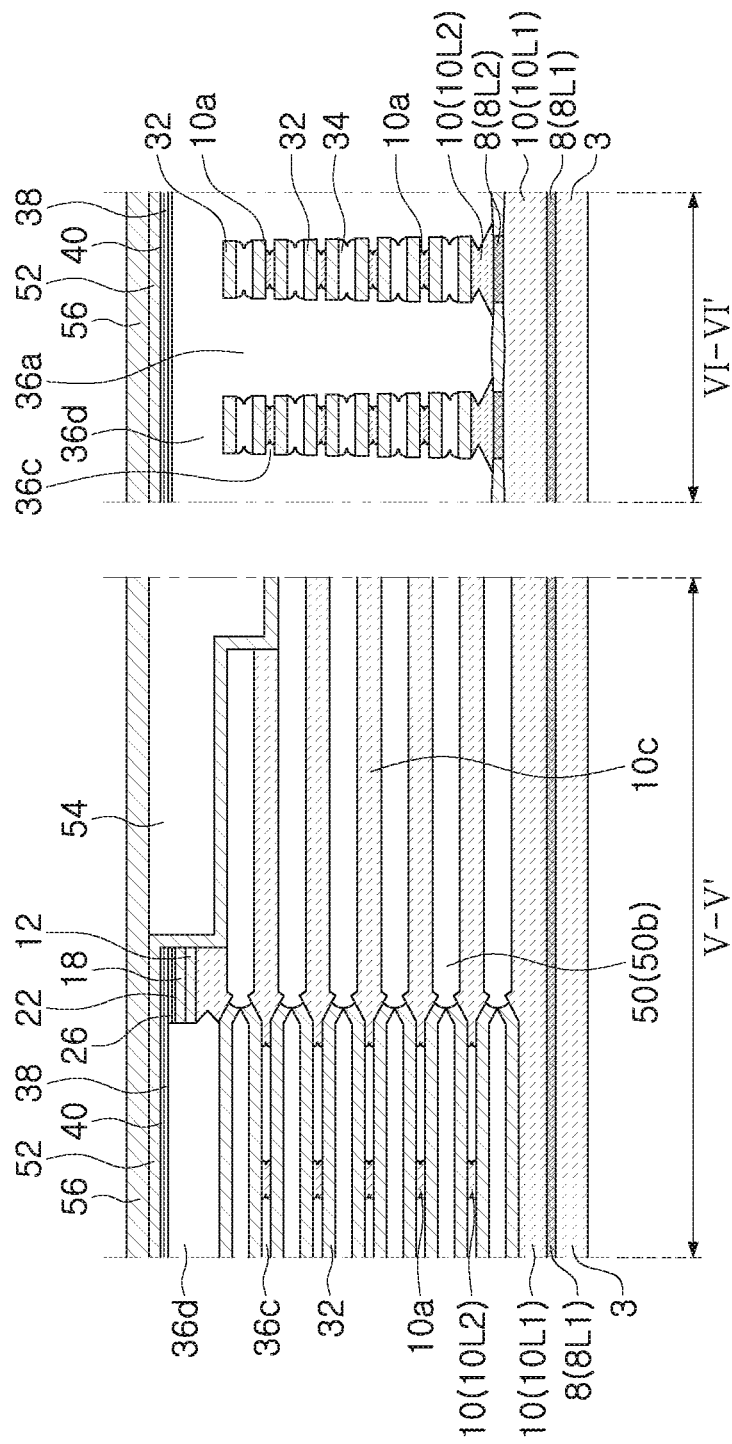
Figure 21D:
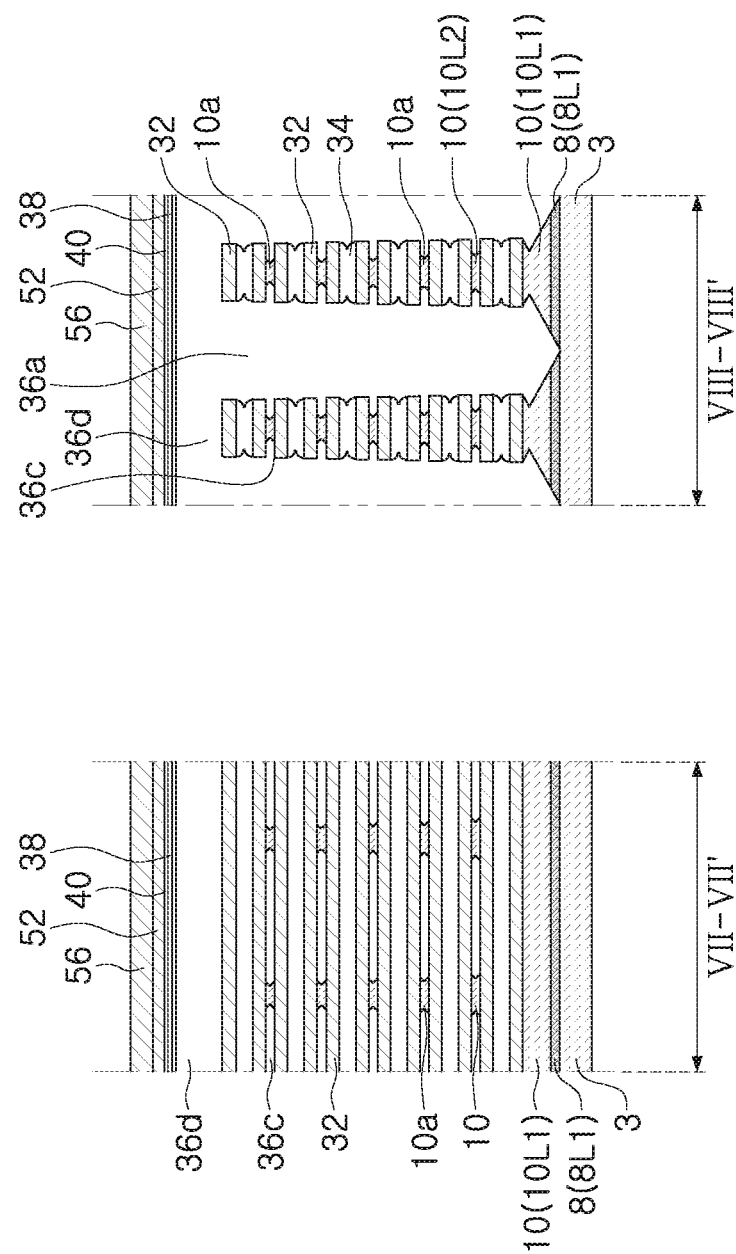
Figure 22:
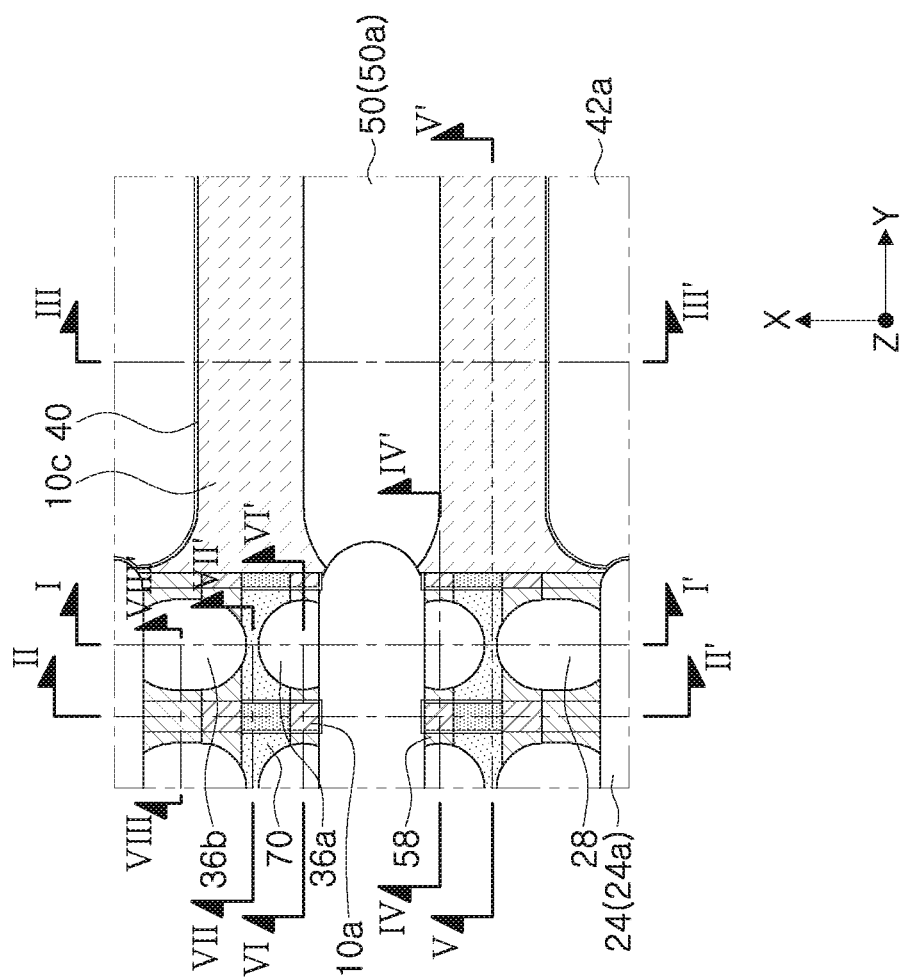
Figure 23A:
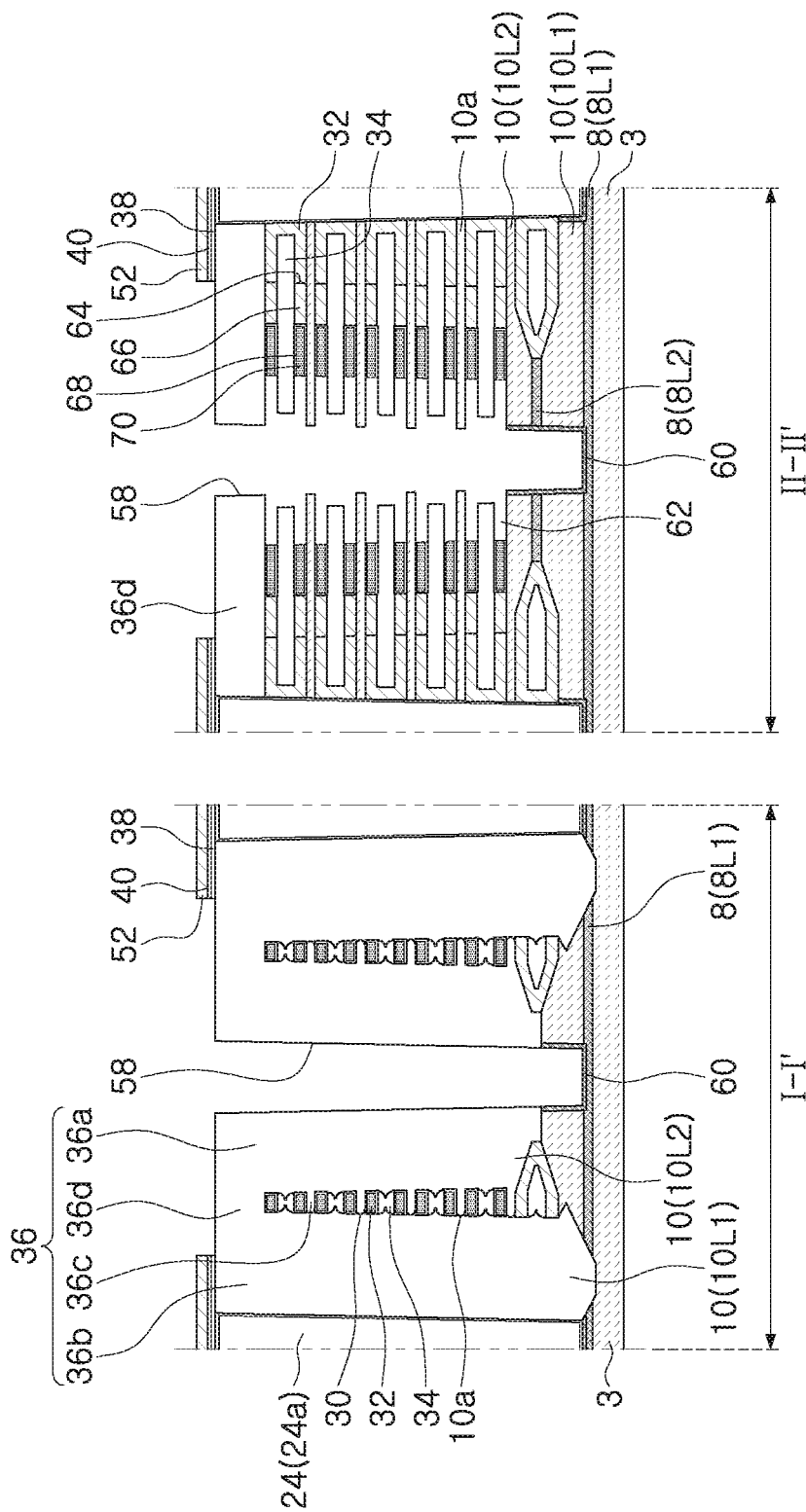
Figure 23B:
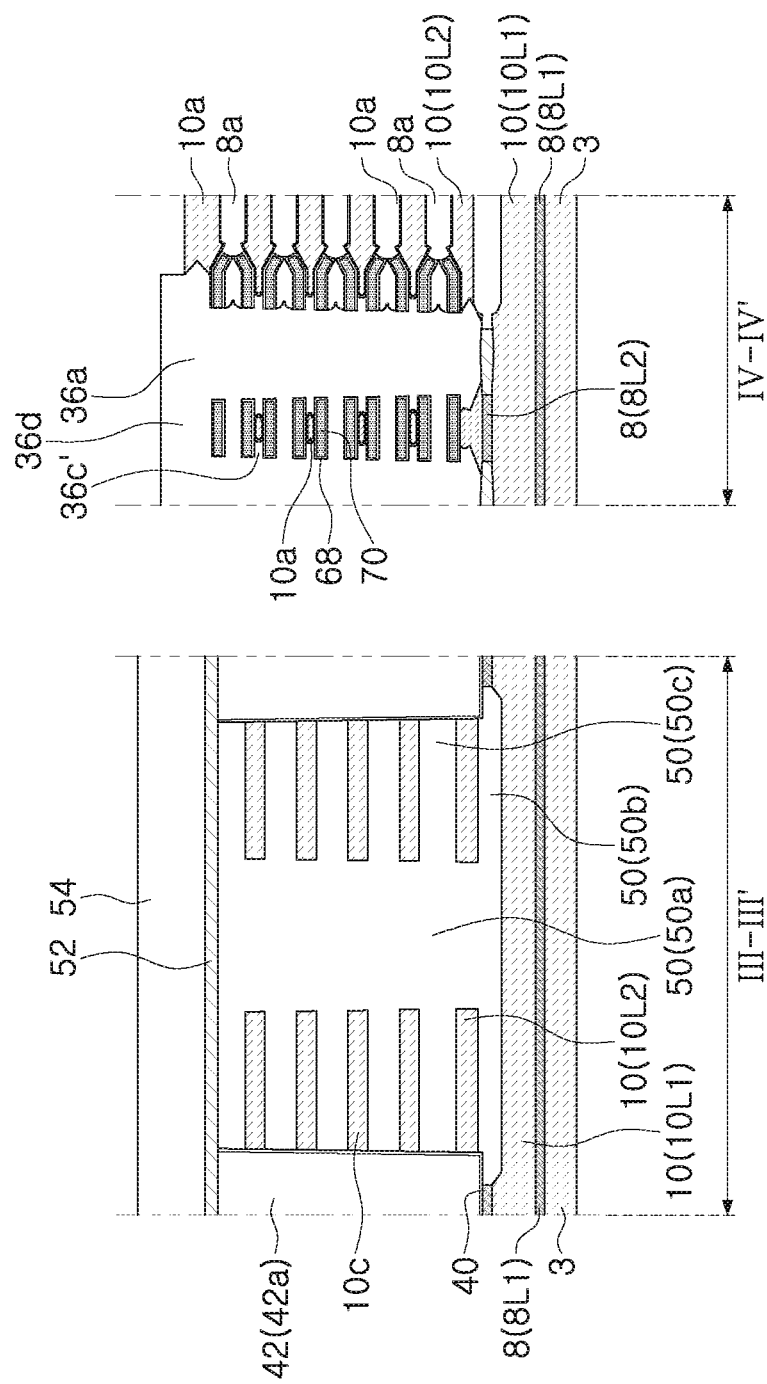
Figure 23C:
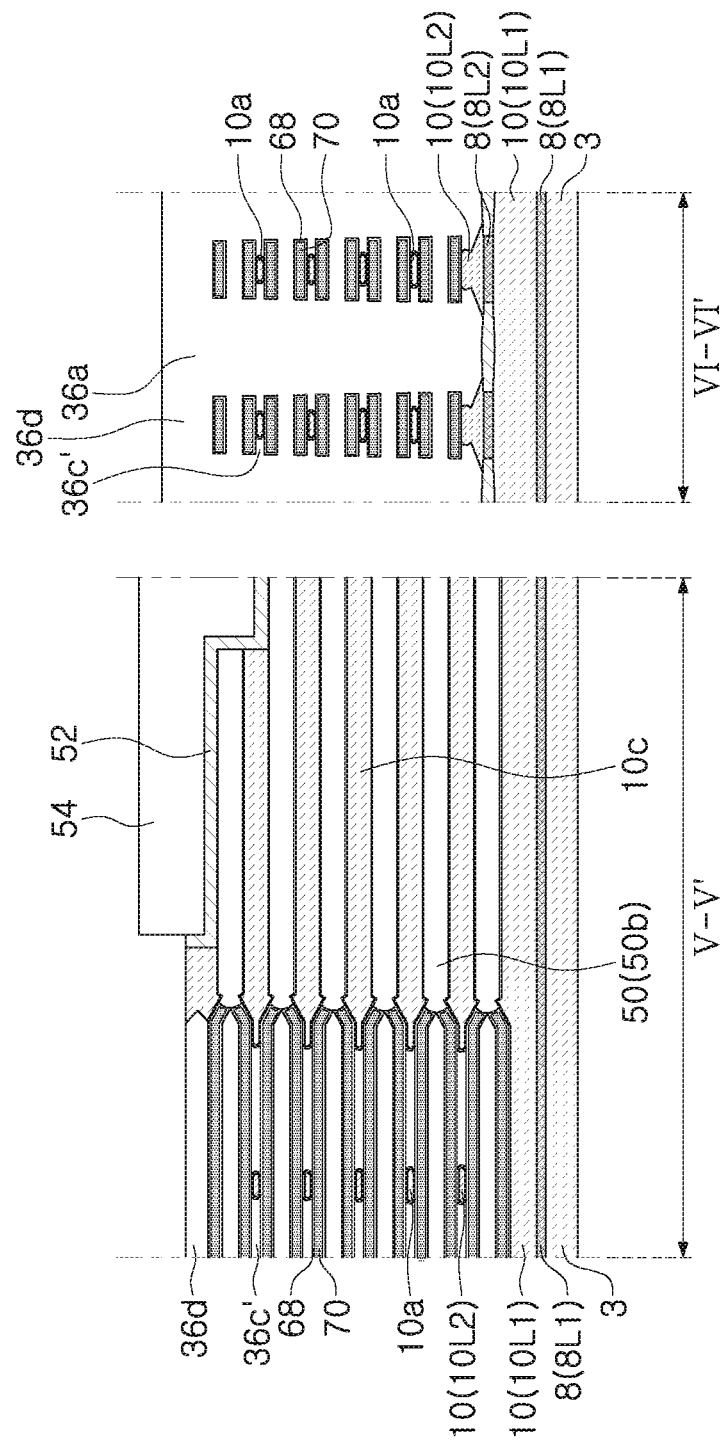
Figure 23D:
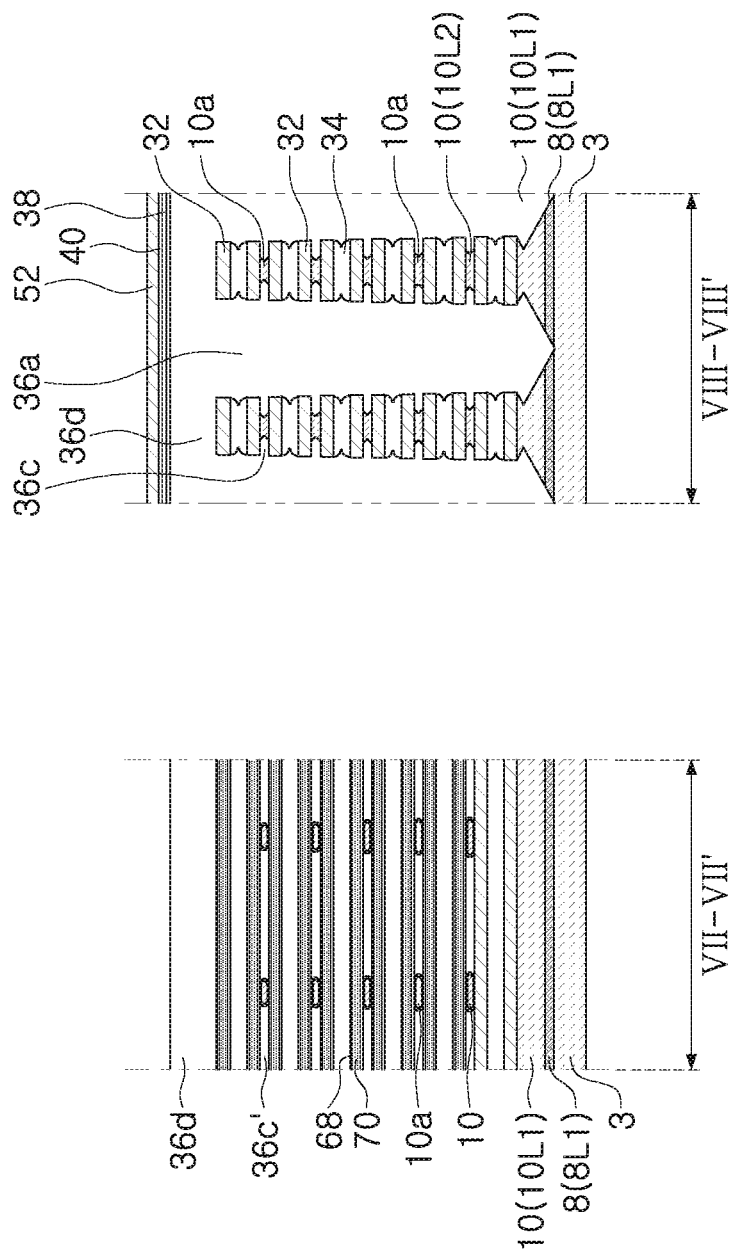
Figure 24:
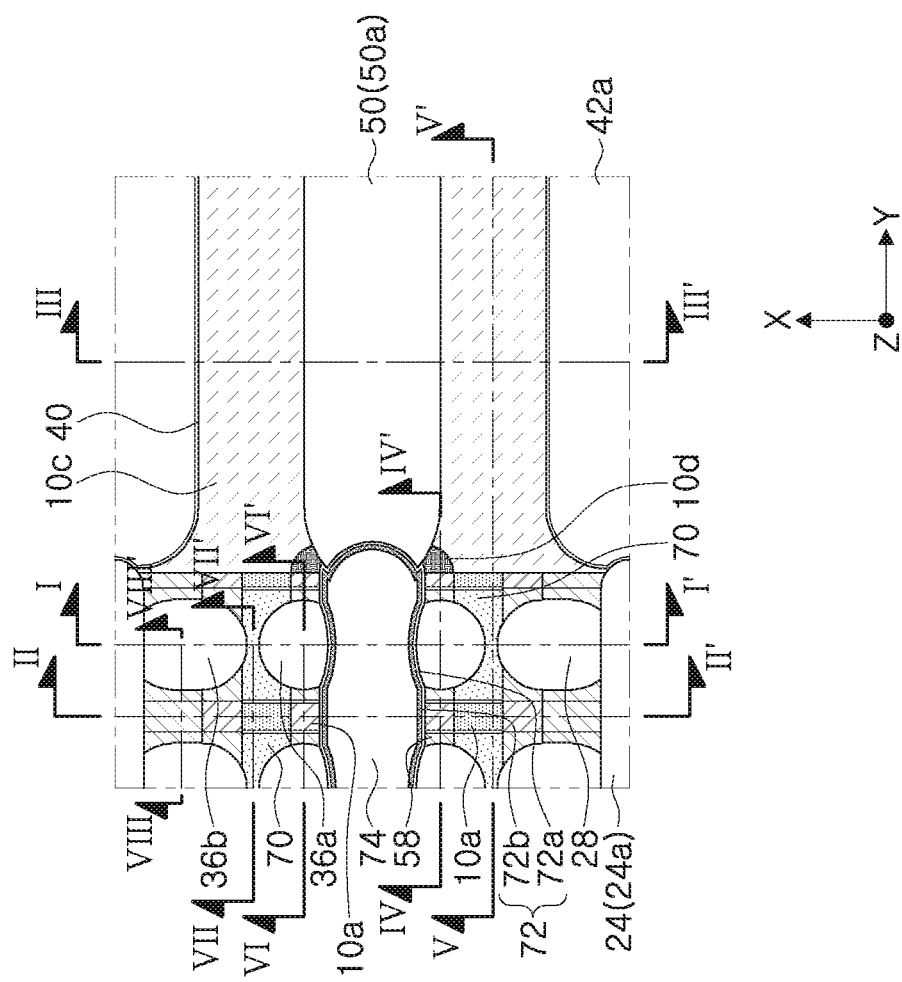
Figure 25A:
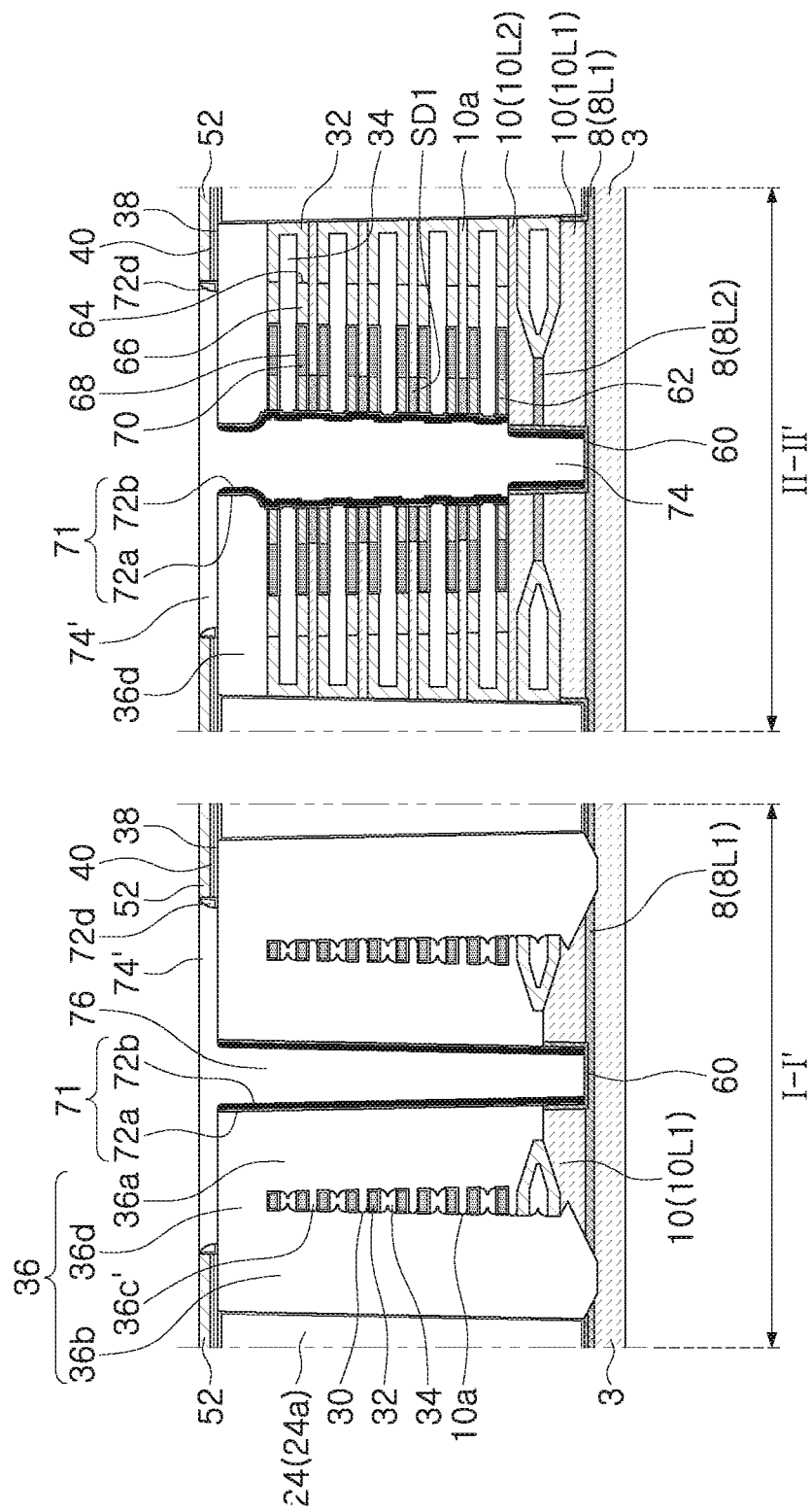
Figure 25B:
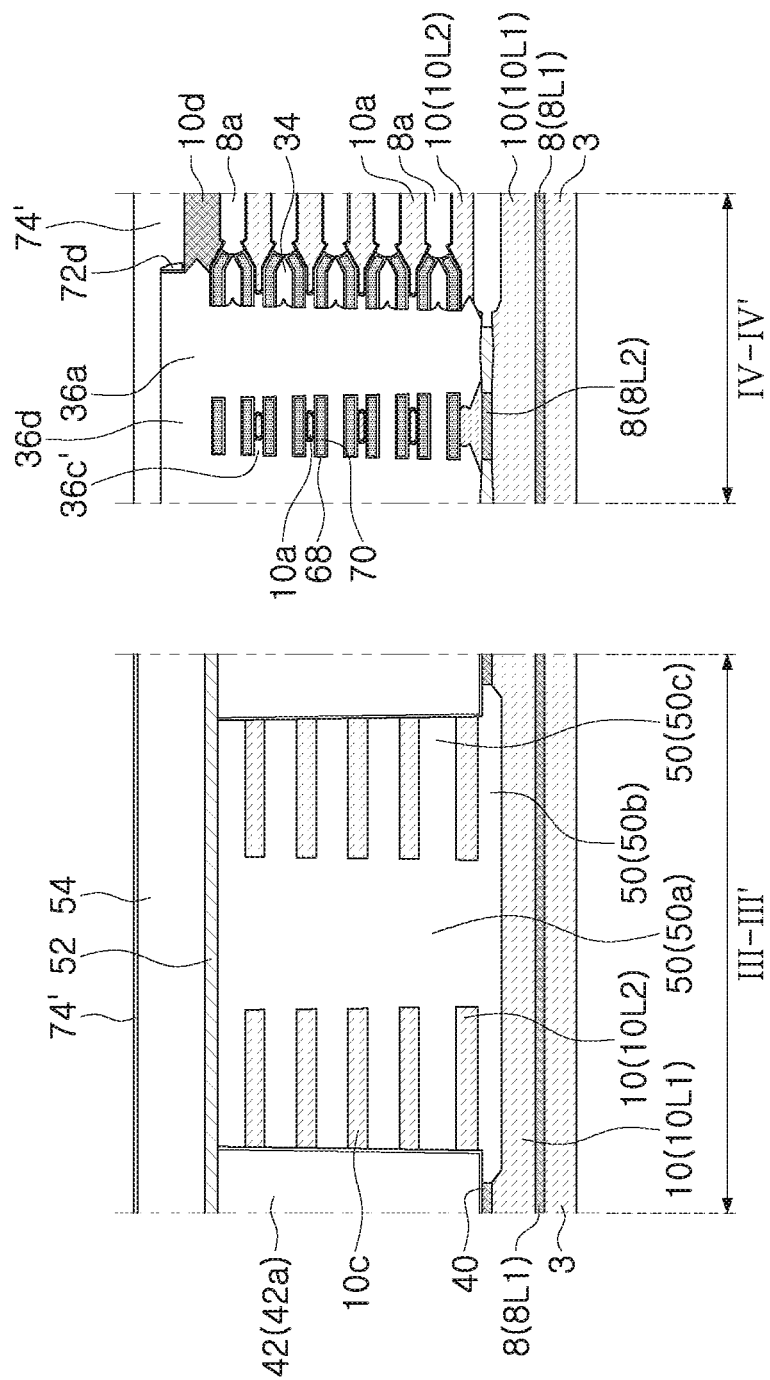
Figure 25C:
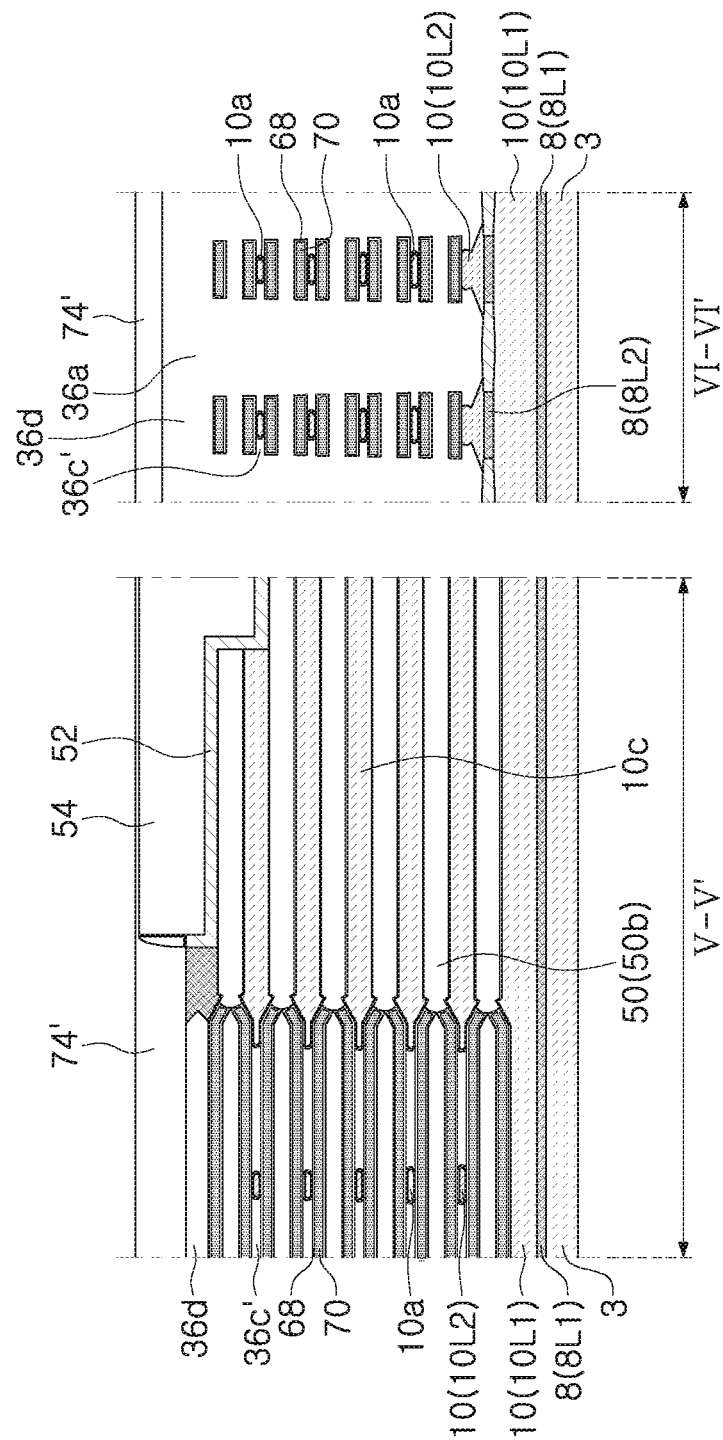
Figure 25D:
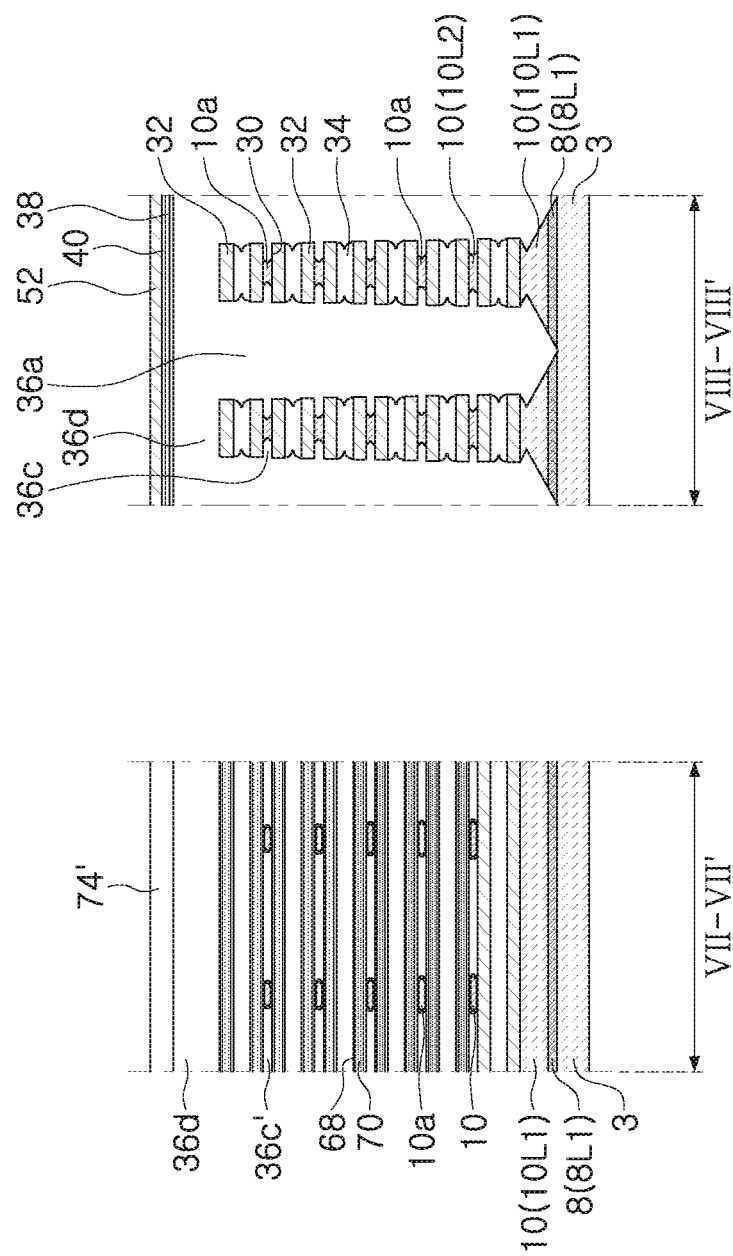

In a modification, referring to FIGS. 9 and 10, the semiconductor device 1 may further include pad patterns 310 passing through the insulating layers 82 and 94 and being in contact with upper areas of the conductive patterns 72, respectively. The pad patterns 310 may be in contact with the second insulating patterns 74a and the insulating layers 36d.

An example of a method of forming a semiconductor device according to an example embodiment of the present inventive concept is described with reference to FIGS. 11 to 35. FIGS. 11 to 35 are diagrams schematically illustrating examples of a method of forming a semiconductor device according to an example embodiment of the present inventive concept. FIGS. 11, 13, 15, 18, 20, 22, 24, 26, 28 and 30 are partially enlarged top views of an area indicated by 'C' of FIG. 1A. FIGS. 12A, 14A, 16A, 17A, 19A, 21A, 23A, 25A, 27, 29, 34A, and 35 are cross-sectional views schematically illustrating areas taken along lines I-I' and II-II' of FIG. 1A. FIGS. 12B, 14B, 16B, 17B, 19B, 21B, 23B, 25B, 31, 32A, and 33A are cross-sectional views schematically illustrating areas taken along lines and IV-IV' of FIG. 1A. FIGS. 12C, 14C, 16C, 17C, 19C, 21C, 23C, 25C, 32B, and 33B are cross-sectional views schematically illustrating areas taken along lines V-V and VI-VI' of FIG. 1A. FIGS. 12D, 14D, 16D, 17D, 19D, 21D, 23D, 25D, and 34B are cross-sectional views schematically illustrating areas taken along lines VII-VII' and VIII-VIII' of FIG. 1A.

Referring to FIGS. 11 and 12A to 12D, a substrate 3 including a first area MCA and a second area GIA adjacent to the first area MCA may be prepared. The substrate 3 may be a semiconductor substrate.

A mold structure 6 may be formed on the substrate 3. The mold structure 6 may include first semiconductor layers 8 and second semiconductor layers 10 that are alternately and repeatedly stacked. A semiconductor material of the first semiconductor layers 8 may be different from a semiconductor material of the second semiconductor layers 10. For example, the semiconductor material of the first semiconductor layers 8 may be silicon germanium (SiGe), and the semiconductor material of the second semiconductor layers 10 may be silicon (Si). The substrate 3 may be formed of Si. For example, the substrate 3 may be formed of a single-crystal silicon (sc-Si).

The first semiconductor layers 8 may include first lower semiconductor layers 8L1, 8L2 and 8L3, and the second semiconductor layers 10 may include second lower semiconductor layers 10L1 and 10L2, and a second upper semiconductor layer 10U. Among the first and second semiconductor layers 8 and 10, an uppermost layer may be the second upper semiconductor layer 10U, and a lowermost layer may be the first lower semiconductor layer 8L1.

An insulating layer 12 may be formed on the mold structure 6. The insulating layer 12 may be a mask layer. In an example embodiment of the present inventive concept, the insulating layer 12 may be formed of, for example, a photoresist pattern, or a spin-on-hardmask (SOH) layer, but the present inventive concept is not limited thereto. The insulating layer 12 may include a mask pattern formed by a photolithography process.

The mold structure 6 may be etched by an etching process using the insulating layer 12 as an etch mask to form openings, and insulating layers 14 and 16 may be formed in the openings. The etching process may be an anisotropic etching process. For example, the etching process may be a vertical dry etching process such as, for example, reactive ion etching (RIE) process. However, the present inventive concept is not limited thereto. The insulating layers 14 and 16 may be formed to have different depths. For example, lower surfaces of the insulating layers 14 may be formed at a level higher than those of lower surfaces of the insulating layers 16.

The lower surfaces of the insulating layers 16 may be higher than the second lower semiconductor layer 10L1, and the lower surfaces of the insulating layers 14 may be higher than the second lower semiconductor layer 10L2.

The insulating layers 14 and 16 may be disposed on the first area MCA.

When viewed in a top view, the insulating layers 14, 16 may have a shape of a circle or ellipse. However, the present inventive concept is not limited thereto. For example, the insulating layers 14, 16 may have a polygonal shape.

When viewed in a top view, the insulating layers 16 may be larger than the insulating layers 14.

The insulating layers 14 and 16 may include the same material, for example, silicon oxide (SiO$_2$).

Referring to FIGS. 13 and 14A to 14D, an insulating layer 18 may be formed on the substrate 3 including the insulating layers 14 and 16. The insulating layer 18 may be a mask layer.

In an etching process using the insulating layer 18 as an etch mask, the mold structure 6 may be etched to form line-shaped openings, and a semiconductor layer 21 may be formed on an inner wall of the mold structure 6 exposed by the openings, a conformal insulating layer 22 may be formed, and insulating layers 24 filling the openings may be filled. The insulating layer 22 may be an insulating liner covering a side surface and a bottom surface of each of the insulating layers 24. To form the insulating layer 22 and/or the insulating layers 24, a process such as, for example, an atomic layer deposition (ALD) process, a chemical vapor deposition (CVD) process, or a combination thereof may be used. However, the present inventive concept is not limited thereto.

The insulating layers 24 may have a line shape extending in a first horizontal direction Y.

The insulating layers 14 and 16 may be disposed between the insulating layers 24 having a line shape.

The insulating layers 24 may have lower surfaces positioned at a level lower than those of the lower surfaces of the insulating layers 14 and 16. For example, the insulating layers 24 may pass through up to the second lower semiconductor layer 10L1 of the mold structure 6. The insulating layers 24 may be formed of silicon oxide (SiO$_2$).

Referring to FIGS. 15 and 16A to 16D, an insulating layer 26 may be formed on the substrate 3 with up to the insulating layers 24 formed thereon. The insulating layer 26 may be a mask layer exposing at least the insulating layers 14 and 16, and covering the insulating layers 24.

Openings 14_o and 16_o may be formed by removing the insulating layers 14 and 16.

The first semiconductor layers 8 exposed by the openings 14_o and 16_o may be partially etched to form openings 28 between the second semiconductor layers 10, and the second semiconductor layers 10 exposed to the openings 14_o, 16_o, and 28 may be partially etched to form second semiconductor layers 10a having reduced sizes due to partially etching. In an example embodiment of the present inventive concept, the first semiconductor layers 8 and the second semiconductor layers 10 may be partially removed by a wet etching process. However, the present inventive concept is not limited thereto.

The first semiconductor layers 8 may be formed of first semiconductor layers 8a remaining on the second area GIA. The second semiconductor layers 10a may remain on the second area GIA without a reduction in thickness.

Referring to FIGS. 17A to 17D, insulating layers 32 and 34 may be formed to fill the openings (28 in FIGS. 16A to 16D). Forming the insulating layers 32 and 34 may include forming an insulating layer 32 conformally covering inner walls of the openings (28 in FIGS. 16A to 16D), forming an insulating layer 34 filling remaining portions of the openings (28 in FIGS. 16A to 16D), and etching the insulating layers 32 and 34 to remain in the openings (28 in FIGS. 16A to 16D).

The insulating layer 32 may be formed of silicon nitride ($Si_3N_4$), and the insulating layer 34 may be formed of silicon oxide ($SiO_2$).

Referring to FIGS. 18 and 19A to 19D, an insulating layer 38 may be formed on the substrate 3 with up to the insulating layers 32 and 34 formed thereon. The insulating layer 38 may be a mask layer having an opening. The opening of the insulating layer 38 may be formed on the second area GIA.

On the second area GIA, the mold structure 6 may be etched through an etching process using the insulating layer 38 as an etch mask to form openings, a conformal insulating layer 40 may be formed, and insulating layers 42 filling the openings may be formed. On the second area GIA, the insulating layers 42 may have a line shape extending in the first horizontal direction Y. The insulating layers 42 may be formed of silicon oxide ($SiO_2$). The insulating layer 40 may be an insulating liner covering lower surfaces and side surfaces of the insulating layers 42, and covering an upper portion of the insulating layer 38. The lower surfaces of the insulating layers 42 may be higher than the first lower semiconductor layer 8L2. For example, the insulating layer 40 may be interposed between the insulating layers 42 and the first lower semiconductor layer 8L2.

The insulating layers 42 may include insulating layers 42a and 42b that are alternately and repeatedly arranged in the second horizontal direction X.

Referring to FIGS. 20 and 21A to 21D, on the substrate 3 with up to the insulating layers 42 formed thereon, the insulating layer 42b may be removed to form an opening, and the first semiconductor layers 8 exposed by the opening may be removed to form an opening and expose the second semiconductor layer 10, and the second semiconductor layers 10 may be partially etched to reduce thicknesses of the second semiconductor layers 10. Subsequently, the insulating layer 50 filling the opening may be formed. The insulating layer 50 may include an insulating layer 50a filling a space from which the insulating layer 42b is removed, insulating layers 50c filling between the second semiconductor layers 10, and an insulating layer 50b disposed between the second semiconductor layers 10L1 and 10L2 below the insulating layers 50c. The insulating layer 50 may be formed of silicon oxide ($SiO_2$).

A staircase shape may be formed by patterning the first and second semiconductor layers 8 and 10 remaining on the second area GIA. A trimming process and an anisotropic etching process may be repeatedly performed such that the first and second semiconductor layers 8 and 10 remaining on the second area GIA may be formed to have a staircase shape. For example, the etching of the first and second semiconductor layers 8 and 10 and the reducing of the width of a mask pattern that is used as an etch mask may be repeatedly performed during the trimming and anisotropic etching processes.

Subsequently, a conformal insulating layer 52 may be formed, and an insulating layer 54 covering the insulating layer 52 on a staircase-shaped structure may be formed on the second area GIA. The insulating layer 52 may be formed of silicon nitride ($S_3N_4$) or a high-k dielectric material such as, for example, aluminum oxide ($Al_2O_3$) or hafnium oxide ($HfO_2$), and the insulating layer 54 may be formed of silicon oxide ($SiO_2$).

The insulating layers 24 may include insulating layers 24a and 24b that are alternately and repeatedly arranged in the second horizontal direction X.

An insulating layer 56 may be formed on the insulating layers 52 and 54. The insulating layer 56 may have an opening exposing the insulating layer 24b on the first area MCA.

An opening 58 may be formed by selectively removing the insulating layer 24b exposed by the insulating layer 56. The opening 58 may have a line shape extending in the first horizontal direction Y.

An insulating layer 60 may be formed on surfaces of the first and second semiconductor layers 8 and 10 exposed by the opening 58. The insulating layer 60 may be formed of silicon oxide ($SiO_2$).

Referring to FIGS. 22 and 23A to 23D, the insulating layer 32 exposed by the opening 58 may be partially etched to form openings 62, an insulating layer 64 conformally covering inner walls of the openings 62 and insulating layers 66 filling the openings 62 may be formed, and the insulating layers 64 and 66 may be partially etched.

While the insulating layer 32 is partially etched, the insulating layer 56 may be etched and removed, and a portion of the insulating layer 52 may remain.

Subsequently, a gate dielectric layer 68 covering an inner wall of a remaining space of each of the openings 62 may be formed, conductive lines 70 filling the remaining spaces of the openings 62 may be formed on the gate dielectric layer 68, and the conductive lines 70 may be partially etched.

Referring to FIGS. 24 and 25A to 25D, insulating layers 62 filling a remaining space of an opening in which the conductive lines 70 are filled may be formed.

An impurity implantation process may be performed to form first source/drain regions SD1. The first source/drain regions SD1 may be formed in the second semiconductor layers 10a on the first area MCA. Impurities may be implanted into the second semiconductor layers 10a to form the first source/drain regions SD1 through an ion implantation process. The impurities may include n-type impurities, e.g., phosphorus (P), arsenic (As), etc. Alternatively, the impurities may include p-type impurities, e.g., boron (B), aluminum (Al), gallium (Ga), etc.

Spacer-shaped conductive layers 71 may be formed on a sidewall of the opening 58. Forming the conductive layers 71 may include conformally forming the first layer 72a and the second layer 72*b* in a sequential manner, and anisotropically etching the first layer 72*a* and the second layer 72*b*.

While the conductive layers 71 are formed, a dummy conductive layer 72*d* may be formed on a side surface of the insulating layer 52.

Insulating layers 74 and 74' may be formed on the substrate 3 formed with up to the conductive layers 71 formed thereon. The insulating layers 74 and 74' may include an insulating layer 74 covering the conductive layers 71 and filling the opening 58, and an insulating layer 74' covering the insulating layer 36.

An upper surface of the insulating layer 74' may be coplanar with an upper surface of the insulating layer 52.

The insulating layer 74 may be formed of a material including an "element A". The insulating layer 74 may be formed of a material including silicon oxide ($SiO_2$) doped with the "element A". The "element A" may include at least one of a group 13 element or a group 15 element of the periodic table of the elements. For example, the "element A" may include at least one of nitrogen (N), phosphorus (P), or boron (B). For example, the insulating layer 74 may be formed of silicon oxide ($SiO_2$) doped with N, silicon oxide ($SiO_2$) doped with P, or silicon oxide ($SiO_2$) doped with B.

In the insulating layer 74, a content of the "element A" may be about 30% or less.

Figure 26:
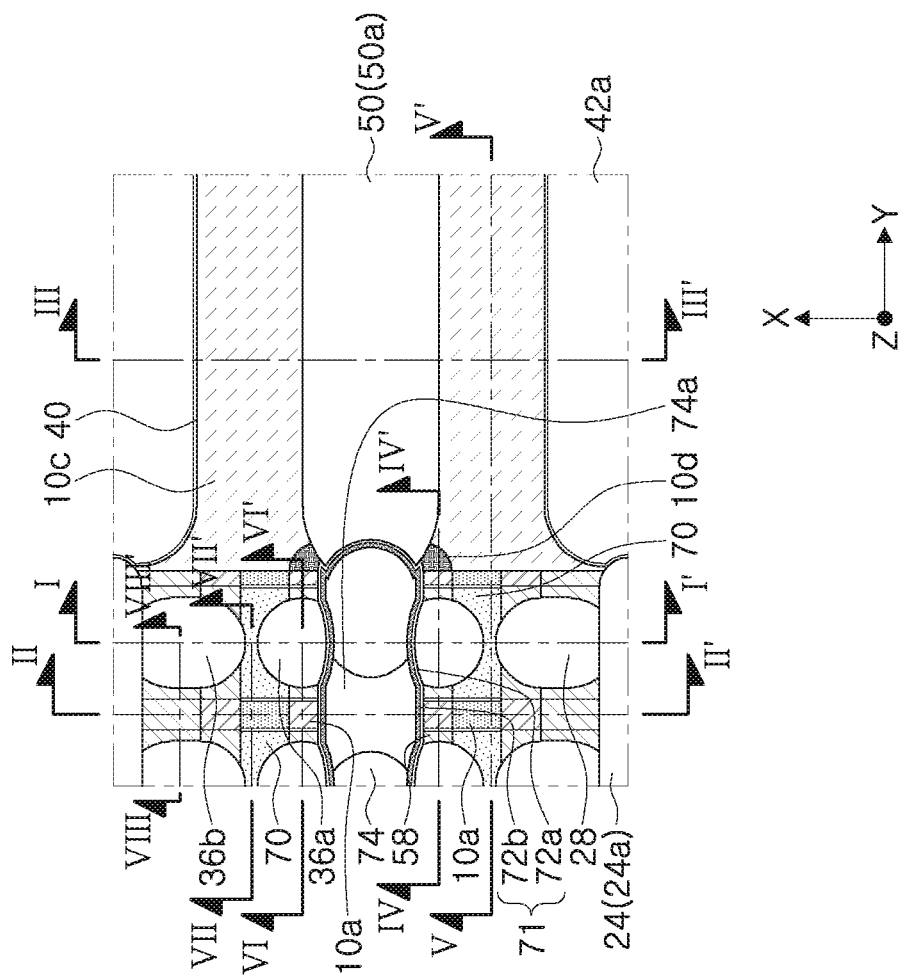
Figure 27:
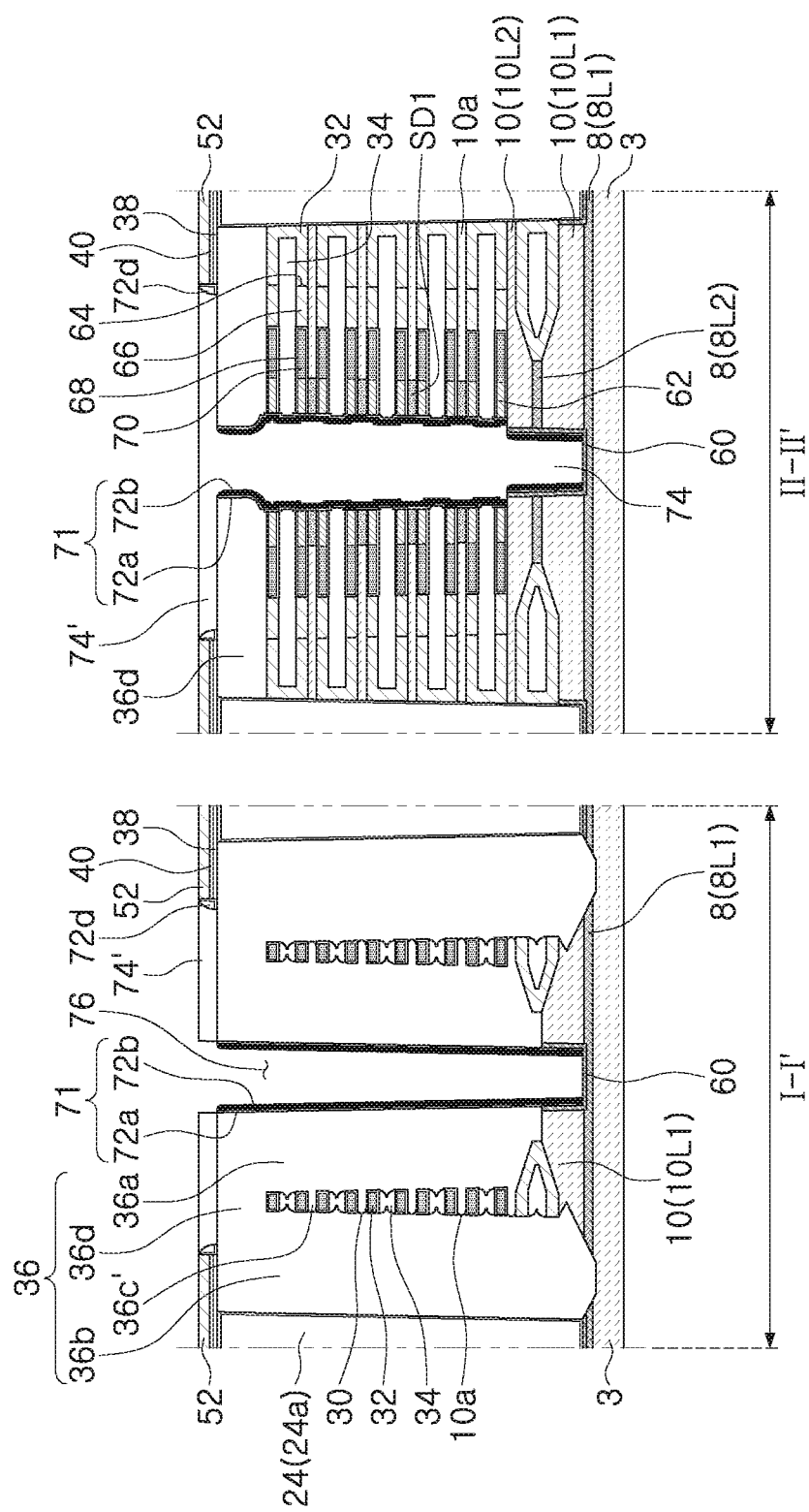

Referring to FIGS. 26 and 27, the insulating layer 74 may be patterned to form openings 76 exposing the conductive layers 71. The remaining insulating layer 74 may be defined as insulating patterns 74*a*. The insulating layer 74 may be formed of a material including the "element A", thereby minimizing a bowing phenomenon in the openings 76.

Figure 28:
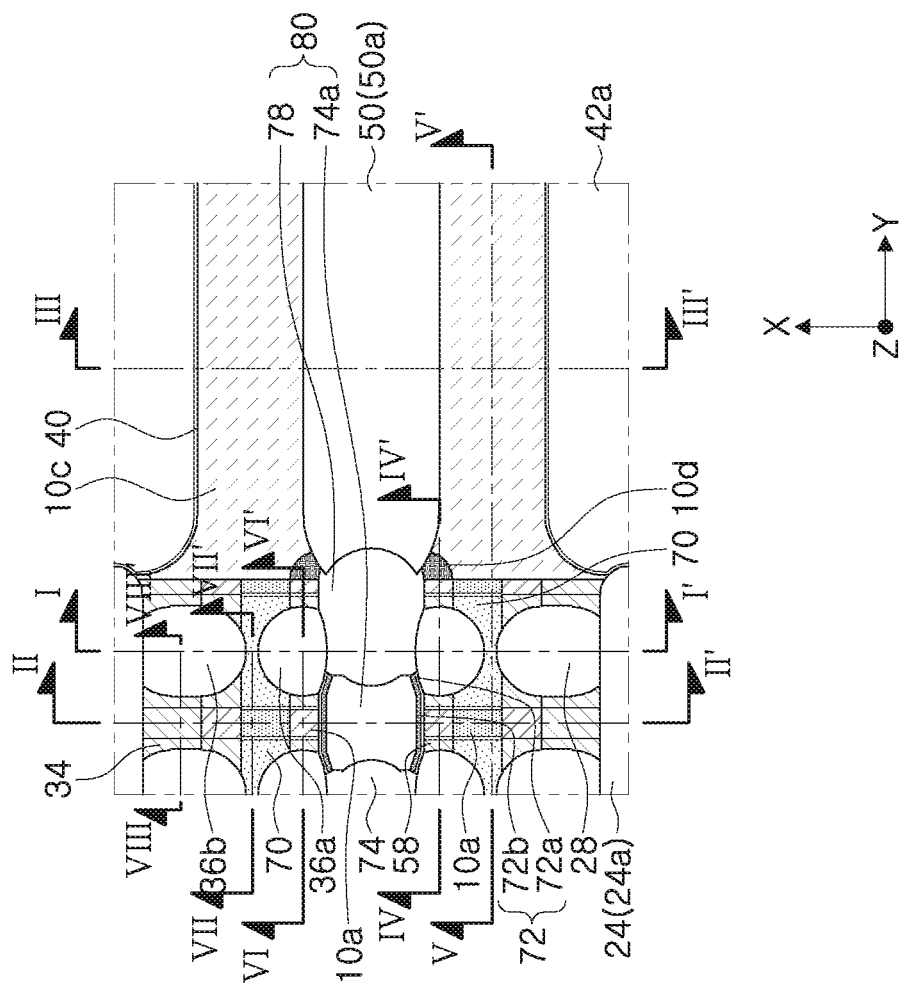
Figure 29:
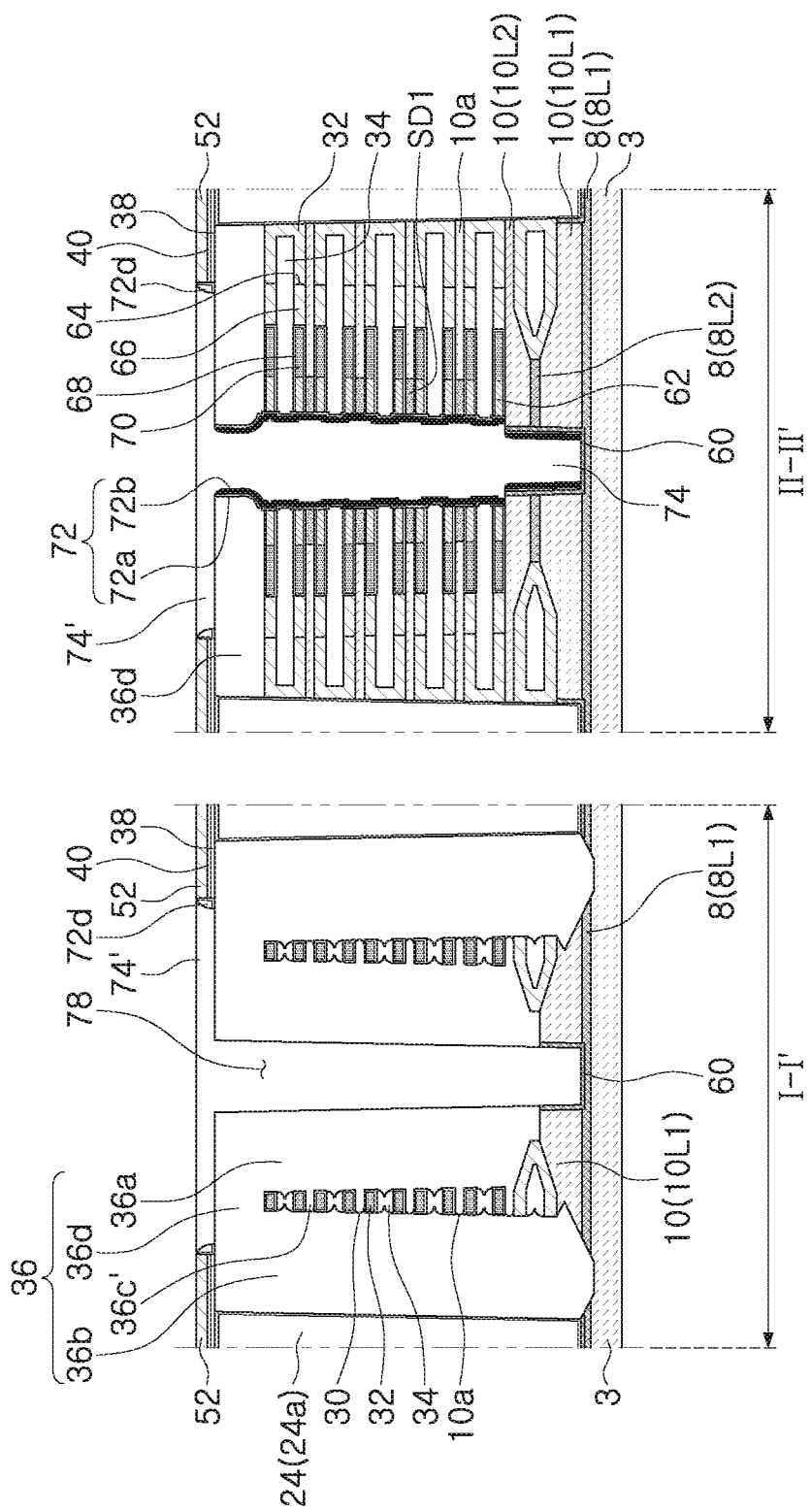

Referring to FIGS. 28 and 29, the conductive layers 71 exposed by the openings 76 capable of minimizing a bowing phenomenon may be selectively etched and removed. Accordingly, the conductive layers 71 in contact with side surfaces of the insulating patterns 74*a* may remain. The remaining conductive layers 71 may be referred to as conductive patterns 72. The conductive patterns 72 capable of minimizing a difference between an upper width thereof and a lower width thereof may be formed. For example, the conductive patterns 72 may have a more uniform width over upper and lower portions thereof in the first horizontal direction Y.

Insulation patterns 78 filling the openings 76 may be formed. The insulating patterns 78 may be formed of silicon oxide ($SiO_2$).

Figure 30:
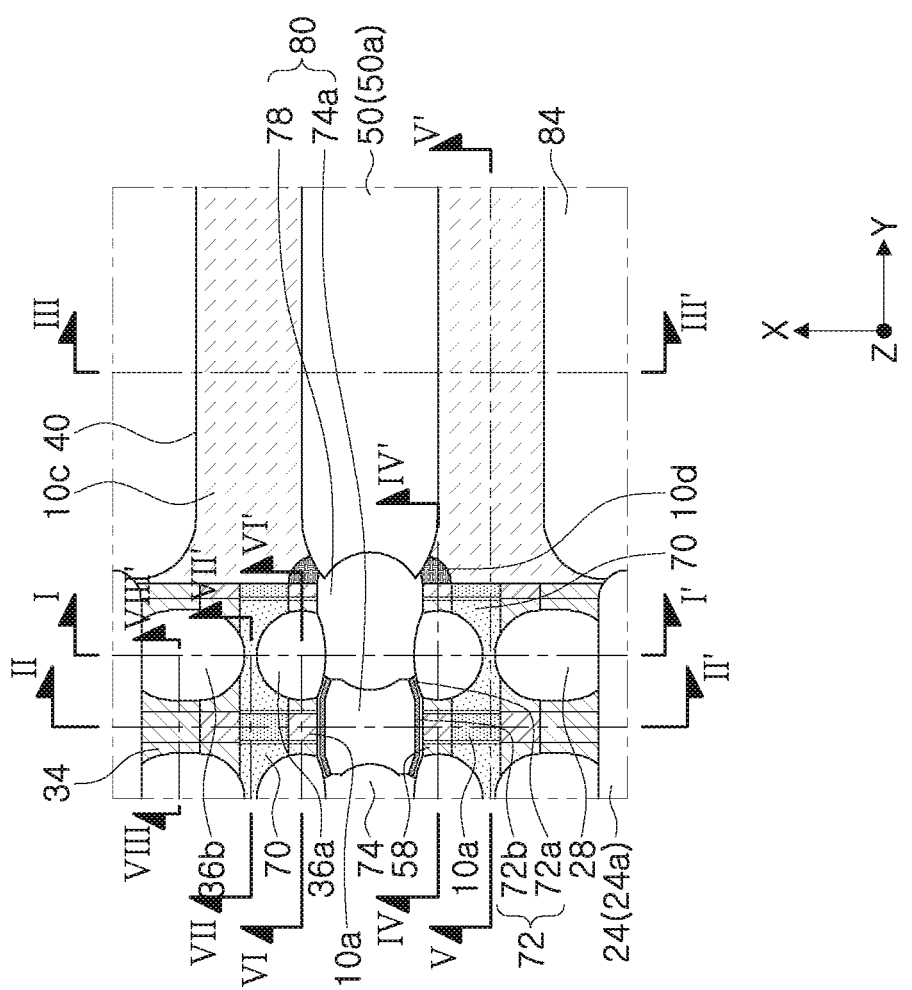
Figure 31:
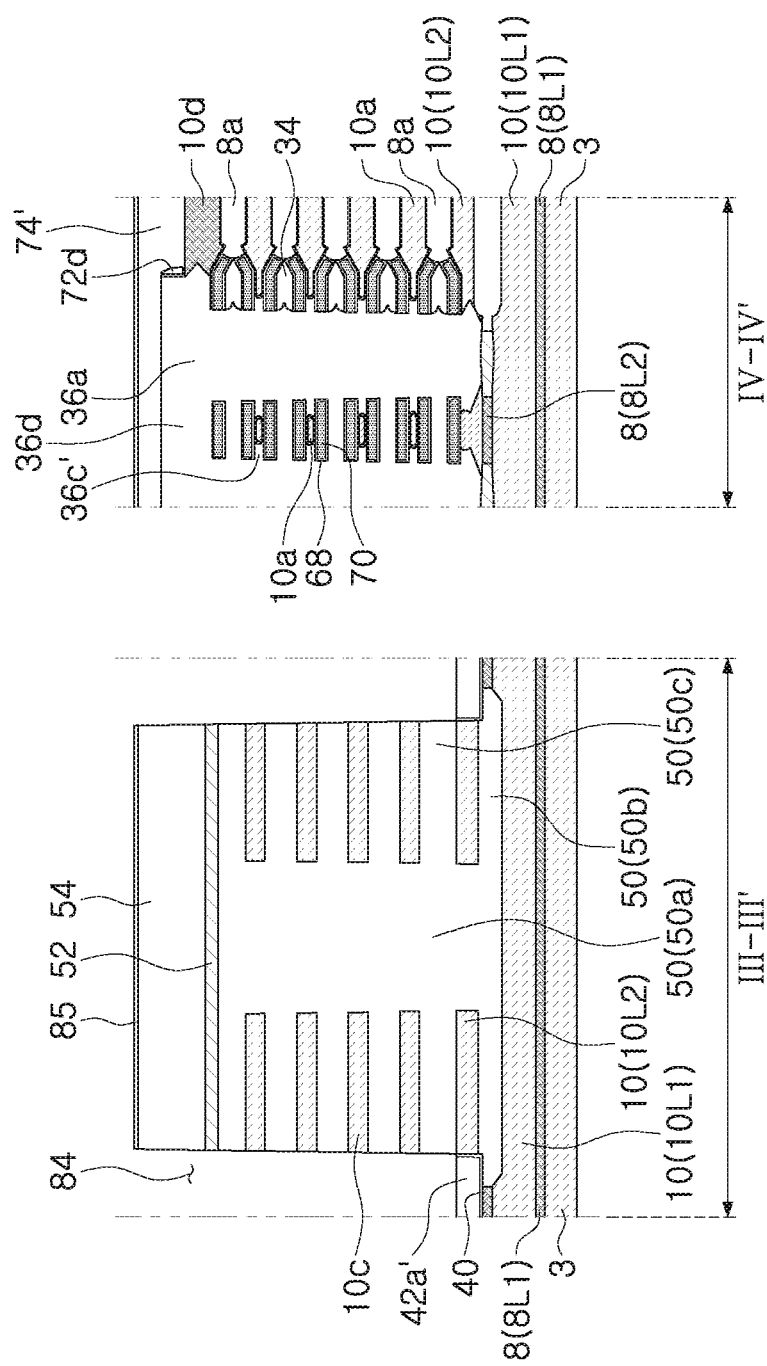

Referring to FIGS. 30 and 31, the insulating layer 42*a* may be partially etched to form openings 84. The openings 84 may be formed at a level higher than that of the second lower semiconductor layer 10L2. Insulation layers 42*a*' may remain below the openings 84.

Figure 32A:
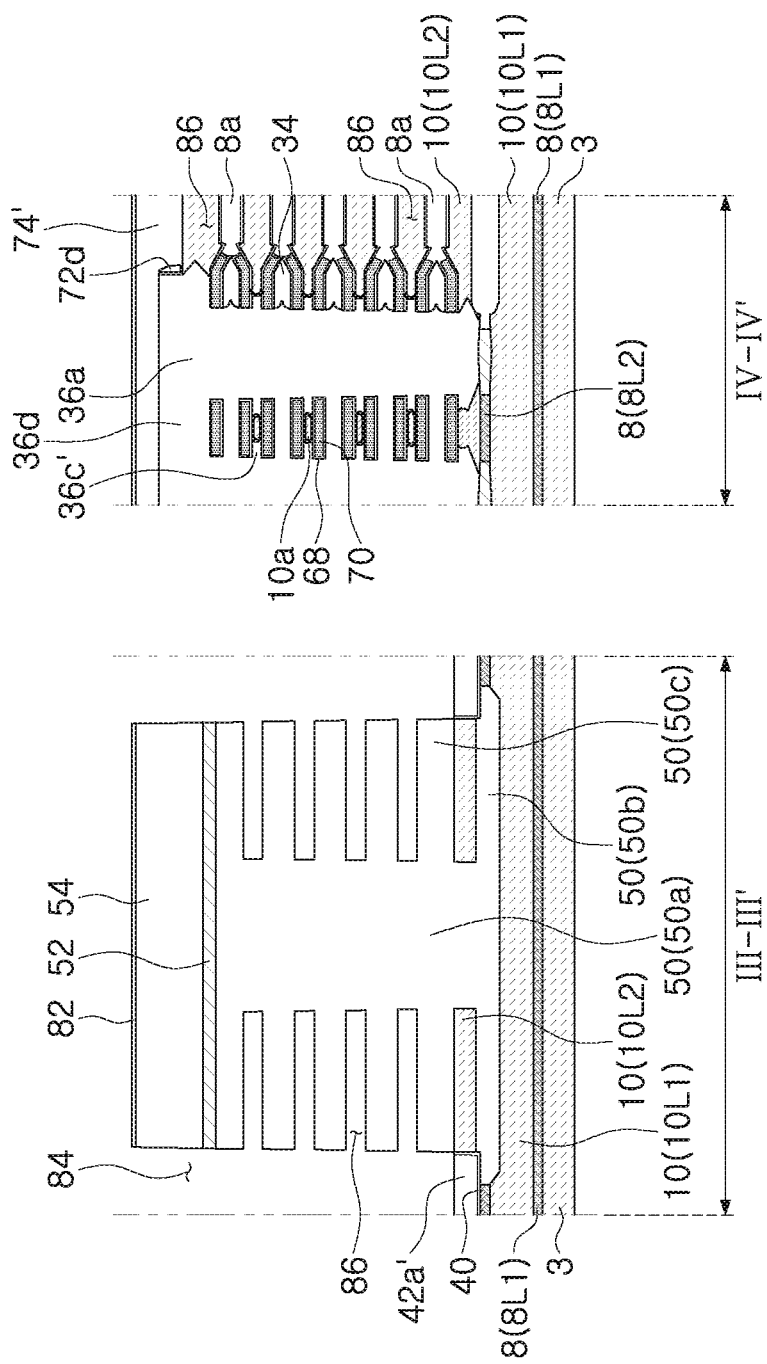
Figure 32B:
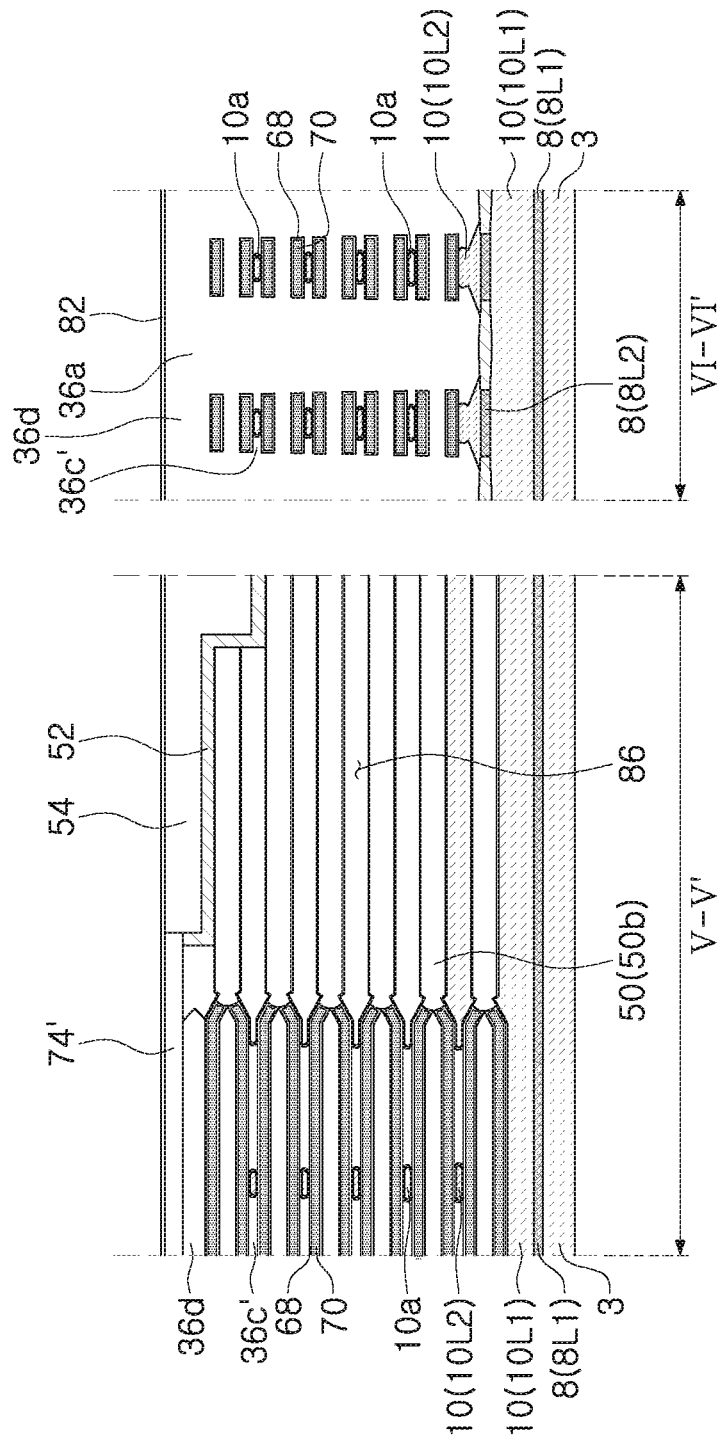

Referring to FIGS. 32A and 32B, openings 86 may be formed in the second area GIA by etching the second semiconductor layers 10*c* exposed by the openings 84. Here, the second semiconductor layers 10*a* on the first area MCA may remain.

Figure 33A:
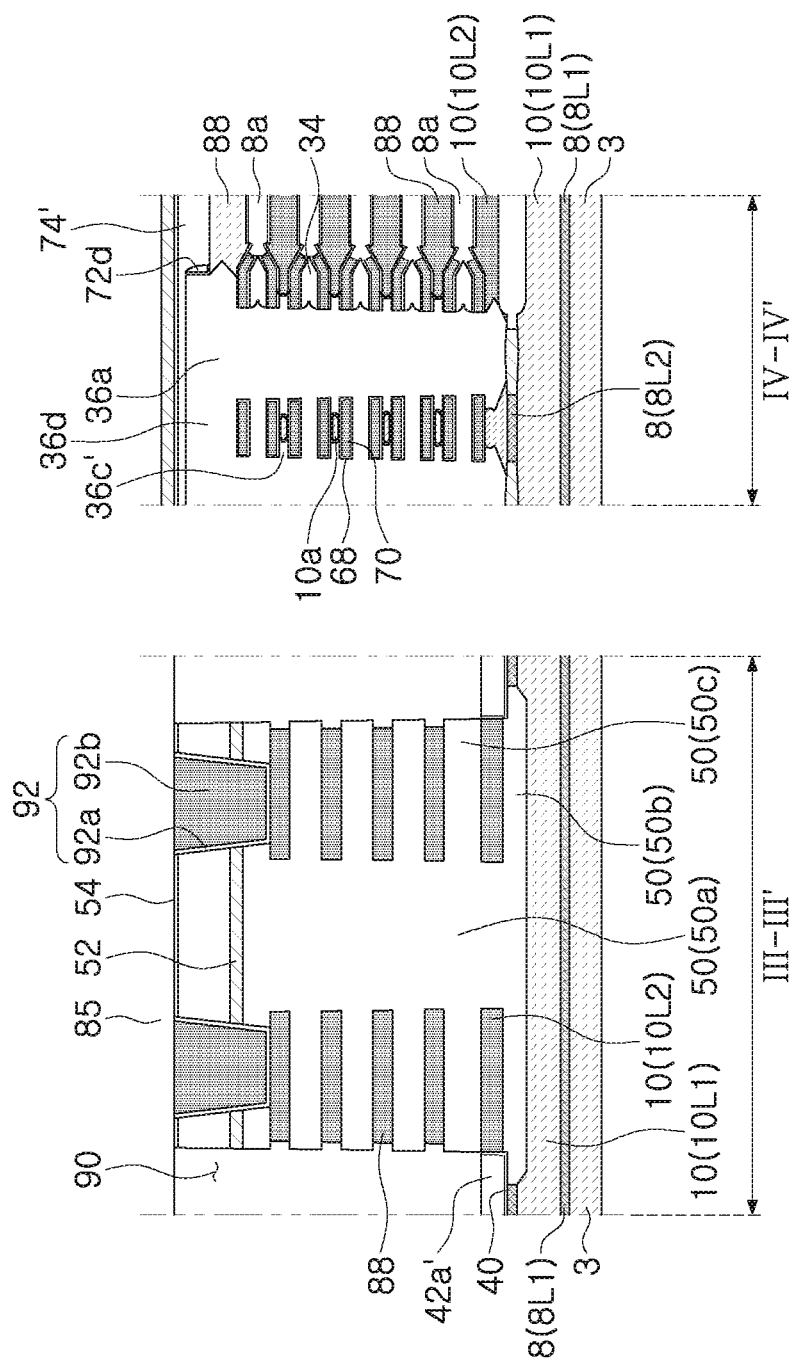
Figure 33B:
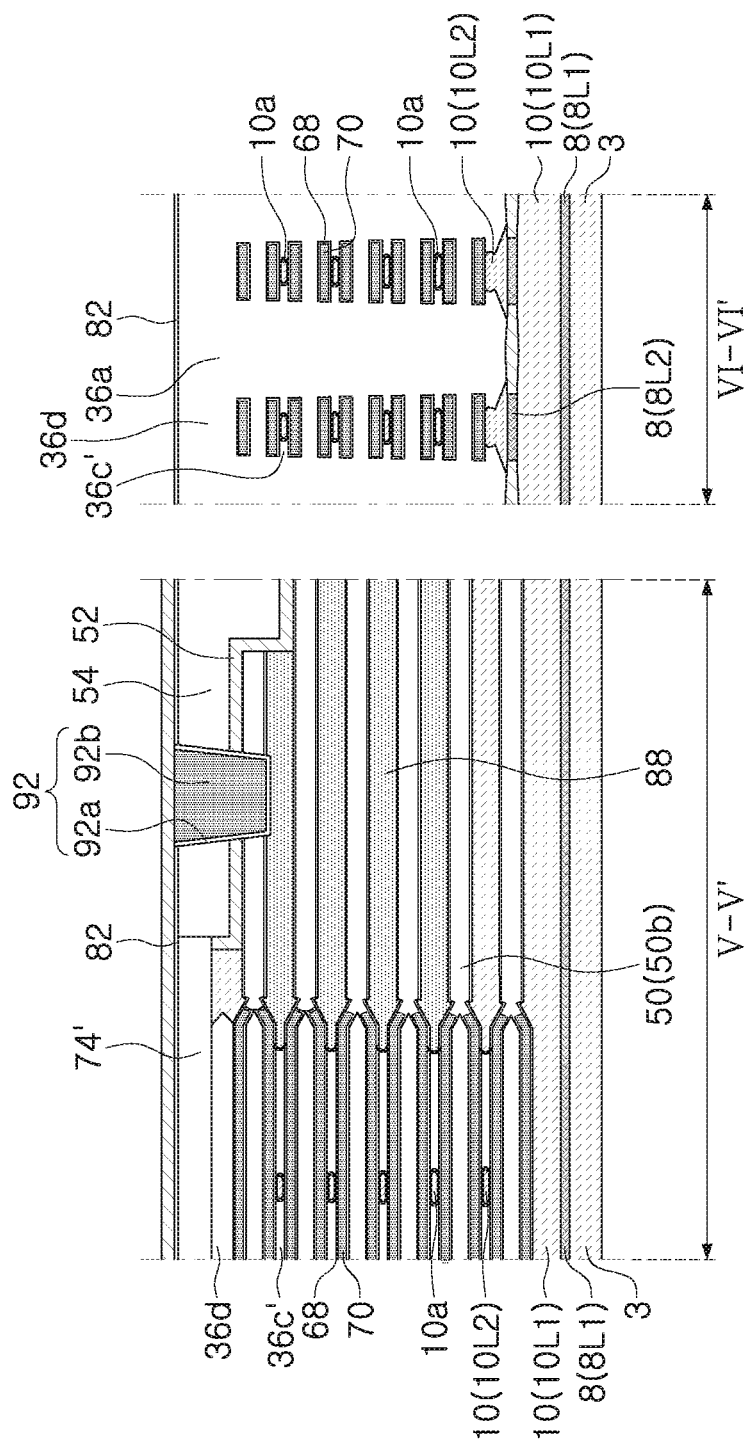

Referring to FIGS. 33A and 33B, gate contact lines 88 filling the openings 86 may be formed on the second area GIA. The gate contact lines 88 may be electrically connected to the conductive lines 70. Gate contact plugs 92 passing through the insulating layers 52 and 54 and being in contact with the gate contact lines 88 may be formed on the second area GIA. Each of the gate contact plugs 92 may include a plug pattern 92*b* and a barrier layer 92*a* surrounding a side surface and a lower surface of the plug pattern 92*b*.

Figure 34A:
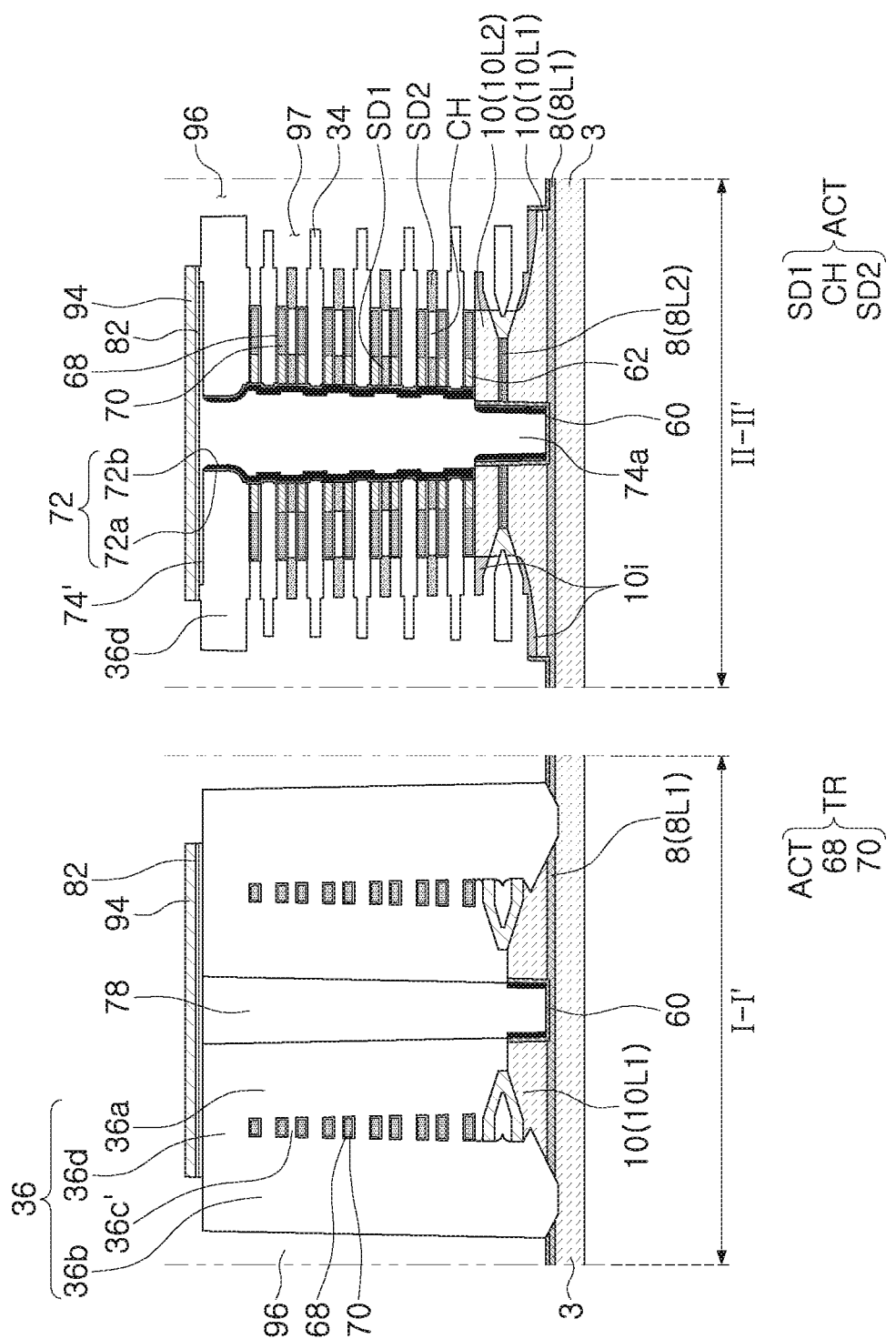
Figure 34B:
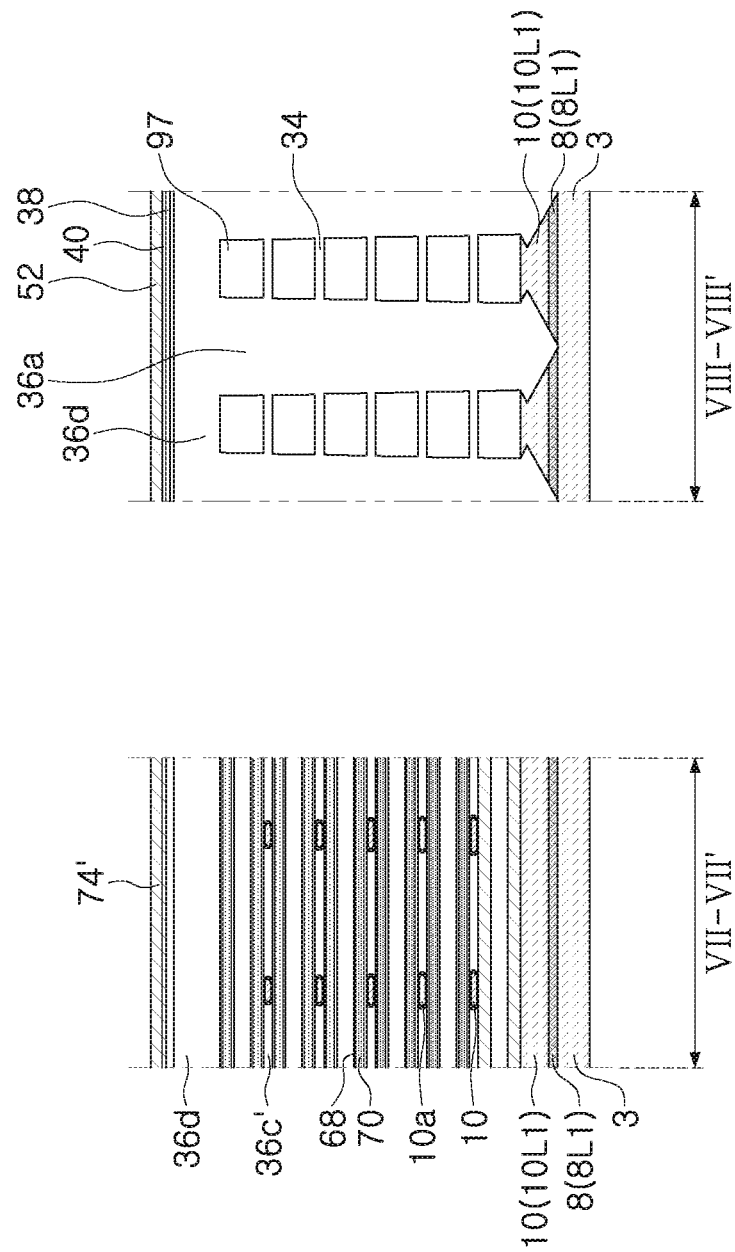

Referring to FIGS. 34A and 34B, the insulating layers 24*a* may be etched to form openings 96, and the insulating layers 32 and 34 exposed by the openings 96 may be partially etched to form the openings 97 exposing the conductive lines 70 and the second semiconductor layers 10.

A source/drain process may be performed to form second source/drain regions SD2 in the second semiconductor layers 10. For example, impurities may be implanted into the second semiconductor layers 10 to form the second source/drain regions SD2 through an ion implantation process. The impurities may include n-type impurities, e.g., phosphorus (P), arsenic (As), etc. Alternatively, the impurities may include p-type impurities, e.g., boron (B), aluminum (Al), gallium (Ga), etc. The second semiconductor layers 10 remaining between the first and second source/drain regions SD1 and SD2 may be defined as a channel region CH.

The first and second source/drain regions SD1 and SD2 and the channel region CH may be referred to as an active layer ACT. Accordingly, the active layers ACT may be spaced apart from each other and stacked in a vertical direction Z.

While the second source/drain regions SD2 are formed, impurity areas 10*i* may be formed in exposed areas of the second semiconductor layers 10L1 and 10L2. For example, impurities may be implanted into the exposed areas of the second semiconductor layers 10L1 and 10L2 to form the impurity areas 10*i* during the process of forming the second source/drain regions SD2.

In an example embodiment of the present inventive concept, the first and second source/drain regions SD1 and SD2 and the impurity areas 10*i* may have an N-type conductivity.

Figure 35:
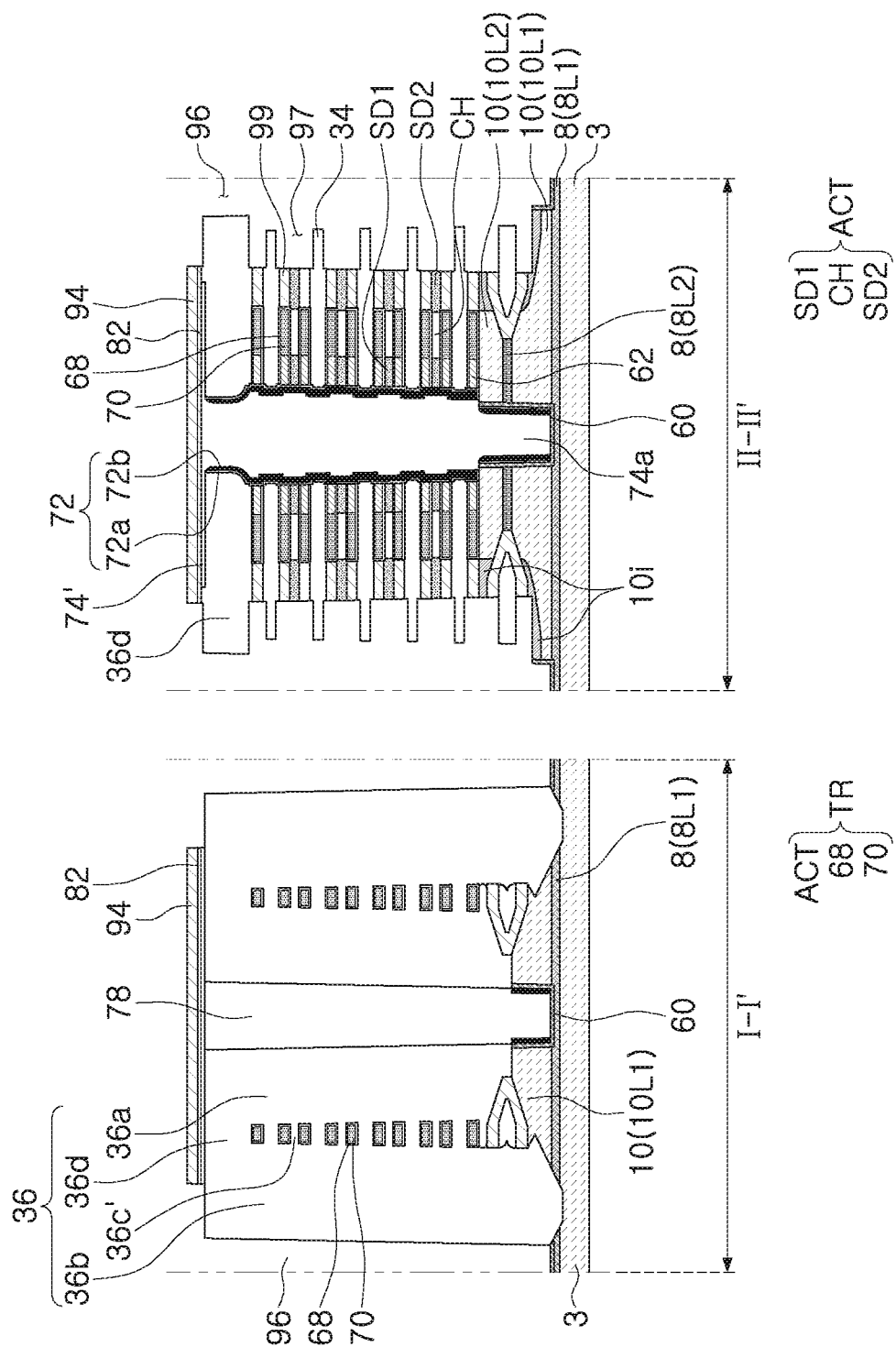

Referring to FIG. 35, insulating layers 99 covering upper surfaces and lower surfaces of the second source/drain regions SD2 may be formed in the openings 97.

Referring back to FIGS. 1 to 5, storage node electrodes 103 in contact with the second source/drain regions SD2 may be formed in the openings 97. A capacitor dielectric layer 107 may be conformally formed on a substrate with the storage node electrodes 103 formed thereon, and a plate electrode 109 covering the capacitor dielectric layer 107 may be formed. Each of the storage node electrodes 103 may have a "U" shape, when viewed in a top view. The first electrode 109 may include a first material layer 109*a* in contact with the capacitor dielectric layer 107 and a second material layer 109*b* formed on the first material layer 109*a*.

Figure 36:
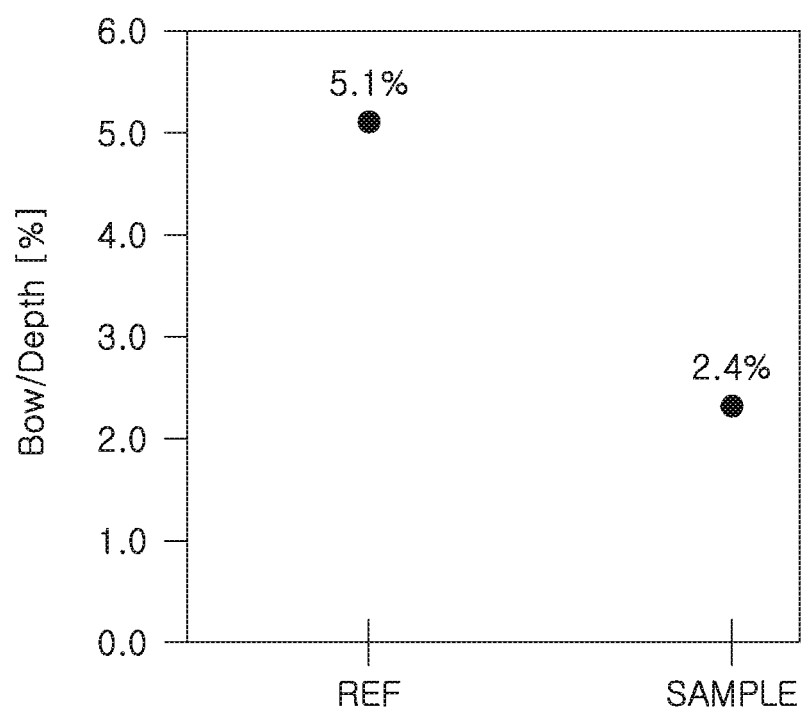
FIG. 36 is a graph illustrating bowing characteristics of a semiconductor device according to an example embodiment of the present inventive concept.

A bowing characteristic of a semiconductor device according to an example embodiment of the present inventive concept is described with reference to FIG. 36. FIG. 36 is a graph illustrating a bowing phenomenon in openings 76 exposing the conductive layers 71 by patterning the insulating layer 74 described with reference to FIGS. 26 and 27.

Referring to FIG. 36, when openings are formed to have the same depth as each other using a tetraethyl orthosilicate (TEOS) oxide REF and an insulating layer SAMPLE the same as the insulating layer 74 described with reference to FIGS. 26 and 27, a bowing phenomenon may occur. A bow to depth value is measured for each of the TEOS oxide REF and the insulating layer SAMPLE according to an example embodiment of the present inventive concept. In the graph of FIG. 36, the TEOS oxide REF may have a value of about 5.1%, and the insulating layer SAMPLE according to an example embodiment of the present inventive concept may have a value of about 2.4%. The values may indicate that a bow occurring in an opening formed using the insulating layer SAMPLE according to an example embodiment of the present inventive concept is smaller than a bow occurring in an opening formed using the TEOS oxide REF. Accordingly, the opening formed using the insulating layer SAMPLE according to an example embodiment of the present inventive concept may have a more uniform width over upper and lower portions thereof than that of the opening formed using the TEOS oxide REF.

As described above, a conductive pattern formed by etching a conductive layer exposed by the opening formed using the insulating layer SAMPLE according to an example embodiment of the present inventive concept may be more uniformly formed over upper and lower portions thereof. The conductive pattern may be the conductive patterns 72 in FIGS. 1A to 5, and the conductive patterns 72 may be used as bit lines of a DRAM device. Accordingly, the bit lines may be formed to have a more uniform size over upper and lower portions thereof, thereby further enhancing electrical characteristics and reliability of the semiconductor device 1.

According to an example embodiment of the present inventive concept, an insulating layer for forming an opening with a high aspect ratio capable of minimizing a bowing phenomenon may be provided. A semiconductor device including insulating patterns and conductive patterns formed using the insulating layer may be provided.

While example embodiments have been shown and described above, it will be apparent to those skilled in the art that modifications and variations could be made without departing from the spirit and scope of the present inventive concept as defined by the appended claims.

What is claimed is:

1. A semiconductor device comprising:
   a substrate including a first area and a second area adjacent to the first area;
   a first conductive line group disposed on the first area of the substrate, wherein the first conductive line group includes first conductive lines spaced apart from each other and stacked in a vertical direction, perpendicular to an upper surface of the substrate;
   a second conductive line group disposed on the first area of the substrate, wherein the second conductive line group includes second conductive lines spaced apart from each other and stacked in the vertical direction;
   first active groups disposed on the first area of the substrate, and arranged and spaced apart from each other in a first horizontal direction parallel to the upper surface of the substrate;
   second active groups disposed on the first area of the substrate, arranged and spaced apart from each other in the first horizontal direction, and spaced apart from the first active groups in a second horizontal direction, perpendicular to the first horizontal direction;
   an insulating structure disposed between the first conductive line group and the second conductive line group;
   first conductive patterns disposed between the insulating structure and the first active groups; and
   second conductive patterns disposed between the insulating structure and the second active groups,
   wherein each of the first active groups includes first active layers spaced apart from each other and stacked in the vertical direction, and intersecting each of the first conductive lines,
   each of the second active groups includes second active layers spaced apart from each other and stacked in the vertical direction, and intersecting each of the second conductive lines,
   the insulating structure includes first insulating patterns and second insulating patterns that are alternately and repeatedly arranged on the first area of the substrate in the first horizontal direction, and
   a first material of the first insulating patterns is different from a second material of the second insulating patterns.

2. The semiconductor device of claim 1, wherein
   the second material of the second insulating patterns is a material that is doped with an "element A", and
   the first material of the first insulating patterns is a material that is not doped with the "element A".

3. The semiconductor device of claim 2, wherein the "element A" is at least one of nitrogen (N), phosphorus (P), or boron (B).

4. The semiconductor device of claim 2, wherein a content of the "element A" is about 30% or less in the second insulating patterns.

5. The semiconductor device of claim 1, wherein
   the second material of the second insulating patterns is silicon oxide that is doped with an "element A", and
   the first material of the first insulating patterns is silicon oxide that is not doped with the "element A".

6. The semiconductor device of claim 1, wherein each of the first and second active layers includes:
   a first source/drain region and a second source/drain region spaced apart from each other; and
   a channel region interposed between the first source/drain region and the second source/drain region,
   wherein the first conductive lines vertically overlap the channel regions of the first active layers and extend in the first horizontal direction on the first area of the substrate,
   the second conductive lines vertically overlap the channel regions of the second active layers and extend in the first horizontal direction on the first area of the substrate,
   the first source/drain regions of the first active layers are electrically connected to the first conductive patterns, and
   the first source/drain regions of the second active layers are electrically connected to the second conductive patterns.

7. The semiconductor device of claim 6, further comprising:
   data storage structures,
   wherein each of the data storage structures includes a plate electrode, storage node electrodes, and a capacitor dielectric layer disposed between the plate electrode and the storage node electrodes, and
   the storage node electrodes are electrically connected to the second source/drain regions of the first and second active layers.

8. The semiconductor device of claim 7, wherein each of the storage node electrodes has a "U" shape, when viewed in a top view.

9. The semiconductor device of claim 1, further comprising:
   first gate contact lines disposed on the second area of the substrate, and electrically connected to the first conductive line group;
   second gate contact lines disposed on the second area of the substrate, and electrically connected to the second conductive line group;
   gate contact plugs electrically connected to the first and second gate contact lines on the first and second gate contact lines; and
   an insulating layer disposed between the first gate contact lines and the second gate contact lines on the second area of the substrate, wherein the insulating layer includes a material the same as the second material of the second insulating patterns.

10. The semiconductor device of claim 9, further comprising:
gate dielectric layers interposed between at least the first active layers and the first conductive lines, and interposed between at least the second active layers and the second conductive lines,
wherein the first conductive lines include a pair of first conductive lines covering an upper surface and a lower surface of one of the first active layers, and
one of the first gate contact lines is in contact with the pair of first conductive lines, and is electrically connected to the pair of first conductive lines.

11. A semiconductor device comprising:
a substrate;
a data storage structure disposed on the substrate;
an insulating structure disposed on the substrate, and spaced apart from the data storage structure;
conductive lines disposed between the data storage structure and the insulating structure, and spaced apart from each other and stacked in a vertical direction, perpendicular to an upper surface of the substrate;
active layers spaced apart from each other and stacked in the vertical direction between the data storage structure and the insulating structure, and intersecting the conductive lines; and
a conductive pattern disposed between the insulating structure and the active layers, and electrically connected to the active layers,
wherein the insulating structure includes first insulating patterns spaced apart from each other in a first horizontal direction parallel to the upper surface of the substrate, and a second insulating pattern disposed between the first insulating patterns,
the conductive pattern is disposed between the second insulating pattern and the active layers, and
a material of the second insulating pattern is different from a material of the first insulating patterns.

12. The semiconductor device of claim 11, wherein the data storage structure includes:
a plate electrode;
storage node electrodes disposed between the plate electrode and the active layers; and
a capacitor dielectric layer disposed between at least the storage node electrodes and the plate electrode.

13. The semiconductor device of claim 11, wherein
the material of the second insulating pattern is a material that is doped with an "element A", and
the "element A" is at least one of nitrogen (N), phosphorus (P), or boron (B).

14. The semiconductor device of claim 13, wherein a content of the "element A" is about 30% or less in the second insulating pattern.

15. The semiconductor device of claim 13, wherein the material of the first insulating patterns is a material that is not doped with the "element A".

16. The semiconductor device of claim 11, wherein at least one of the conductive lines includes, in a second horizontal direction, perpendicular to the first horizontal direction, a portion vertically overlapping with the active layers and having a first width, and a portion positioned between the data storage structure and the first insulating patterns and having a second width smaller than the first width.

17. A semiconductor device comprising:
a substrate;
first insulating patterns disposed on the substrate, and spaced apart from each other in a first horizontal direction parallel to an upper surface of the substrate;
conductive patterns spaced apart from each other in a second horizontal direction, perpendicular to the first horizontal direction on the substrate; and
a second insulating pattern disposed between the first insulating patterns in the first horizontal direction, and disposed between the conductive patterns in the second horizontal direction,
wherein a material of the second insulating pattern is different from a material of the first insulating patterns.

18. The semiconductor device of claim 17, wherein
the first insulating patterns include silicon oxide, and
the second insulating pattern includes a material including silicon oxide doped with an "element A".

19. The semiconductor device of claim 18, wherein the first insulating patterns do not include the "element A".

20. The semiconductor device of claim 18, wherein
the "element A" is at least one of nitrogen (N), phosphorus (P) or boron (B), and
a content of the "element A" is about 30% or less in the second insulating pattern.

* * * * *